US012690383B2

(12) United States Patent
Shin et al.

(10) Patent No.: US 12,690,383 B2
(45) Date of Patent: Jul. 21, 2026

(54) LIGHT EMITTING DIODE

(71) Applicant: Samsung Display Co., Ltd., Yongin-si (KR)

(72) Inventors: Hyosup Shin, Hwaseong-si (KR); Jiyoung Lee, Hwaseong-si (KR); Hyunyoung Kim, Yongin-si (KR); Tsuyoshi Naijo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1055 days.

(21) Appl. No.: 17/683,546

(22) Filed: Mar. 1, 2022

(65) Prior Publication Data

US 2022/0328766 A1 Oct. 13, 2022

(30) Foreign Application Priority Data

Apr. 6, 2021 (KR) ........................ 10-2021-0044667

(51) Int. Cl.
*H10K 85/60* (2023.01)
*H10K 50/11* (2023.01)
(Continued)

(52) U.S. Cl.
CPC ......... *H10K 85/657* (2023.02); *H10K 85/346* (2023.02); *H10K 85/40* (2023.02);
(Continued)

(58) Field of Classification Search
None
See application file for complete search history.

(56) References Cited

U.S. PATENT DOCUMENTS 8,906,521 B2 12/2014 Suda et al.
9,865,829 B2 1/2018 Tada et al.
(Continued)

FOREIGN PATENT DOCUMENTS

CN 103828485 A 5/2014
CN 103988329 A 8/2014
(Continued)

OTHER PUBLICATIONS

English translation of KR 2020/0062329 A and the original KR 2020/0062329 A, Takuji Hatakeyama, Jun. 3, 2020 (Year: 2020).*
(Continued)

*Primary Examiner* — Seokmin Jeon
(74) *Attorney, Agent, or Firm* — Womble Bond Dickinson (US) LLP

(57) ABSTRACT

Provided is a light emitting diode including a first electrode, a second electrode disposed on the first electrode, and an emission layer disposed between the first electrode and the second electrode and including a polycyclic compound represented by Formula 1, thereby exhibiting high luminous efficiency and improved lifespan characteristics.

[Formula 1]

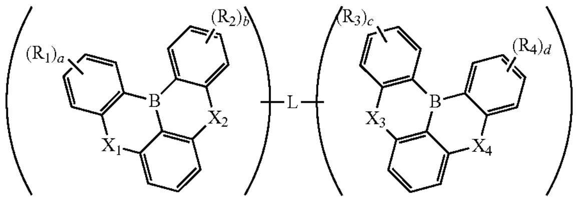

20 Claims, 6 Drawing Sheets

(51) Int. Cl.

| | |
|---|---|
| ***H10K 50/12*** | (2023.01) |
| ***H10K 85/30*** | (2023.01) |
| ***H10K 85/40*** | (2023.01) |
| ***H10K 101/00*** | (2023.01) |

(52) U.S. Cl.

CPC ......... *H10K 85/624* (2023.02); *H10K 85/654* (2023.02); *H10K 85/6572* (2023.02); *H10K 85/658* (2023.02); *H10K 50/11* (2023.02); *H10K 50/12* (2023.02); *H10K 2101/90* (2023.02)

(56) References Cited

U.S. PATENT DOCUMENTS

| | | | |
|---|---|---|---|
| 10,374,166 B2 | 8/2019 | Hatakeyama et al. | |
| 10,446,767 B2 | 10/2019 | Ueda et al. | |
| 10,763,449 B2 | 9/2020 | Ma et al. | |
| 11,158,809 B2 | 10/2021 | Han et al. | |
| 12,058,927 B2 | 8/2024 | Kuwabara et al. | |
| 12,089,488 B2 | 9/2024 | Yokoyama et al. | |
| 12,351,594 B2 | 7/2025 | Stengel et al. | |
| 2004/0048099 A1 | 3/2004 | Chen et al. | |
| 2011/0309739 A1* | 12/2011 | Song | 313/504 |
| 2017/0148988 A1 | 5/2017 | Tsai et al. | |
| 2020/0144513 A1 | 5/2020 | Hatakeyama et al. | |
| 2020/0194683 A1 | 6/2020 | Sim et al. | |
| 2021/0098716 A1 | 4/2021 | Lee et al. | |
| 2022/0045277 A1* | 2/2022 | Stengel | H01L 51/0055 |
| 2022/0328766 A1 | 10/2022 | Shin et al. | |

FOREIGN PATENT DOCUMENTS

| | | |
|---|---|---|
| CN | 106848084 A | 6/2017 |
| CN | 109721482 A | 5/2019 |
| CN | 109836338 A | 6/2019 |
| CN | 111212844 A | 5/2020 |
| CN | 111848424 A | 10/2020 |
| CN | 112310329 A | 2/2021 |
| CN | 113651841 A | 11/2021 |
| KR | 10-2012-0021448 | 3/2012 |
| KR | 10-2014-0112501 | 9/2014 |
| KR | 10-1482559 | 1/2015 |
| KR | 10-2016-0119683 A | 10/2016 |
| KR | 10-1707799 | 2/2017 |
| KR | 10-2020-0062329 | 6/2020 |
| KR | 10-2020-0075986 A | 6/2020 |
| KR | 10-2021-0014799 | 2/2021 |
| WO | 2013/038627 A1 | 3/2013 |
| WO | 2015/146418 A1 | 10/2015 |
| WO | 2019/074093 A1 | 4/2019 |
| WO | 2020/067143 | 4/2020 |
| WO | 2020/208051 A1 | 10/2020 |

OTHER PUBLICATIONS

Xueyan Wu et al. "Aggregation-induced emission characteristics of o-carborane-functionalized fluorene and its heteroanalogs: the influence of heteroatoms on photoluminescence" Mater. Chem. Front. 2020, vol. 4, p. 257-267 (Year: 2020).*

Kyung-Ryang Wee et al. "Carborane-Based Optoelectronically Active Organic Molecules: Wide Band Gap Host Materials for Blue Phosphorescence" J. Am. Chem. Soc. 2012, vol. 134, p. 17982-17990 (Year: 2012).*

Mina Jung et al. "A bipolar host based high triplet energy electroplex for an over 10 000 h lifetime in pure blue phosphorescent organic light-emitting diodes" Mater. Horiz. 2020, vol. 7, 559-565 (Year: 2020).*

Yoshimasa Wada et al., "Organic light emitters exhibiting very fast reverse intersystem crossing", Nature Photonics, Aug. 3, 2020, pp. 643-649, vol. 14, https://doi.org/10.1038/s41566-020-0667-0.

Huang, W. et al., "Molecular Design of Deep Blue Thermally Activated Delayed Fluorescence Materials Employing a Homoconjugative Triptycene Scaffold and Dihedral Angle Tuning", Chemistry of Materials, Feb. 13, 2018, pp. 1462-1466.

Machine Translation of CN113651841A (Year: 2021).

US Office Action dated May 9, 2025, issued in U.S. Appl. No. 17/714,872 (17 pages).

US Notice of Allowance dated Aug. 19, 2025, issued in U.S. Appl. No. 17/714,872 (8 pages).

Chinese Office Action corresponding to CN Application No. 202210290018.4, dated Apr. 23, 2026 (10 pages).

* cited by examiner

LIGHT EMITTING DIODE

CROSS-REFERENCE TO RELATED APPLICATION(S)

This application claims priority to and benefits of Korean Patent Application No. 10-2021-0044667 under 35 U.S.C. § 119, filed on Apr. 6, 2021 in the Korean Intellectual Property Office, the entire contents of which are incorporated herein by reference.

BACKGROUND

1. Technical Field

The disclosure herein relates to a light emitting diode including a novel polycyclic compound in an emission layer.

2. Description of the Related Art

Active development continues for organic electroluminescence display devices and the like as image display devices. Organic electroluminescence display devices are display devices which include so-called self-luminescent light emitting diodes in which holes and electrons respectively injected from a first electrode and a second electrode recombine in an emission layer, so that a luminescent material in the emission layer emits light to accomplish display.

In the application of light emitting diodes to display devices, there is a demand for light emitting diodes having a low driving voltage, high luminous efficiency, and a long life, and continuous development is required on materials for light emitting diodes which are capable of stably attaining such characteristics.

In recent years, in order to implement highly efficient light emitting diodes, technologies pertaining to phosphorescence emission using triplet state energy or delayed fluorescence using triplet-triplet annihilation (TTA) in which singlet excitons are generated by collision of triplet excitons are being developed, and thermally activated delayed fluorescence (TADF) materials using a delayed fluorescence phenomenon are being developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting diode exhibiting excellent luminous efficiency and long life characteristics.

An embodiment provides a light emitting diode which may include a first electrode, a second electrode disposed on the first electrode, and an emission layer disposed between the first electrode and the second electrode. The first electrode and the second electrode may each independently include Ag, Mg, Cu, Al, Pt, Pd, Au, Ni, Nd, Ir, Cr, Li, Ca, LiF, Mo, Ti, W, In, Sn, Zn, an oxide thereof, a compound thereof, or a mixture thereof, and the emission layer may include a polycyclic compound represented by Formula 1.

[Formula 1]

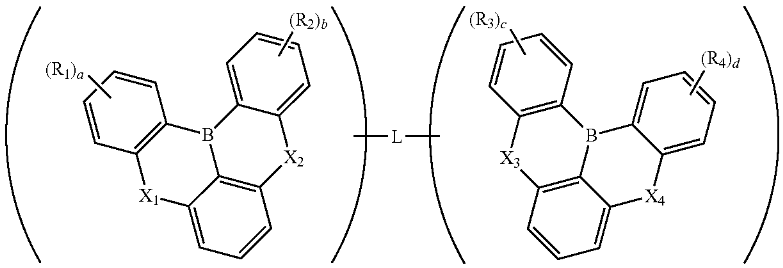

In Formula 1, $X_1$ to $X_4$ may each independently be $B(R_a)$, $N(R_b)$, $C(R_c)(R_d)$, O, S, or Se, and a to d may each independently be an integer from 0 to 4. $R_a$ to $R_d$ and $R_1$ to $R_4$ may each independently be a hydrogen atom, a deuterium atom, a halogen atom, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and L may be a substituted or unsubstituted divalent triptycene, or a substituted or unsubstituted divalent carborane.

In an embodiment, the polycyclic compound represented by Formula 1 may be represented by Formula 1-1.

[Formula 1-1]

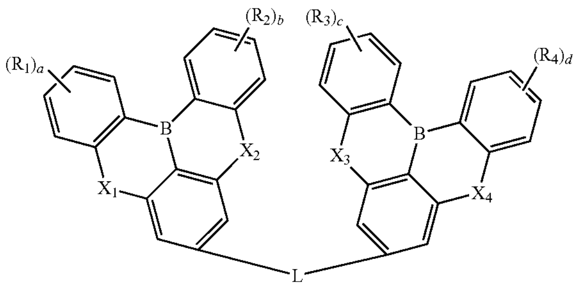

In Formula 1-1, $X_1$ to $X_4$, a to d, $R_1$ to $R_4$, and L may each be the same as defined in Formula 1.

In an embodiment, L may be a group represented by any one of L-1 to L-4.

L-1

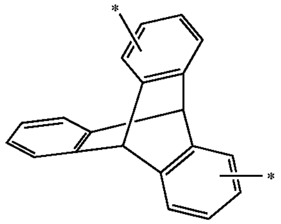

L-2

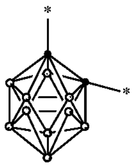

L-3

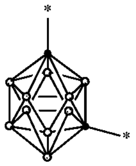

-continued

L-4

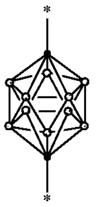

In L-2 to L-4, "○" may be BH, and "●" may be C.

In an embodiment, $R^1$ to $R^4$ may each independently be a t-butyl group, a substituted or unsubstituted phenyl group, or a substituted or unsubstituted biphenyl group.

In an embodiment, $X_1$ and $X_4$ may be the same.

In an embodiment, the emission layer may be a delayed fluorescent emission layer including a host and a dopant, and the dopant may include the polycyclic compound.

In an embodiment, the polycyclic compound represented by Formula 1 may be any one selected from Compound Group 1.

[Compound Group 1]

1

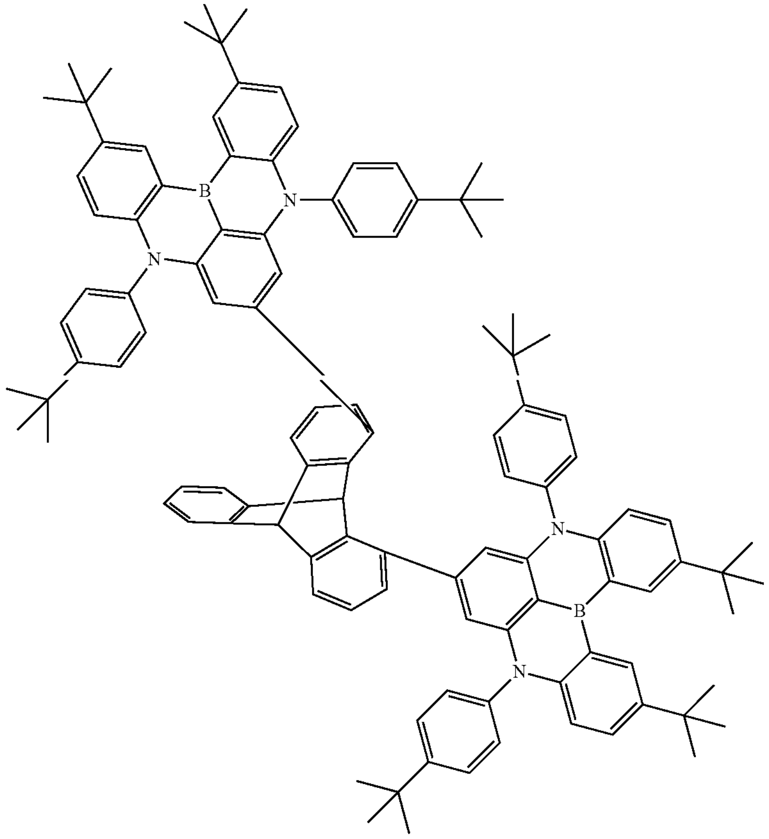

-continued
2
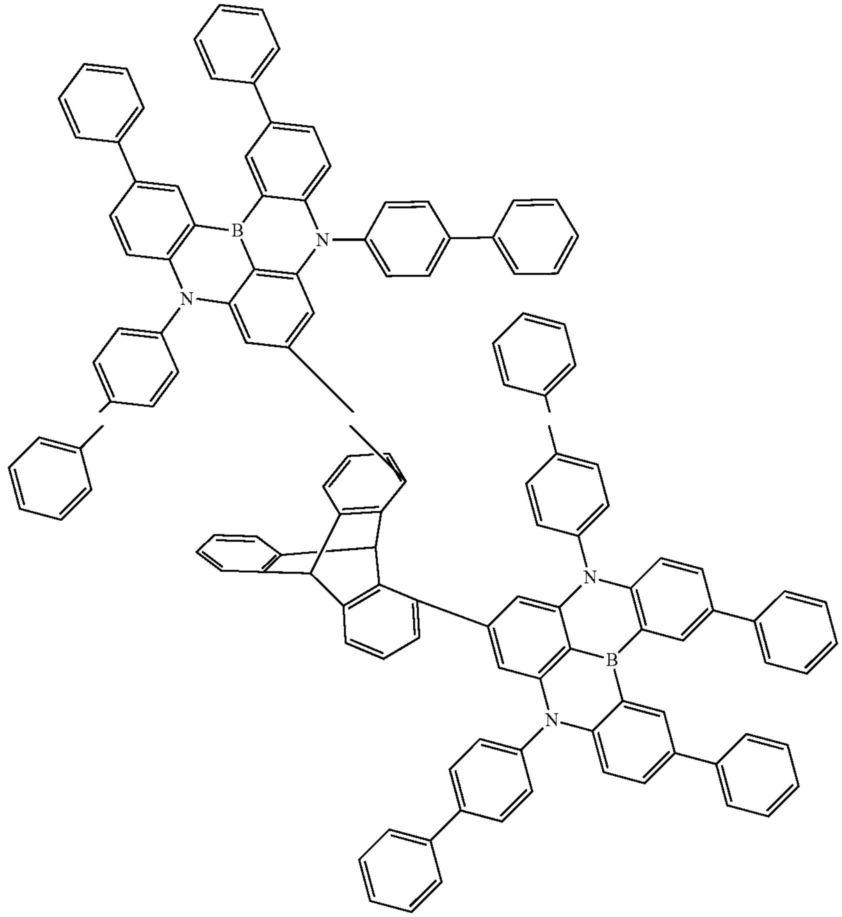
3
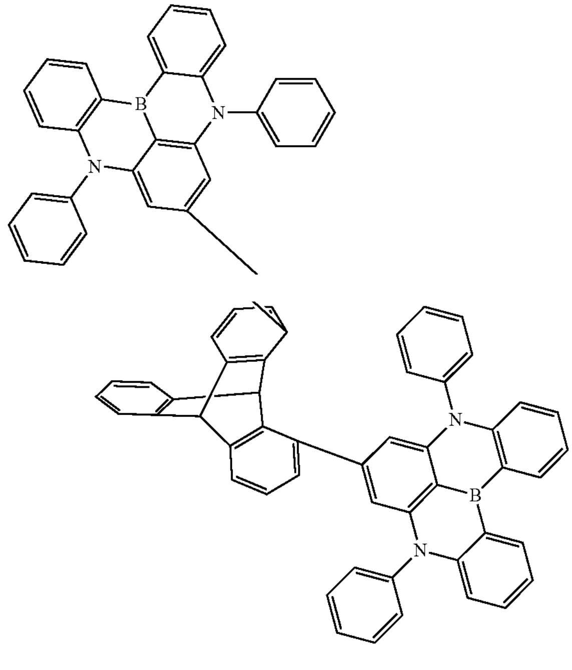

-continued
4
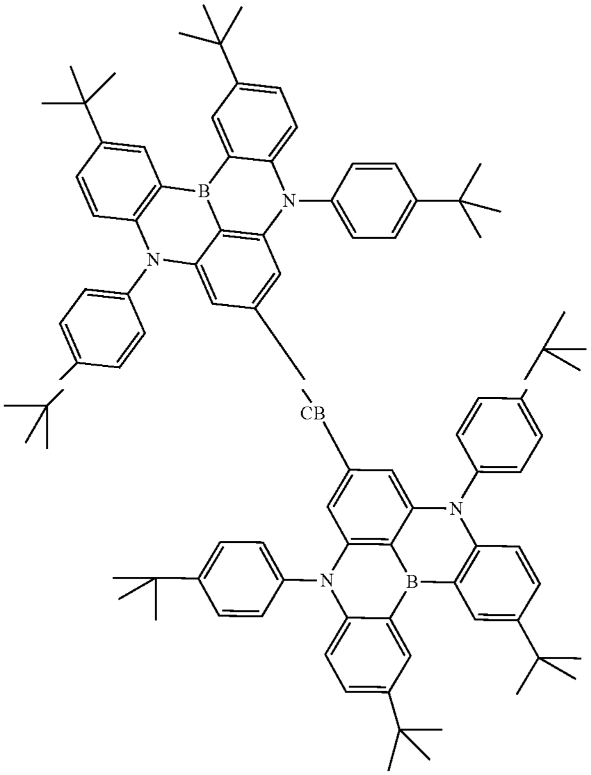
5
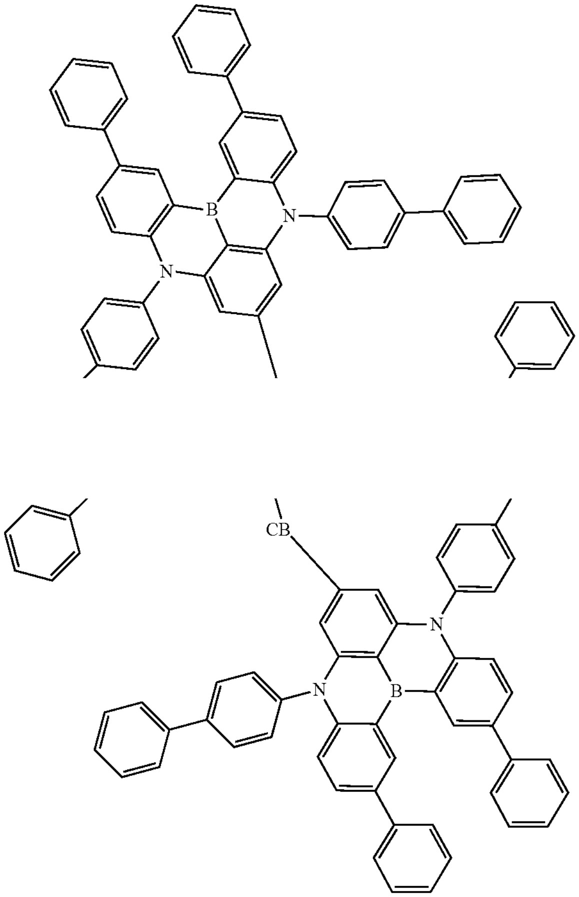

-continued

6

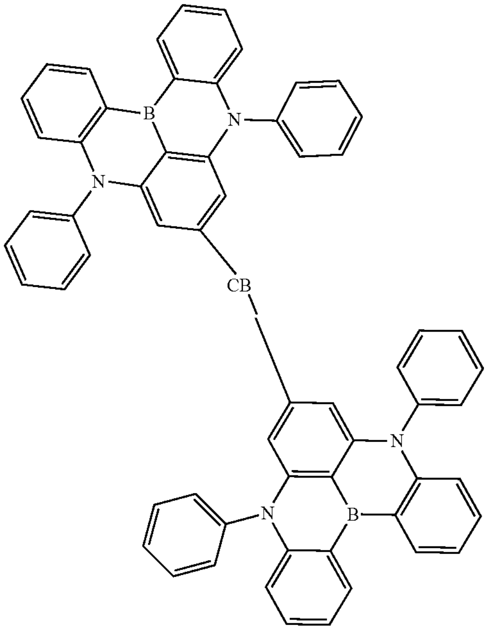

In Compounds 4 to 6, CB may be a divalent carborane group.

In an embodiment, the emission layer may include a first host, a second host different from the first host, an auxiliary dopant including an organometallic complex, and a light emitting dopant, and the light emitting dopant may include the polycyclic compound.

In an embodiment, the first host may include any one selected from Compounds HT-01 to HT-09.

HT-01

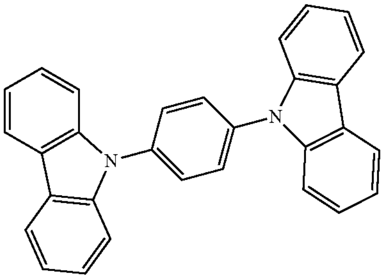

HT-02

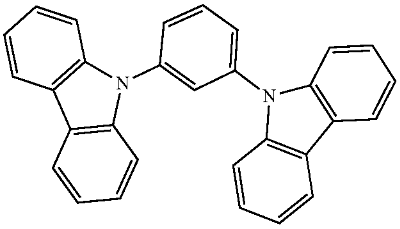

-continued

HT-03

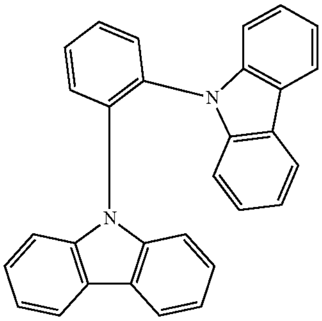

HT-04

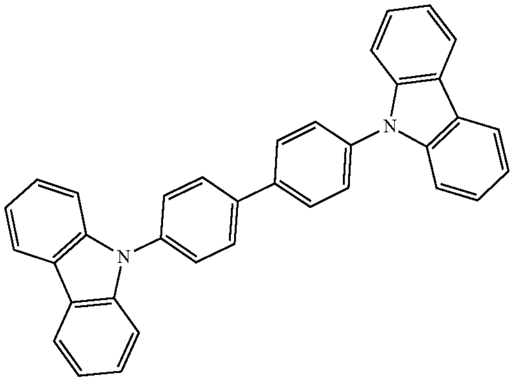

-continued
HT-05
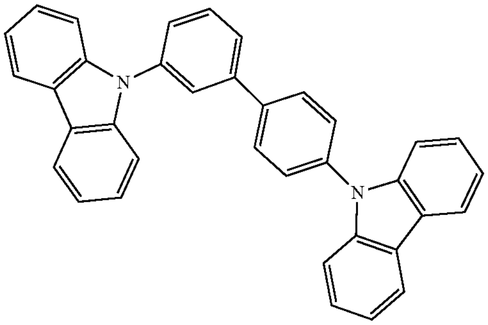
HT-06
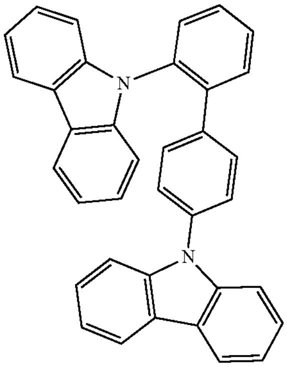
HT-07
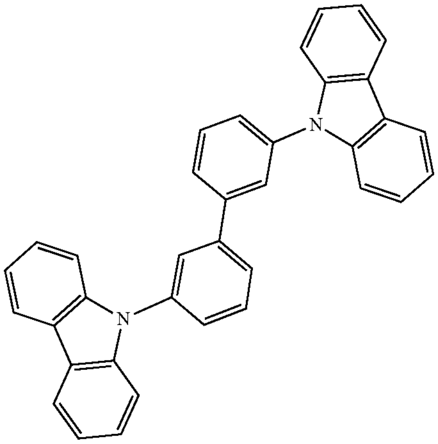
HT-08
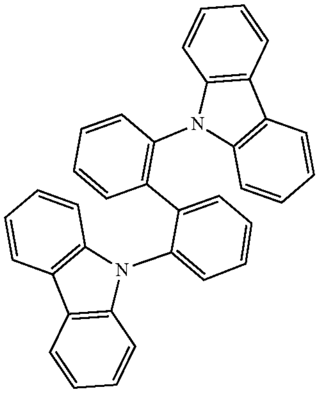
-continued
HT-09
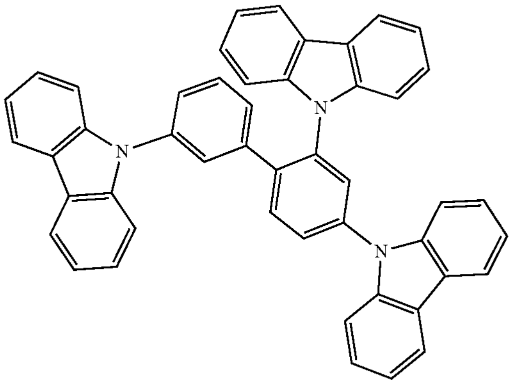
In an embodiment, the second host may include any one selected from Compounds ET-01 to ET-06.
ET-01
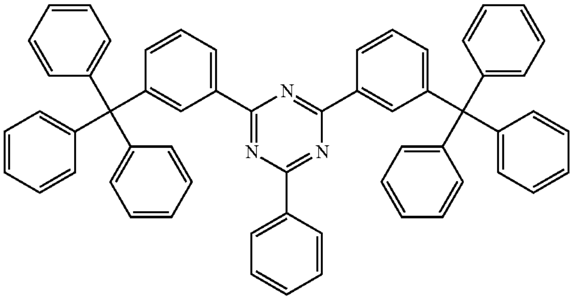
ET-02
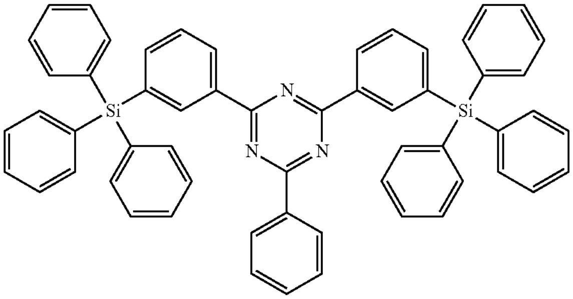
ET-03
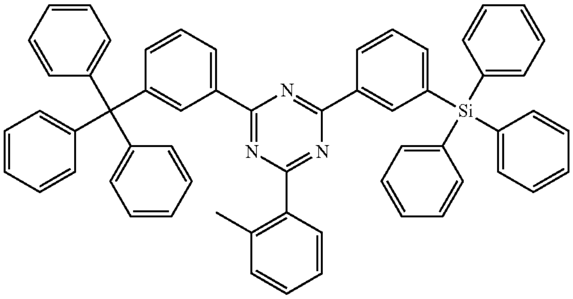

-continued
ET-04
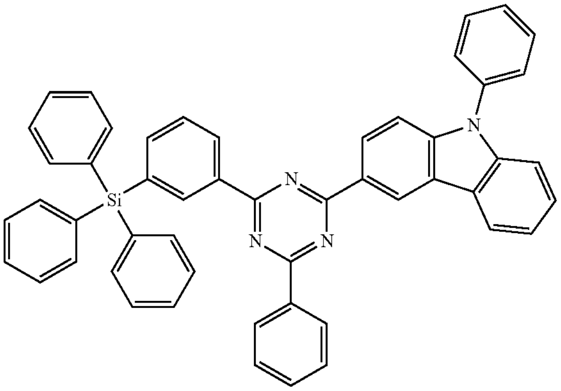
ET-05
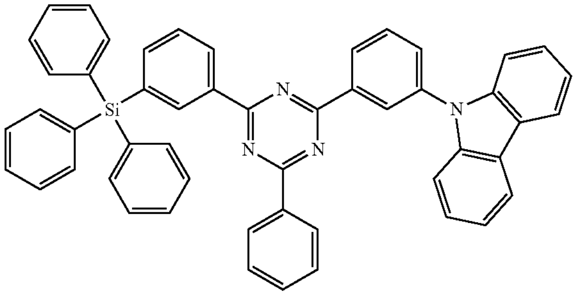
ET-06
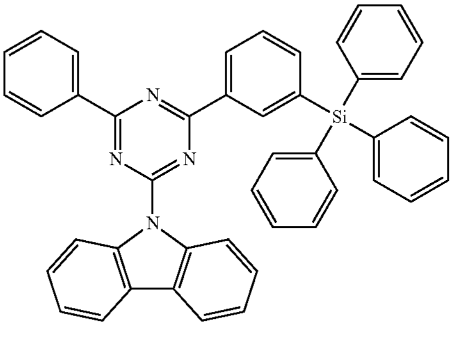
In an embodiment, the auxiliary dopant may include at least one selected from Compound Group P.
[Compound Group P]
1
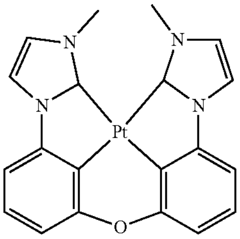
-continued
2
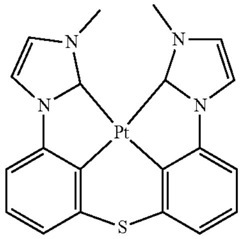
3
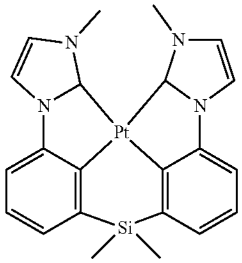
4
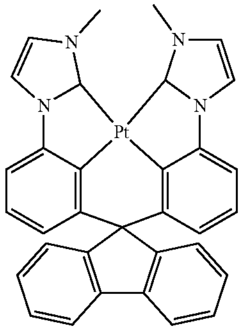
5
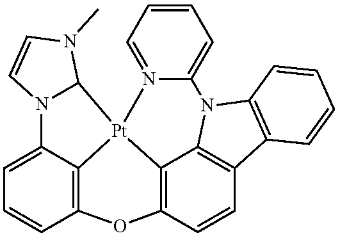
6
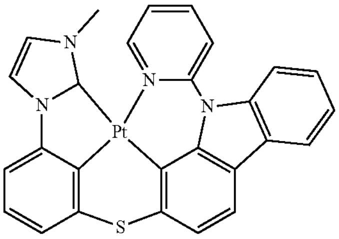
7
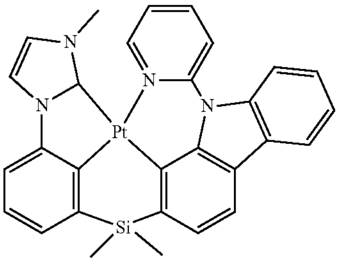

-continued

8

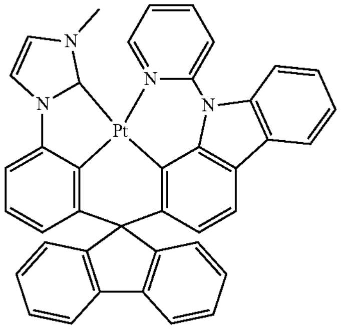

9

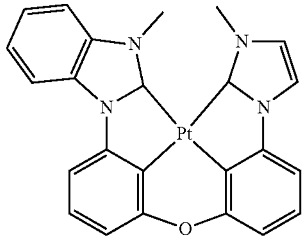

10

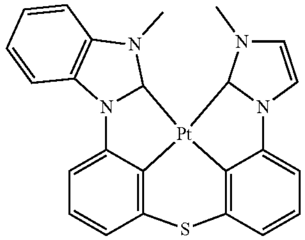

11

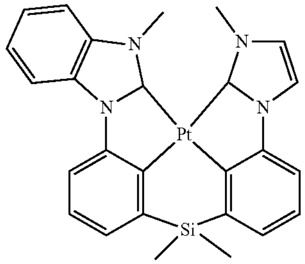

12

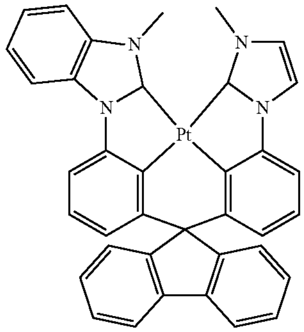

-continued

13

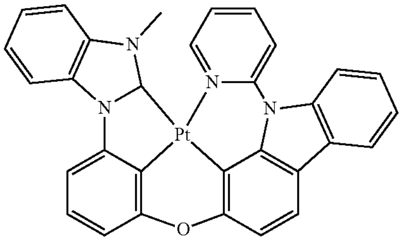

14

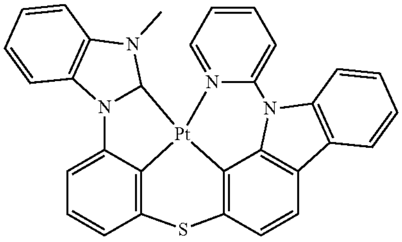

15

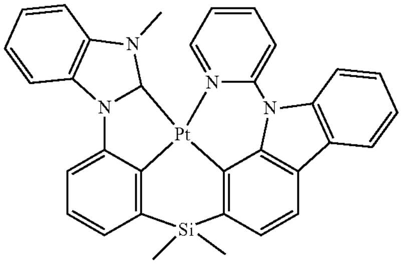

16

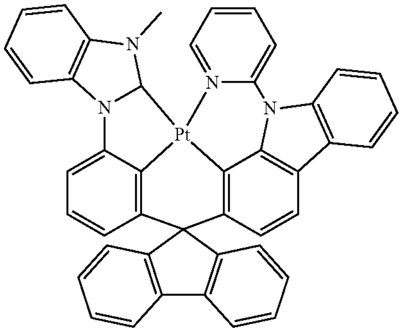

In an embodiment, the emission layer may emit blue light having a central wavelength in a range of about 450 nm to about 470 nm.

In an embodiment, the light emitting diode may further include a capping layer disposed on the second electrode, and a refractive index of the capping layer may be equal to or greater than about 1.6.

In an embodiment, a light emitting diode may include a first electrode, a second electrode disposed on the first electrode, and an emission layer disposed between the first electrode and the second electrode. The emission layer may include a hole transporting first host, an electron transporting second host different from the first host, an auxiliary dopant, and a light emitting dopant different from the auxiliary dopant, and the light emitting dopant may be a polycyclic compound represented by Formula 1.

[Formula 1]

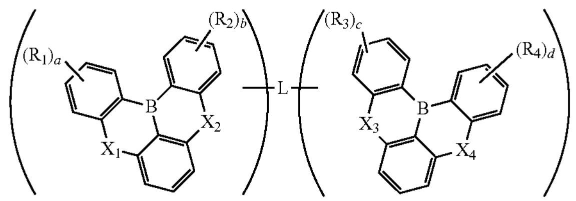

In Formula 1, $X_1$ to $X_4$ may each independently be $B(R_a)$, $N(R_b)$, $C(R_c)(R_d)$, O, S, or Se, and a to d may each independently be an integer from 0 to 4. $R_a$ to $R_d$ and $R_1$ to $R_4$ may each independently be a hydrogen atom, a deuterium atom, a halogen atom, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and L may be a substituted or unsubstituted divalent triptycene, or a substituted or unsubstituted divalent carborane.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
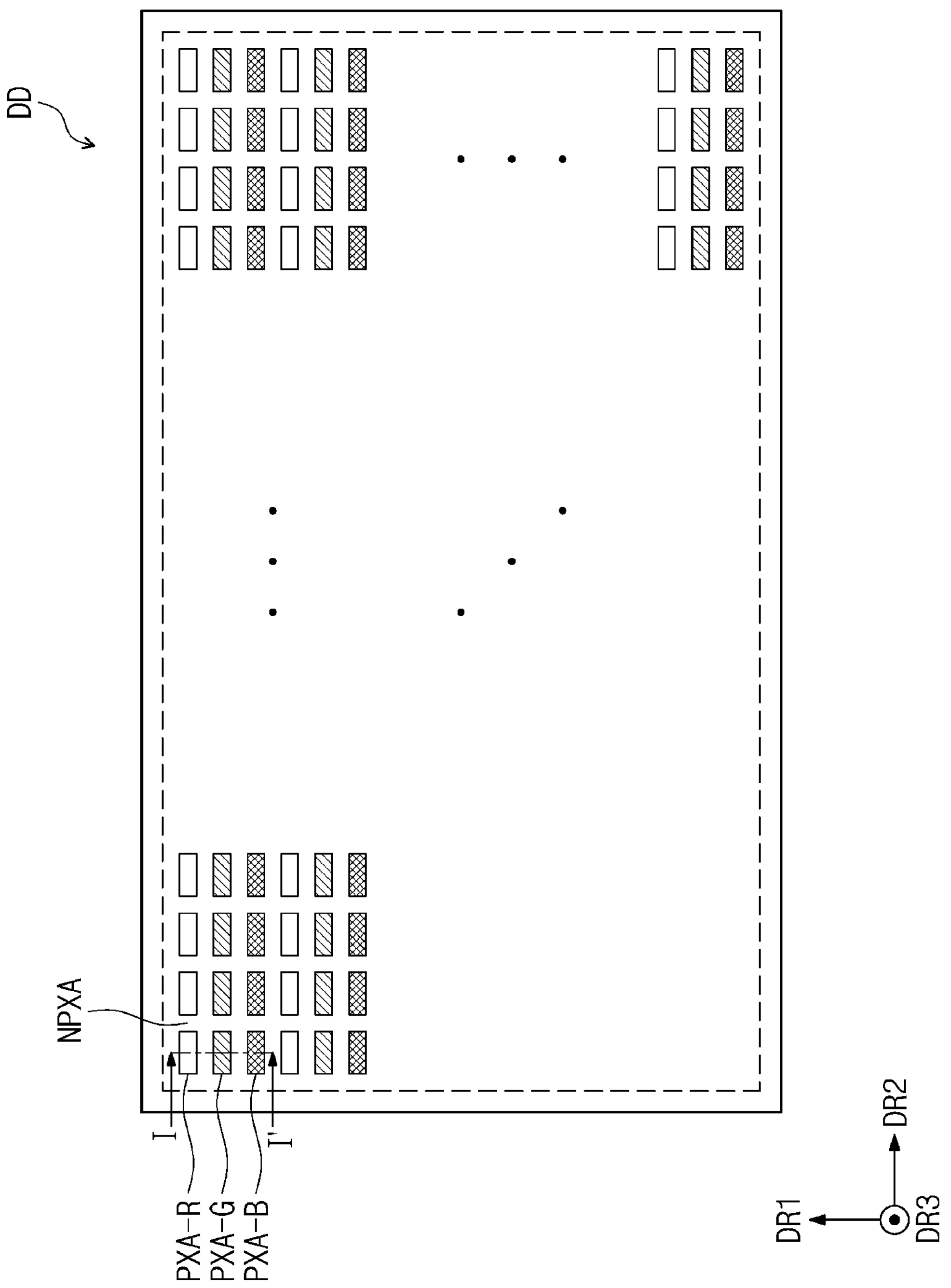
FIG. 1 is a plan view showing a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within +20%, +10%, or +5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the description, the term "substituted or unsubstituted" may mean a group that is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents recited above may itself be substituted or unsubstituted. For example, a biphenyl group may be interpreted as an aryl group or as a phenyl group substituted with a phenyl group.

In the description, the term "bonded to an adjacent group to form a ring" may mean a group that is bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and the heterocycle may each be monocyclic or polycyclic. Rings which are formed by groups being bonded to each other may be connected to another ring to form a spiro structure.

In the description, the term "adjacent group" may mean a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as mutually "adjacent groups" and two ethyl groups in 1,1-diethylcyclopentane may be interpreted as mutually "adjacent groups". For example, two methyl groups in 4,5-dimethylphenanthrene may be interpreted as mutually "adjacent groups".

In the description, examples of a halogen atom may include a fluorine atom, a chlorine atom, a bromine atom, and an iodine atom.

In the description, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but are not limited thereto.

In the description, a hydrocarbon ring group may be any functional group or substituent derived from an aliphatic hydrocarbon ring. The hydrocarbon ring group may be a saturated hydrocarbon ring group having 5 to 20 ring-forming carbon atoms.

In the description, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but are not limited thereto.

In the description, a fluorenyl group may be substituted, and two substituents may be bonded to each other to form a spiro structure. Examples of substituted fluorenyl groups are as follows. However, embodiments are not limited thereto.

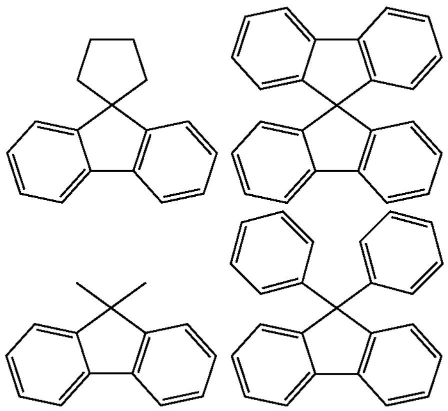

In the description, a heterocyclic group may be any functional group or substituent derived from a ring containing at least one of B, O, N, P, Si, or S as a heteroatom. The heterocyclic group may include an aliphatic heterocyclic group and an aromatic heterocyclic group. The aromatic heterocyclic group may be a heteroaryl group. The aliphatic heterocycle and the aromatic heterocycle may each be monocyclic or polycyclic.

In the description, a heterocyclic group may contain at least one of B, O, N, P, Si, or S as a heteroatom. When the heterocyclic group contains two or more heteroatoms, the two or more heteroatoms may be the same as or different from each other. The heterocyclic group may be a monocyclic heterocyclic group or a polycyclic heterocyclic group, and may include a heteroaryl group. The number of ring-forming carbon atoms in the heterocyclic group may be 2 to 30, 2 to 20, or 2 to 10.

In the description, an aliphatic heterocyclic group may contain at least one of B, O, N, P, Si, or S as a heteroatom. The number of ring-forming carbon atoms in the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but are not limited to thereto In the description, a heteroaryl group may include at least one of B, O, N, P, Si, or S as a heteroatom. When the heteroaryl group contains two or more heteroatoms, the two or more heteroatoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine, a triazine group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but are not limited thereto.

In the description, the above description of the aryl group may be applied to an arylene group, except that the arylene group is a divalent group. The above description of the heteroaryl group may be applied to a heteroarylene group, except that the heteroarylene group is a divalent group.

In the description, a silyl group may include an alkyl silyl group and an aryl silyl group. Examples of the silyl group may include a trimethylsilyl group, a triethylsilyl group, a t-butyldimethylsilyl group, a propyldimethylsilyl group, a triphenylsilyl group, a diphenylsilyl group, a phenylsilyl group, etc., but are not limited thereto.

In the description, the number of carbon atoms in an amino group is not particularly limited, but may be 1 to 30. The amino group may include an alkyl amino group, an aryl amino group, or a heteroaryl amino group. Examples of the amino group may include a methylamino group, a dimethylamino group, a phenylamino group, a diphenylamino group, a naphthylamino group, a 9-methyl-anthracenylamino group, etc., but are not limited thereto.

In the description, the number of carbon atoms in a carbonyl group is not particularly limited, but may be 1 to 40, 1 to 30, or 1 to 20. For example, the carbonyl group may have a structure selected from the following groups, but is not limited thereto.

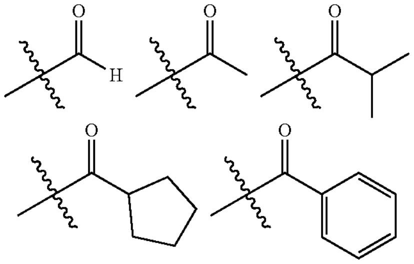

In the description, the number of carbon atoms in a sulfinyl group and a sulfonyl group is not particularly limited, but may be 1 to 30. The sulfinyl group may include an alkyl sulfinyl group and an aryl sulfinyl group. The sulfonyl group may include an alkyl sulfonyl group and an aryl sulfonyl group.

In the description, a thio group may include an alkyl thio group and an aryl thio group. The thio group may be a sulfur atom that is bonded to an alkyl group or an aryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., but are not limited to thereto.

In the description, an oxy group may be an oxygen atom that is bonded to an alkyl group or an aryl group as defined above. The oxy group may include an alkoxy group and an aryl oxy group. The alkoxy group may be linear, branched, or cyclic. The number of carbon atoms in the alkoxy group is not particularly limited, but may be, for example, 1 to 20, or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., but are not limited thereto.

In the description, a boron group may be a boron atom that is bonded to an alkyl group or an aryl group as defined above. The boron group may include an alkyl boron group and an aryl boron group. Examples of the boron group may include a trimethylboron group, a triethylboron group, a t-butyldimethylboron group, a triphenylboron group, a diphenylboron group, a phenylboron group, etc., but are not limited thereto.

In the description, an alkenyl group may be linear or branched. The number of carbon atoms is not particularly limited, but may be 2 to 30, 2 to 20, or 2 to 10 Examples of the alkenyl group may include a vinyl group, a 1-butenyl group, a 1-pentenyl group, a 1,3-butadienyl aryl group, a styrenyl group, a styryl vinyl group, etc., but are not limited thereto.

In the description, the number of carbon atoms in an amine group is not particularly limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, etc., but are not limited thereto.

In the description, examples of the alkyl group may include an alkylthio group, an alkyl sulfoxy group, an alkylaryl group, an alkylamino group, an alkyl boron group, an alkyl silyl group, and an alkyl amine group.

In the description, examples of the aryl group may include an aryloxy group, an arylthio group, an aryl sulfoxy group, an arylamino group, an aryl boron group, an aryl silyl group, and an aryl amine group.

In the description, a direct linkage may be a single bond.

In the description,

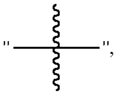

"-*", and * each represent a binding site in a corresponding formula.

Hereinafter, embodiments will be described with reference to the accompanying drawings.

Figure 2:
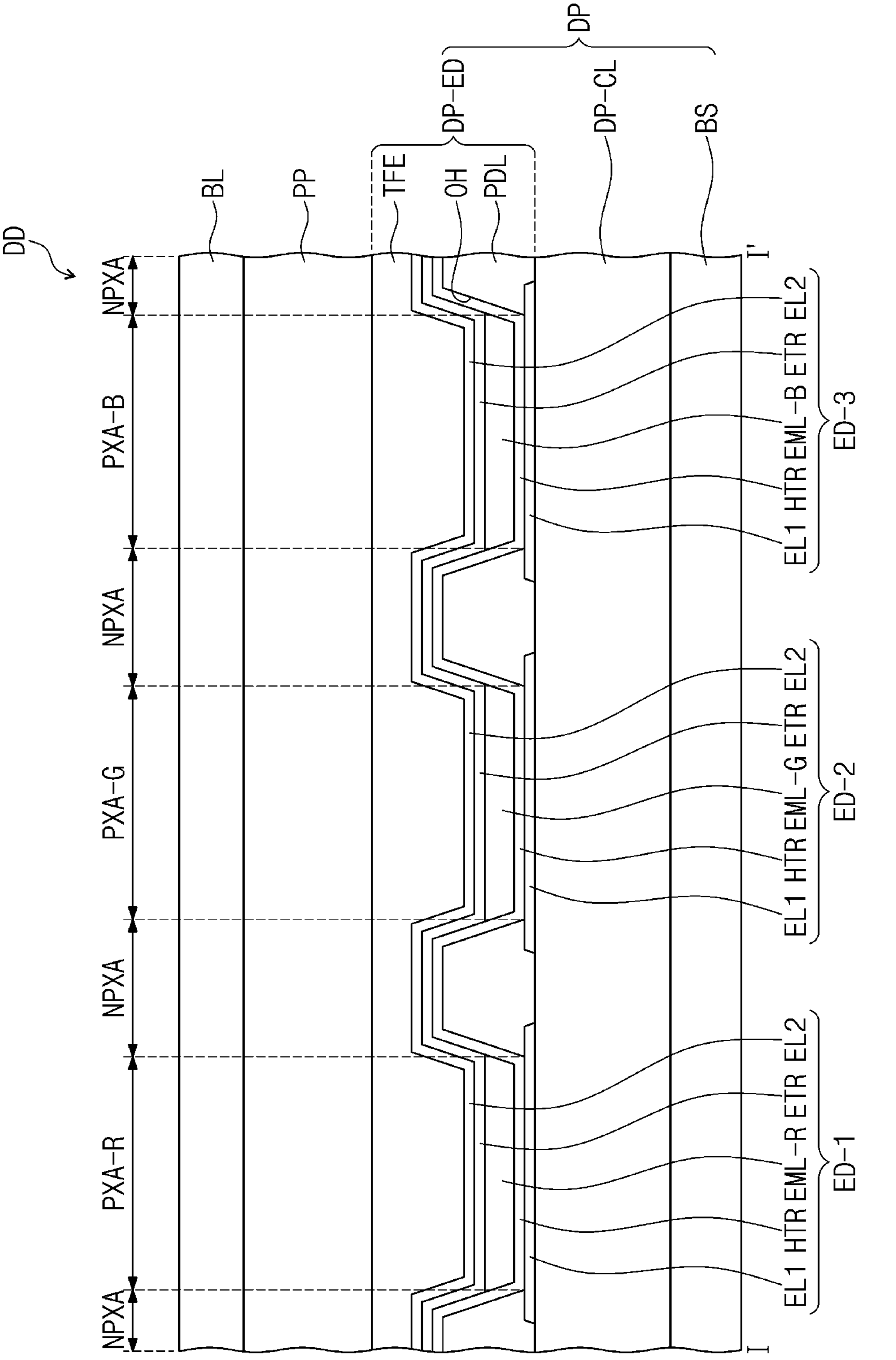
FIG. 2 is a schematic cross-sectional view of a display device according to an embodiment.

FIG. 1 is a plan view showing an embodiment of a display device DD. FIG. 2 is a schematic cross-sectional view of a display device DD of an embodiment. FIG. 2 is a schematic cross-sectional view showing a portion corresponding to line I-I' of FIG. 1.

The display device DD may include a display panel DP and an optical layer PP disposed on the display panel DP. The display panel DP includes light emitting diodes ED-1, ED-2, and ED-3. The display device DD may include multiples of each of the light emitting diodes ED-1, ED-2, and ED-3. The optical layer PP may be disposed on the display panel DP and may control reflected light at the display panel DP from an external light. The optical layer PP may include, for example, a polarizing layer or a color filter layer. Although not shown in the drawings, in an embodiment, the optical layer PP may be omitted from the display device DD.

A base substrate BL may be disposed on the optical layer PP. The base substrate BL may provide a base surface on which the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawing, in an embodiment, the base substrate BL may be omitted.

The display device DD according to an embodiment may further include a filling layer (not shown). The filling layer (not shown) may be disposed between a display element layer DP-ED and the base substrate BL. The filling layer (not shown) may be an organic material layer. The filling layer (not shown) may include at least one of an acrylic resin, a silicone-based resin, and an epoxy-based resin.

The display panel DP may include a base layer BS, a circuit layer DP-CL provided on the base layer BS, and a display element layer DP-ED. The display element layer DP-ED may include a pixel defining layer PDL, light emitting diodes ED-1, ED-2, and ED-3 disposed in the pixel defining layer PDL, and an encapsulation layer TFE disposed on the light emitting diodes ED-1, ED-2, and ED-3.

The base layer BS may provide a base surface on which the display element layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL may be disposed on the base layer BS, and the circuit layer DP-CL may include transistors (not shown). The transistors (not shown) may each include a control electrode, an input electrode, and an output electrode. For example, the circuit layer DP-CL may include a switching transistor and a driving transistor for driving light emitting diodes ED-1, ED-2, and ED-3 of the display element layer DP-ED.

The light emitting diodes ED-1, ED-2, and ED-3 may each have a structure of a light emitting diode ED of an embodiment of FIGS. 3 to 6, which will be described later. The light emitting diodes ED-1, ED-2, and ED-3 may each include a first electrode EL1, a hole transport region HTR, emission layers EML-R, EML-G, and EML-B, an electron transport region ETR, and a second electrode EL2.

FIG. 2 shows an embodiment in which the emission layers EML-R, EML-G, and EML-B of the light emitting diodes ED-1, ED-2, and ED-3 are disposed in openings OH defined in the pixel defining layer PDL, and the hole transport region HTR, the electron transport region ETR, and the second electrode EL2 are each provided as a common layer throughout the light emitting diodes ED-1, ED-2, and ED-3. However, embodiments are not limited thereto, and although not shown in FIG. 2, in an embodiment, the hole transport region HTR and the electron transport region ETR may each be provided by being patterned inside the openings OH defined in the pixel defining layer PDL. For example, in an embodiment, the hole transport region HTR, the emission layers EML-R, EML-G, and EML-B, and the electron transport region ETR, of the light emitting diodes ED-1, ED-2, and ED-3 may each be patterned and provided through an inkjet printing method.

An encapsulation layer TFE may cover the light emitting diodes ED-1, ED-2, and ED-3. The encapsulation layer TFE may seal the display element layer DP-ED. The encapsulation layer TFE may be a thin film encapsulation layer. The encapsulation layer TFE may be a single layer or a lamination of multiple layers. The encapsulation layer TFE may include at least one insulating layer. The encapsulation layer TFE according to an embodiment may include at least one inorganic film (hereinafter, an encapsulation inorganic film). The encapsulation layer TFE according to an embodiment may include at least one organic film (hereinafter, an encapsulation organic film) and at least one encapsulation inorganic film.

The encapsulation inorganic film may protect the display element layer DP-ED from moisture and/or oxygen, and the encapsulation organic film may protect the display element layer DP-ED from foreign substances such as dust particles. The encapsulation inorganic film may include silicon nitride, silicon oxy nitride, silicon oxide, titanium oxide, aluminum oxide, etc., but embodiments are not limited thereto. The encapsulation organic layer may include an acrylic compound, an epoxy-based compound, etc. The encapsulation organic layer may include a photopolymerizable organic material, and embodiments are not limited thereto.

The encapsulation layer TFE may be disposed on the second electrode EL2, and may be disposed to fill the openings OH.

Referring to FIGS. 1 and 2, the display device DD may include non-light emitting areas NPXA and light emitting areas PXA-R, PXA-G, and PXA-B. The light emitting areas PXA-R, PXA-G, and PXA-B may each be an area emitting light generated from each of the light emitting diodes ED-1, ED-2, and ED-3. The light emitting areas PXA-R, PXA-G, and PXA-B may be spaced apart from each other on a plane.

Each of the light emitting areas PXA-R, PXA-G, and PXA-B may be an area separated from each other by the pixel defining layer PDL. The non-light emitting areas NPXA may be an area between neighboring light emitting areas PXA-R, PXA-G, and PXA-B, and may correspond to the pixel defining layer PDL. In the description, each of the light emitting areas PXA-R, PXA-G, and PXA-B may correspond to a pixel. The pixel defining layer PDL may separate the light emitting diodes ED-1, ED-2, and ED-3. The emission layers EML-R, EML-G, and EML-B of the light emitting diodes ED-1, ED-2 and ED-3 may be disposed in the openings OH defined by the pixel defining layer PDL and separated from each other.

The light emitting areas PXA-R, PXA-G, and PXA-B may be divided into groups according to the color of light generated from each of the light emitting diodes ED-1, ED-2, and ED-3. In the display device DD of an embodiment shown in FIGS. 1 and 2, three light emitting areas PXA-R, PXA-G, and PXA-B which respectively emit red light, green light, and blue light, are presented as an example. For example, the display device DD of an embodiment may include a red light emitting area PXA-R, a green light emitting area PXA-G, and a blue light emitting area PXA-B, which are distinct from one another.

In the display device DD according to an embodiment, the light emitting diodes ED-1, ED-2, and ED-3 may emit light having different wavelength ranges. For example, in an embodiment, the display device DD may include a first light emitting diode ED-1 emitting red light, a second light emitting diode ED-2 emitting green light, and a third light emitting diode ED-3 emitting blue light. For example, the red light emitting area PXA-R, the green light emitting area PXA-G, and the blue light emitting area PXA-B of the display device DD may correspond to the first light emitting diode ED-1, the second light emitting diode ED-2, and the third light emitting diode ED-3, respectively.

However, embodiments are not limited thereto, and the first to third light emitting diodes ED-1, ED-2 and ED-3 may emit light in a same wavelength range or emit light in at least one different wavelength range. For example, the first to third light emitting diodes ED-1, ED-2, and ED-3 all may emit blue light.

The light emitting areas PXA-R, PXA-G, and PXA-B in the display device DD according to an embodiment may be arranged in the form of a stripe. Referring to FIG. 1, red light emitting areas PXA-R, green light emitting areas PXA-G, and blue light emitting areas PXA-B may each be arranged along a second directional axis DR2. In another embodiment, the red light emitting area PXA-R, the green light emitting area PXA-G, and the blue light emitting area PXA-B may be alternately arranged in turn along a first directional axis DR1.

FIGS. 1 and 2 show that the light emitting areas PXA-R, PXA-G, and PXA-B are all similar in size, but embodiments are not limited thereto, and the light emitting areas PXA-R, PXA-G and PXA-B may be different in size from each other according to a wavelength range of emitted light. The areas of the light emitting areas PXA-R, PXA-G, and PXA-B may be areas in a plan view that are defined by the first directional axis DR1 and the second directional axis DR2.

The arrangement of the light emitting areas PXA-R, PXA-G, and PXA-B is not limited to the one shown in FIG. 1, and the order in which the red light emitting area PXA-R, the green light emitting area PXA-G, and the blue light emitting area PXA-B are arranged may be provided in various combinations according to display quality characteristics required for the display device DD. For example, the light emitting areas PXA-R, PXA-G, and PXA-B may be arranged in a PENTILE® configuration or in a diamond configuration.

In an embodiment, an area of each of the light emitting areas PXA-R, PXA-G, and PXA-B may be different in size from one another. For example, in an embodiment, the green light emitting area PXA-G may be smaller than the blue light emitting area PXA-B in size, but embodiments are not limited thereto.

Figure 3:
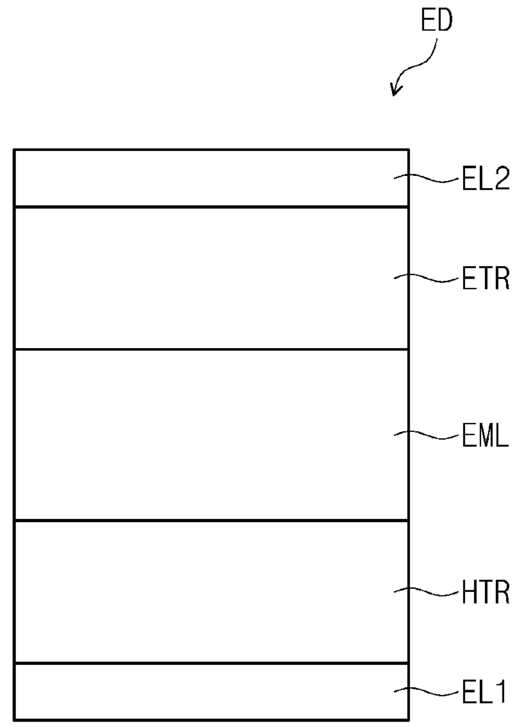
FIG. 3 is a schematic cross-sectional view showing a light emitting diode according to an embodiment.

Hereinafter, FIGS. 3 to 6 are each a schematic cross-sectional view showing a light emitting diode according to an embodiment. As shown in FIG. 3, the light emitting diode ED according to an embodiment may include a first electrode EL1, a second electrode EL2 facing the first electrode EL1, and at least one functional layer disposed between the first electrode EL1 and the second electrode EL2. The at least one functional layer may include a hole transport region HTR, an emission layer EML, and an electron transport region ETR, which are sequentially stacked. For example, the light emitting diode ED of an embodiment may include a first electrode EL1, a hole transport region HTR, an emission layer EML, an electron transport region ETR, and a second electrode EL2.

Figure 4:
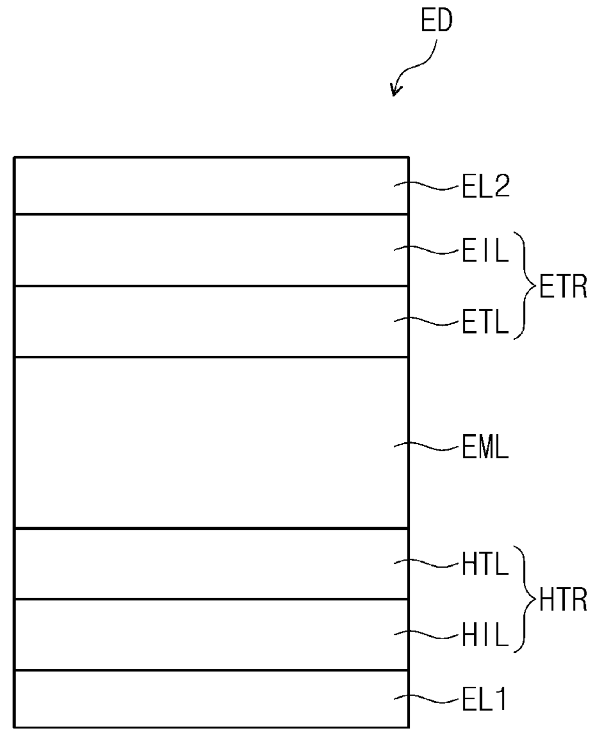
FIG. 4 is a schematic cross-sectional view showing a light emitting diode according to an embodiment.
Figure 5:
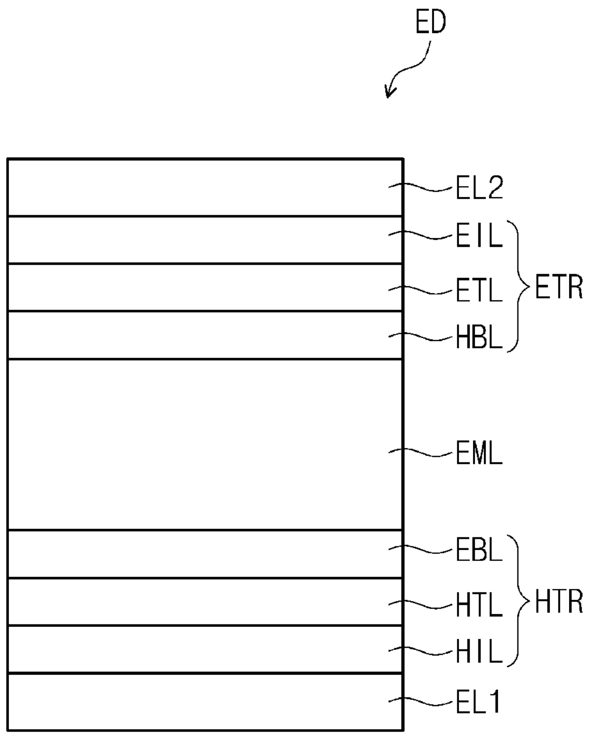
FIG. 5 is a schematic cross-sectional view showing a light emitting diode according to an embodiment.
Figure 6:
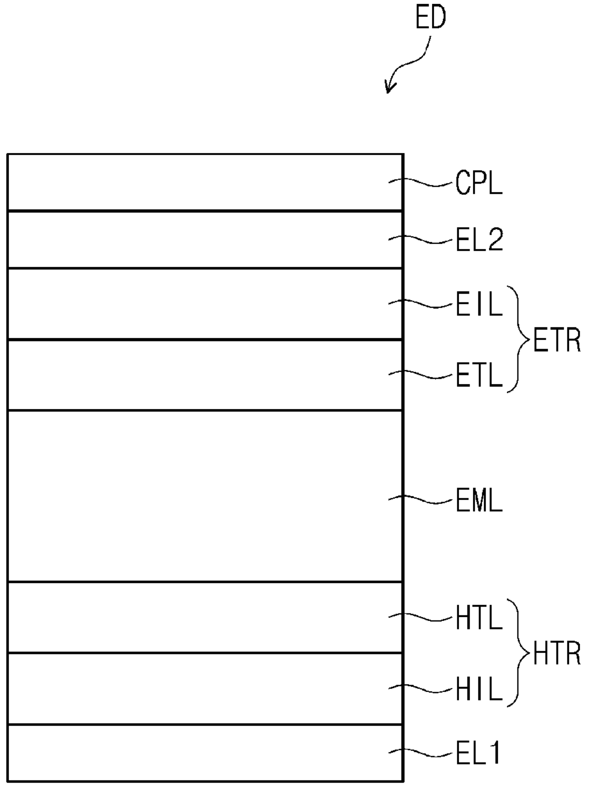
FIG. 6 is a schematic cross-sectional view showing a light emitting diode according to an embodiment.

In comparison to FIG. 3, FIG. 4 shows a schematic cross-sectional view of a light emitting diode ED of an embodiment in which the hole transport region HTR includes a hole injection layer HIL and a hole transport layer HTL, and in which the electron transport region ETR includes an electron injection layer EIL and an electron transport layer ETL. In comparison to FIG. 3, FIG. 5 shows a schematic cross-sectional view of a light emitting diode ED of an embodiment in which the hole transport region HTR includes a hole injection layer HIL, a hole transport layer HTL, and an electron blocking layer EBL, and in which the electron transport region ETR includes an electron injection layer EIL, an electron transport layer ETL, and a hole blocking layer HBL. In comparison to FIG. 4, FIG. 6 shows a schematic cross-sectional view of a light emitting diode ED of an embodiment, in which a capping layer CPL disposed on the second electrode EL2 is provided.

The light emitting diode ED according to an embodiment may include a polycyclic compound of an embodiment, which will be described later, in the emission layer EML. In the display device DD (FIG. 2) of an embodiment including multiple light emitting regions, the emission layer EML constituting at least one light emitting region may include the polycyclic compound according to an embodiment, which will be described later.

In the light emitting diode ED according to an embodiment, the first electrode EL1 has conductivity. The first electrode EL1 may be formed of a metal material, a metal alloy, or a conductive compound. The first electrode EL1 may be an anode or a cathode. However, embodiments are not limited thereto. In an embodiment, the first electrode EL1 may be a pixel electrode. The first electrode EL1 may be a transmissive electrode, a transflective electrode, or a reflective electrode. The first electrode may include Ag, Mg, Cu, Al, Pt, Pd, Au, Ni, Nd, Ir, Cr, Li, Ca, LiF, Mo, Ti, W, In, Sn, Zn, an oxide thereof, a compound thereof, or a mixture thereof.

When the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca (e.g., a stack structure of LiF and Ca), LiF/Al (e.g., a stack structure of LiF and Al), Mo, Ti, W, a compound thereof, or a mixture thereof (e.g., a mixture of Ag and Mg). In an embodiment, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but embodiments are not limited thereto. The first electrode EL1 may include the above-described metal materials, a combination of two or more metal materials selected from the above-described metal materials, or oxides of the above-described metal materials. The first electrode EL1 may have a thickness in a range of about 700 Å to about 10,000 Å. For example, the first electrode EL1 may have a thickness in a range of about 1,000 Å to about 3,000 Å.

The hole transport region HTR is provided on the first electrode EL1. The hole transport region HTR may include at least one of a hole injection layer HIL, a hole transport layer HTL, a buffer layer (not shown), a light emitting auxiliary layer (not shown), and an electron blocking layer EBL. The hole transport region HTR may have, for example, a thickness in a range of about 50 Å to about 15,000 Å.

The hole transport region HTR may be a layer formed of a single material, a layer formed of different materials, or a multilayer structure having layers formed of different materials.

For example, the hole transport region HTR may have a single-layer structure formed of the hole injection layer HIL or the hole transport layer HTL, or a single-layer structure formed of a hole injection material or a hole transport material. For example, the hole transport region HTR may have a single-layer structure formed of different materials, or a structure in which a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL are stacked in its respective stated order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1 below.

[Formula H-1]

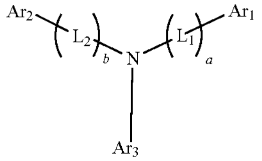

In Formula H-1 above, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a and b may each independently be an integer from 0 to 10. When a or b is 2 or greater, multiple $L_1$ groups and multiple $L_2$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

The compound represented by Formula H-1 above may be a monoamine compound. In another embodiment, the compound represented by Formula H-1 may be a diamine compound in which at least one of $Ar_1$ to $Ar_3$ may include an amine group as a substituent. For example, a compound represented by Formula H-1 may be a carbazole-based compound including a substituted or unsubstituted carbazole group in at least one of $Ar_1$ or $Ar_2$ or a substituted or unsubstituted fluorene-based group in at least one of $Ar_1$ or $Ar_2$.

The compound represented by Formula H-1 may be any one selected from Compound Group H below. However, the compounds listed in Compound Group H are presented as an examples, and the compound represented by Formula H-1 is not limited to those listed in Compound Group H below.

[Compound Group H]

H-1-1

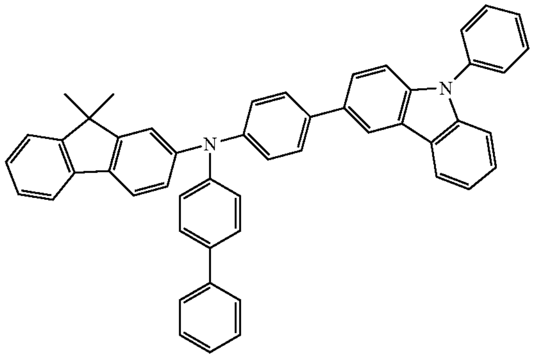

H-1-2

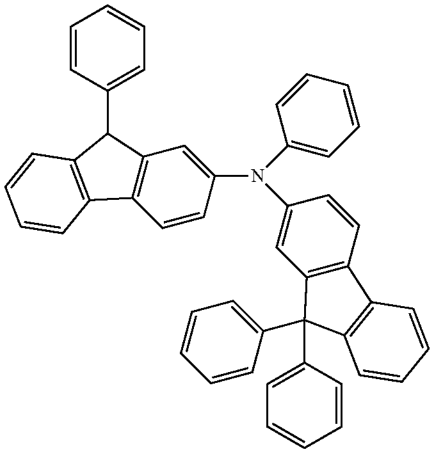

-continued
H-1-3
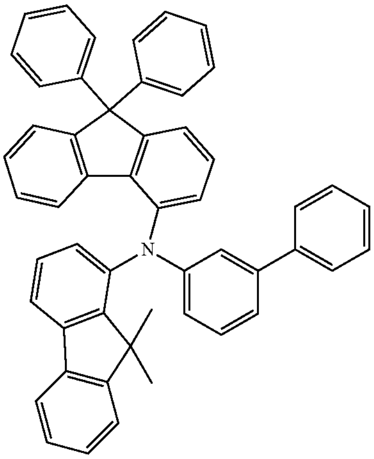
H-1-4
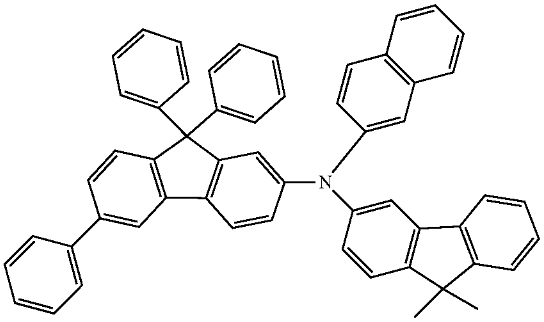
H-1-5
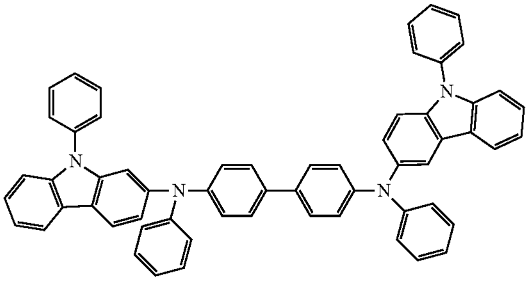
H-1-6
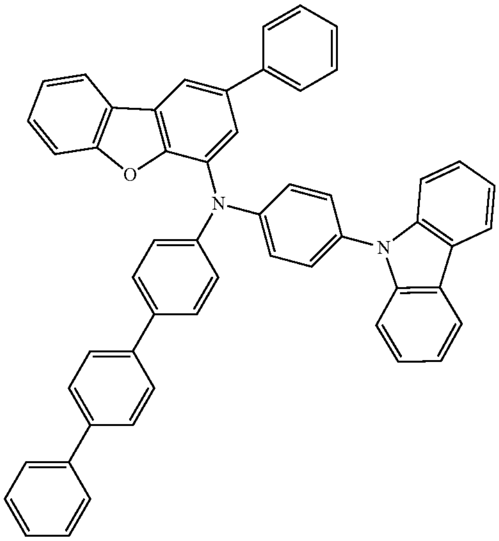
-continued
H-1-7
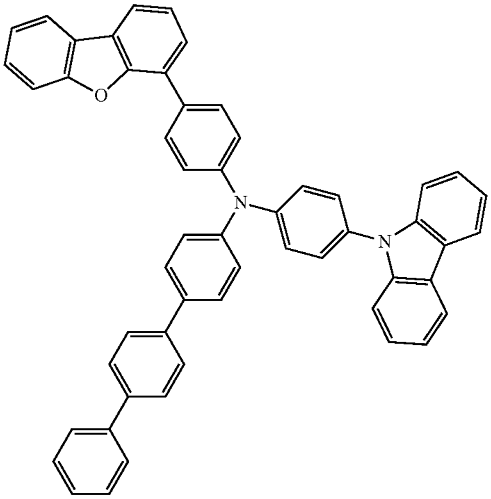
H-1-8
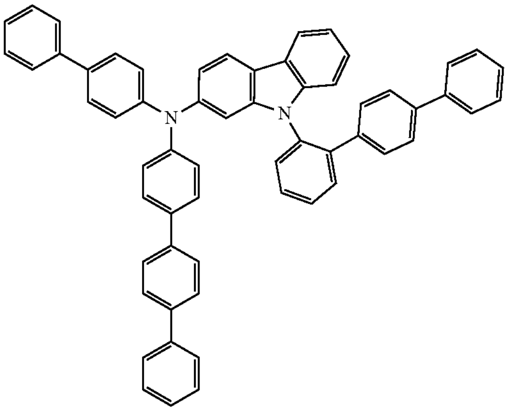
H-1-9
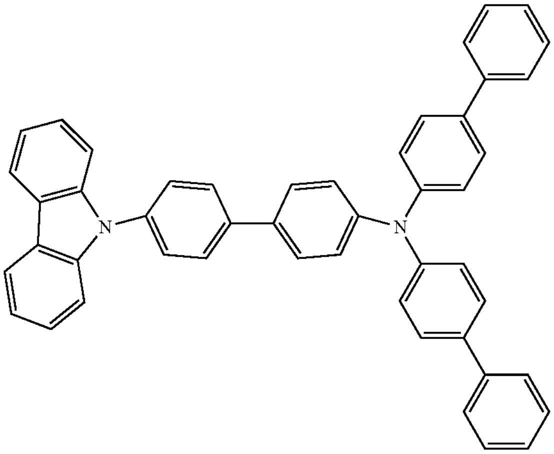

-continued
H-1-10
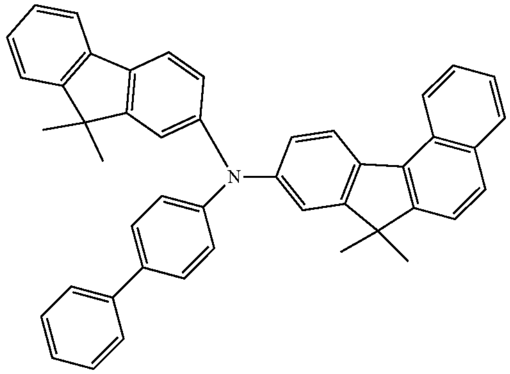
H-1-11
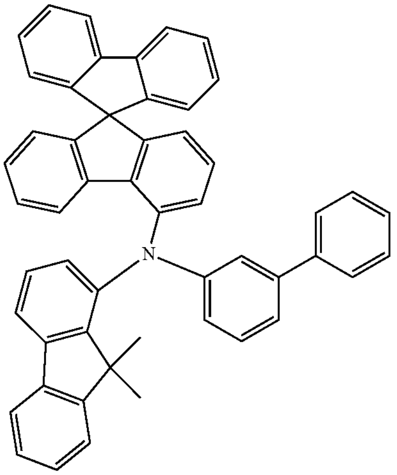
H-1-12
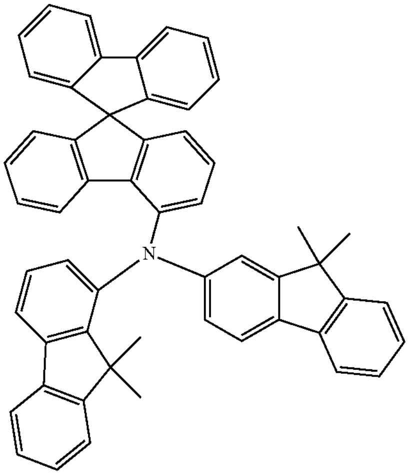
-continued
H-1-13
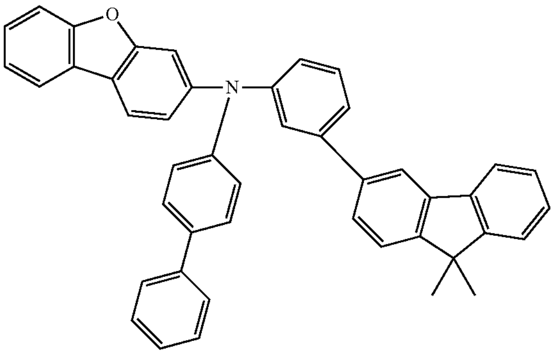
H-1-14
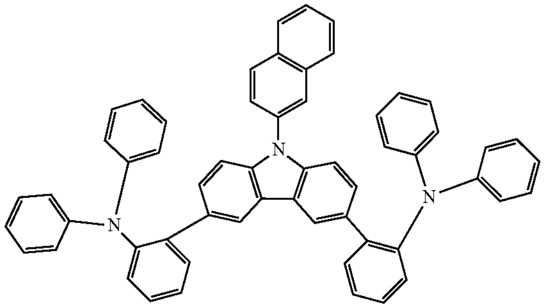
H-1-15
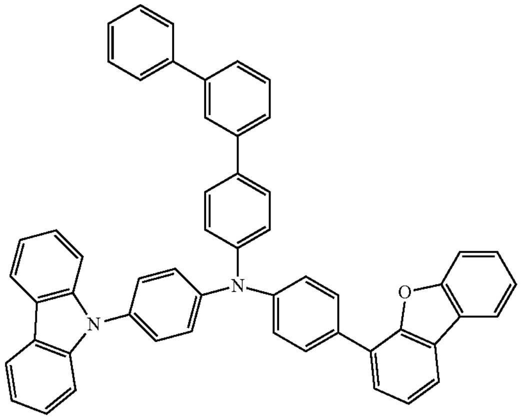

-continued

H-1-16

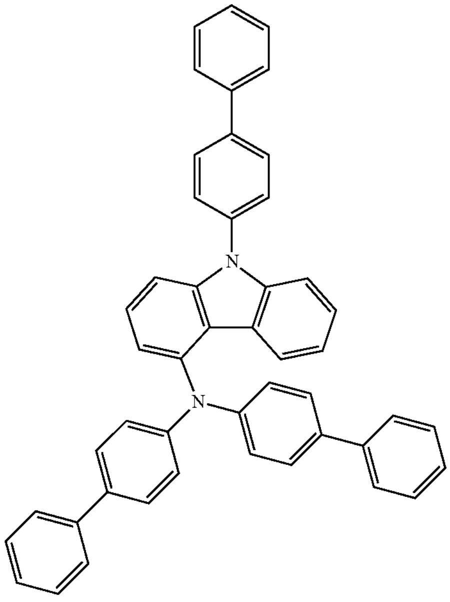

H-1-17

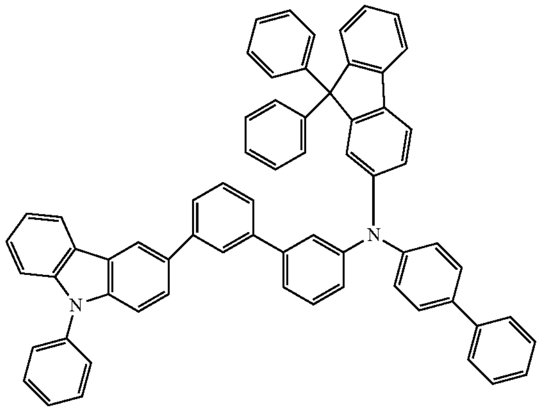

H-1-18

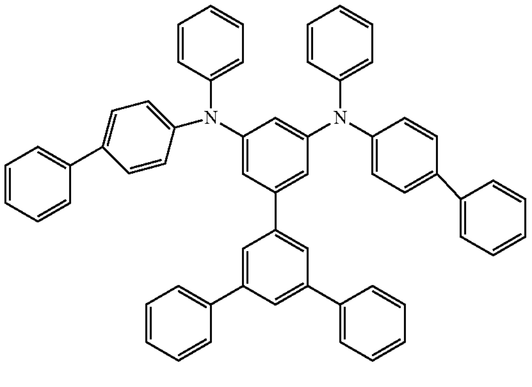

-continued

H-1-19

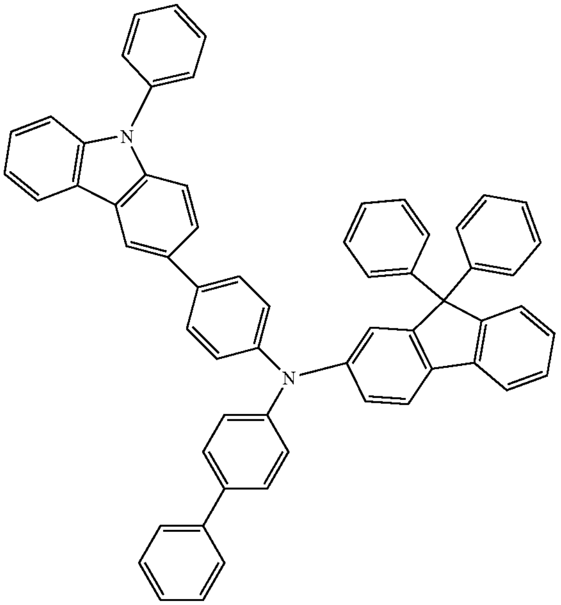

The hole transport region HTR may include a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4',4"-tris(N,N-diphenylamino)triphenylamine (TDATA), 4,4',4"-tris {N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB or NPD), triphenylamine-containing polyetherketone (TPAPEK), 4-isopropyl-4-methyldiphenyliodonium tetrakis(pentafluorophenyl) borate, dipyrazino[2,3-f: 2',3'-h] quinoxaline-2,3,6,7,10,11-hexacarbonitrile (HAT-CN), etc.

The hole transport region HTR may include carbazole-based derivatives such as N-phenyl carbazole and polyvinyl carbazole, fluorene-based derivatives, N,N'-bis(3-methylphenyl)-N,N'-diphenyl-[1,1-biphenyl]-4,4-diamine (TPD), triphenylamine-based derivatives such as 4,4,4"-tris (N-carbazolyl)triphenylamine (TCTA), N,N'-di(1-naphtalene-1-yl)-N,N'-diphenyl-benzidine (NPB), 4,4-cyclohexylidene bis[N,N-bis(4-methylphenyl]benzenamine] (TAPC), 4,4-bis[N,N'-(3-tolyl)amino]-3,3'-dimethylbiphenyl (HMTPD), 1,3-bis(N-carbazolyl)benzene (mCP), etc.

The hole transport region HTR may include 9-(4-tert-Butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region described above in at least one of the hole injection layer HIL, the hole transport layer HTL, and the electron blocking layer EBL.

The hole transport region HTR may have a thickness in a range of about 100 Å to about 10,000 Å. For example, the hole transport region HTR may have a thickness in a range of about 100 Å to about 5,000 Å. When the hole transport region HTR includes a hole injection layer HIL, the hole injection layer HIL may have a thickness, for example, in a range of about 30 Å to about 1,000 Å. When the hole transport region HTR includes a hole transport layer HTL, the hole transport layer HTL may have a thickness in a range of about 30 Å to about 1,000 Å. When the hole transport region HTR includes an electron blocking layer EBL, the electron blocking layer EBL may have a thickness, for example, in a range of about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be obtained without a substantial increase in driving voltage.

The hole transport region HTR may further include, in addition to the above-described materials, a charge generation material to increase conductivity. The charge generation material may be uniformly or non-uniformly dispersed in the hole transport region HTR. The charge generation material may be, for example, a p-dopant. The p-dopant may include at least one of halogenated metal compounds, quinone derivatives, metal oxides, or cyano group-containing compounds, but is not limited thereto. For example, the p-dopant may include halogenated metal compounds such as CuI and RbI, quinone derivatives such as tetracyanoquinodimethane (TCNQ) and 2,3,5,6-tetrafluoro-7,7,8,8-tetracyanoquinodimethane (F4-TCNQ), metal oxides such as tungsten oxides and molybdenum oxides, cyano group-containing compounds such as dipyrazino[2,3-f: 2',3'-h]quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but is not limited thereto.

As described above, the hole transport region HTR may further include at least one of a buffer layer (not shown) or an electron blocking layer EBL, in addition to the hole injection layer HIL and the hole transport layer HTL. The buffer layer (not shown) may compensate for a resonance distance according to a wavelength of light emitted from an emission layer EML, and may thus increase luminous efficiency. Materials which may be included in the hole transport region HTR may be used as materials included in the buffer layer (not shown). The electron blocking layer EBL is a layer that may prevent electrons from being injected from the electron transport region ETR to the hole transport region HTR.

The emission layer EML is provided on the hole transport region HTR. The emission layer EML may have, for example, a thickness in a range of about 100 Å to about 1,000 Å. For example, the emission layer EML may have a thickness in a range of about 100 Å to about 300 Å. The emission layer EML may be a layer formed of a single material, a layer formed of different materials, or a multi-layer structure having layers formed of different materials.

The light emitting diode ED according to an embodiment may include a polycyclic compound of an embodiment in the emission layer EML. The polycyclic compound of an embodiment may be represented by Formula 1 below.

[Formula 1]

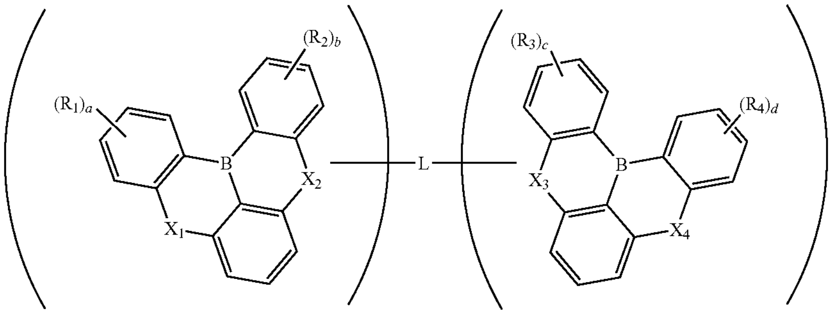

In Formula 1, $X_1$ to $X_4$ may each independently be $B(R_a)$, $N(R_b)$, $C(R_c)(R_d)$, O, S, or Se. In Formula 1, $R_a$ to $R_d$ may each independently be a hydrogen atom, a deuterium atom, a halogen atom, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms.

In an embodiment, $X_1$ to $X_4$ may be the same. However, embodiments are not limited thereto, and at least one of $X_1$ to $X_4$ may be different from the others.

In an embodiment, $R_a$ to $R_d$ may each independently be a substituted or unsubstituted phenyl group, a substituted or unsubstituted biphenyl group, etc. However, embodiments are not limited thereto.

In Formula 1, a to d may each independently be an integer from 0 to 4, and $R_1$ to $R_4$ may be each independently a hydrogen atom, a deuterium atom, a halogen atom, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, When a to d are 1 or greater, $R_1$ to $R_4$ may each independently be a t-butyl group, a substituted or unsubstituted phenyl group, or a substituted or unsubstituted biphenyl group. For example, in an embodiment, $R_1$ to $R_4$ may each independently be a t-butyl group, a substituted or unsubstituted phenyl group, or a substituted or unsubstituted biphenyl group. However, embodiments are not limited thereto.

In Formula 1, L may be a substituted or unsubstituted divalent triptycene, or a substituted or unsubstituted divalent carborane. For example, L may be an unsubstituted divalent triptycene group or an unsubstituted divalent carborane group.

In Formula 1, L may be a group represented by any one of L-1 to L-4 below.

L-1

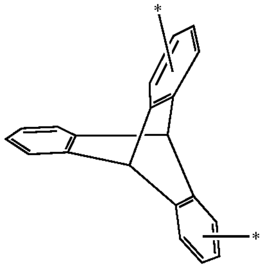

L-2

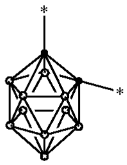

L-3

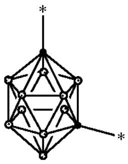

L-4

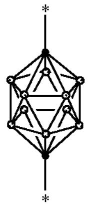

L-2 to L-4 each represent a divalent carborane group, and in L-2 to L-4, “⊙” is BH, and “●” represents a ring-forming atom of C. L-2 represents ortho-carborane, L-3 represents meta-carborane, and L-4 represents para-carborane.

For example, the polycyclic compound according to an embodiment may have a compound skeleton structure in the form of a dimer connected through a bulky linker. The polycyclic compound of an embodiment may have a structure in which two DABNA derivatives containing boron (B) atoms are connected through a linker. In an embodiment, the two DABNA derivatives connected through a linker may be symmetrical with respect to the linker. However, embodiments are not limited thereto.

The polycyclic compound of an embodiment in the form of a dimer connected through a linker prevents aggregation between adjacent polycyclic compounds, thereby improving film formation quality when an organic layer of a light emitting diode is formed. The polycyclic compound of an embodiment may be used together with an auxiliary dopant which serves as an energy transfer agent to increase Forster energy transfer and to prevent Dexter energy transfer, resulting in extended lifespan and increased efficiency of a light emitting diode including the polycyclic compound of an embodiment in an emission layer.

The polycyclic compound of an embodiment represented by Formula 1 may be represented by Formula 1-1 below.

[Formula 1-1]

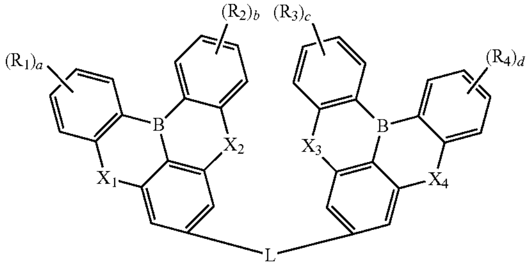

In Formula 1-1 above, $X_1$ to $X_4$, a to d, $R_1$ to $R_4$, and L may each be the same as defined in Formula 1. For example, the polycyclic compound of an embodiment may include divalent triptycene or divalent carborane as linkers, and may be linked to each other through a linker at para-positions opposite to a boron atom of a polycyclic derivative referred to as a DABNA derivative. The two DABNA derivatives connected through linker L may have a same structure. However, embodiments are not limited thereto.

The polycyclic compound of an embodiment represented by Formula 1 may be any one selected from Compound Group 1 below. The light emitting diode ED of an embodiment may include at least one polycyclic compound selected from Compound Group 1 below in the emission layer EML.

[Compound Group 1]

1

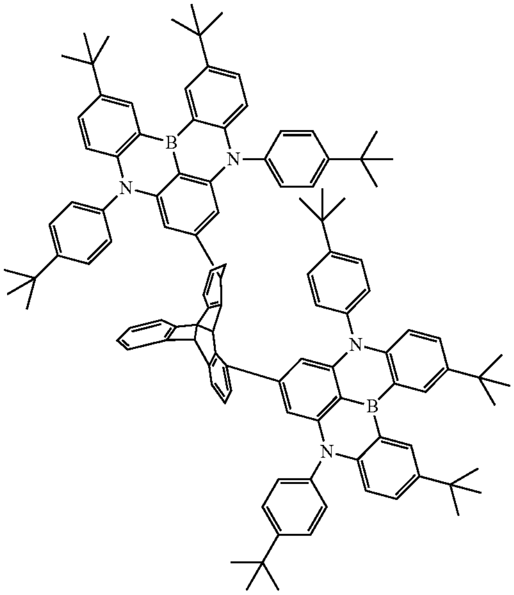

-continued
2
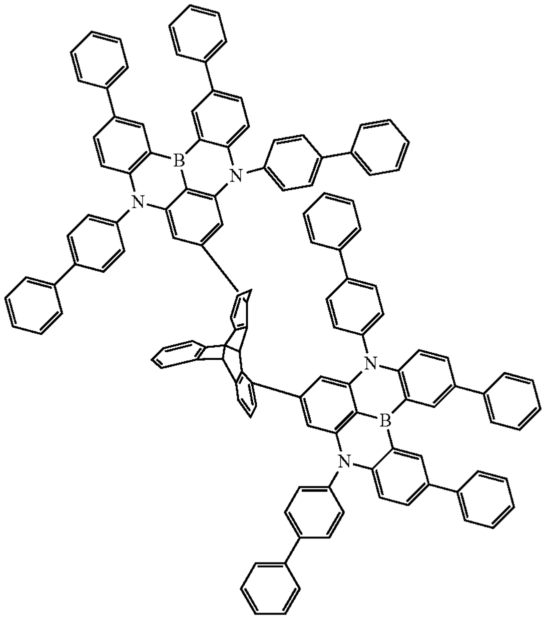
3
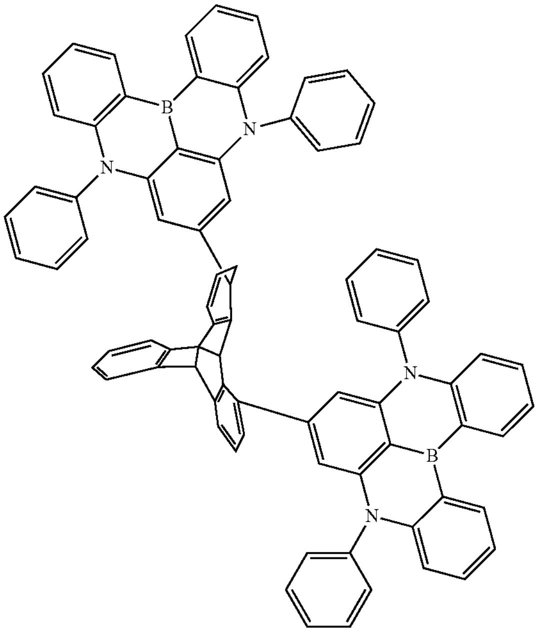
-continued
4
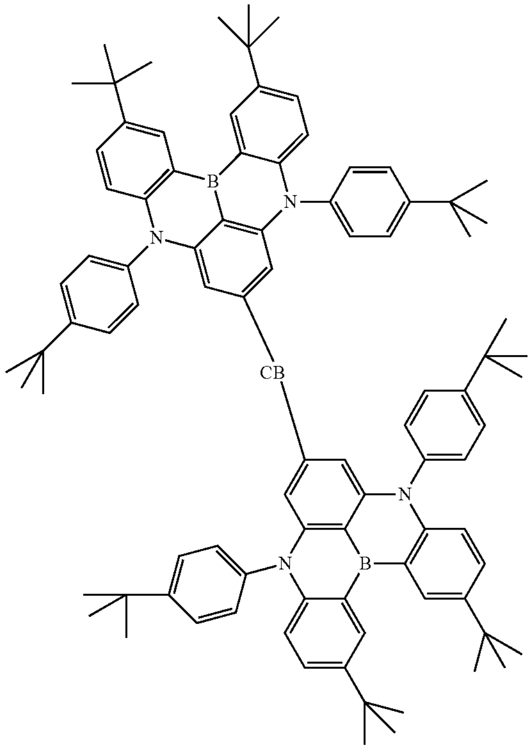
5
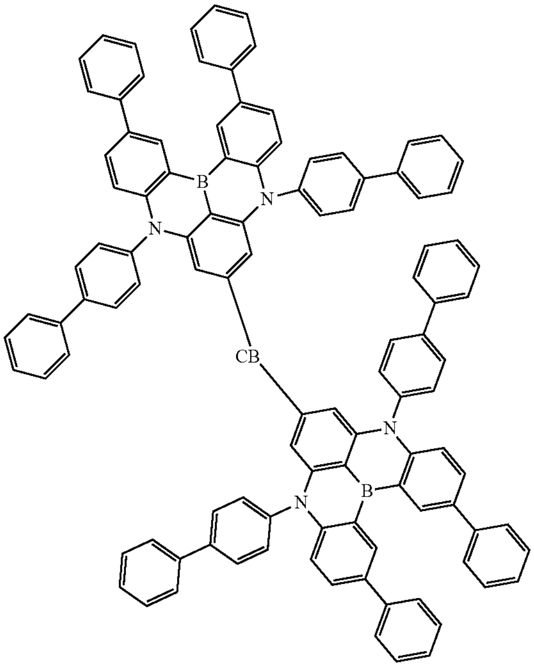

-continued

6

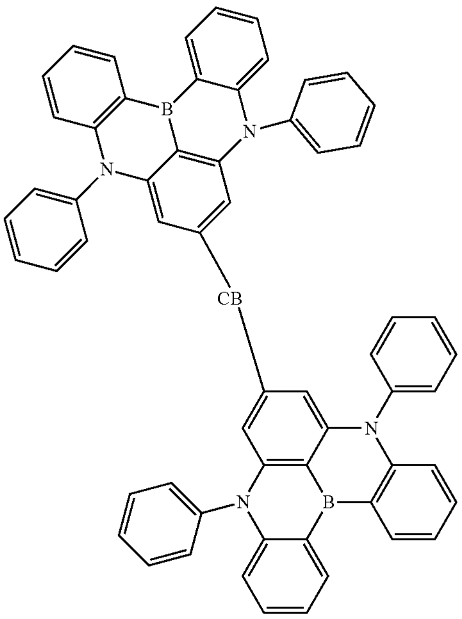

In Compounds 4 to 6 of Compound Group 1, "CB" represents a divalent carborane group. For example, in Compounds 4 to 6, "CB" may be represented by any one among L-2 to L-4 described above. In an embodiment, in Compounds 4 to 6, "CB" may have a structure of L-3 as described above.

The polycyclic compound of an embodiment represented by Formula 1 may be used as a fluorescent light emitting material or a thermally activated delayed fluorescence (TADF) material. For example, the polycyclic compound of an embodiment may be used as a light emitting dopant emitting blue light. In an embodiment, the polycyclic compound of an embodiment may be used as a TADF dopant material.

The polycyclic compound of an embodiment may be a light emitting material having a central light emitting wavelength (max) equal to or less than about 490 nm. For example, in an embodiment, the polycyclic compound of an embodiment represented by Formula 1 may be a light emitting material having a central light emitting wavelength in a range of about 450 nm to about 470 nm. For example, the polycyclic compound of an embodiment may be a blue thermally activated delayed fluorescent dopant. However, embodiments are not limited thereto.

In the light emitting diode ED of the embodiment shown in FIGS. 3 to 6, the emission layer EML may include a host and a dopant, and the emission layer EML may include the polycyclic compound of an embodiment described above as a dopant. In an embodiment, the dopant may include the polycyclic compound of an embodiment.

In the light emitting diode ED of an embodiment, the emission layer EML may include a first host, a second host, an auxiliary dopant, and a light emitting dopant. In an embodiment, the first host and the second host may be different from each other. In an embodiment, the auxiliary dopant may include an organometallic complex. In an embodiment, the light emitting dopant may include the polycyclic compound of an embodiment represented by Formula 1 described above.

In an embodiment, the first host may be a hole transporting host, and the second host may be an electron transporting host. The first host of the emission layer EML of an embodiment may include at least one selected from HT-01 to HT-09 below.

HT-01

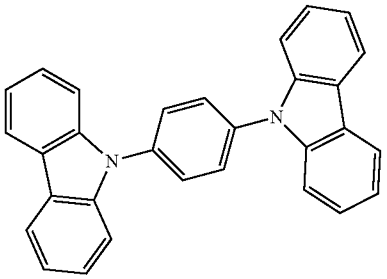

HT-02

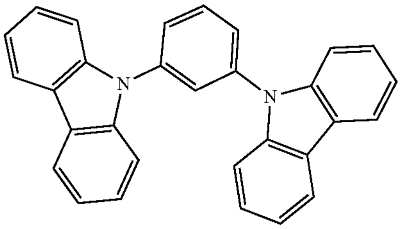

HT-03

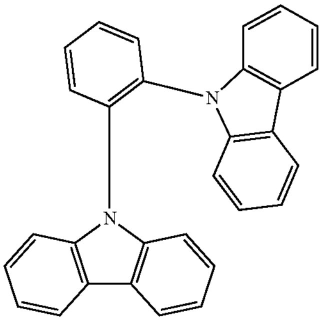

HT-04

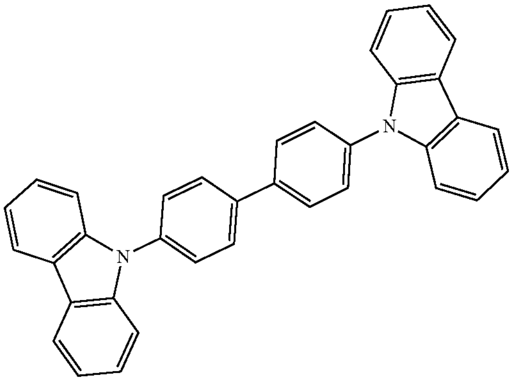

-continued
HT-05
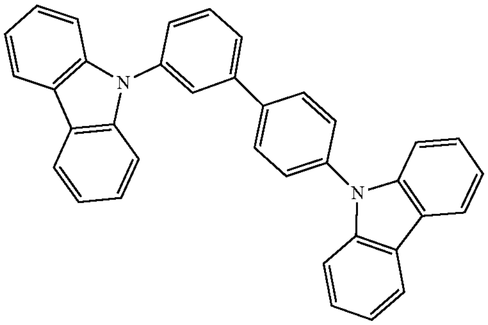
HT-06
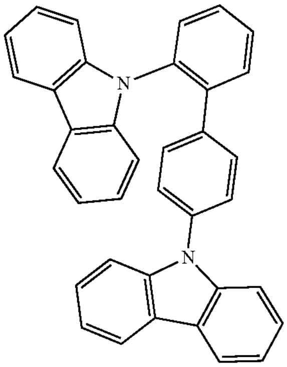
HT-07
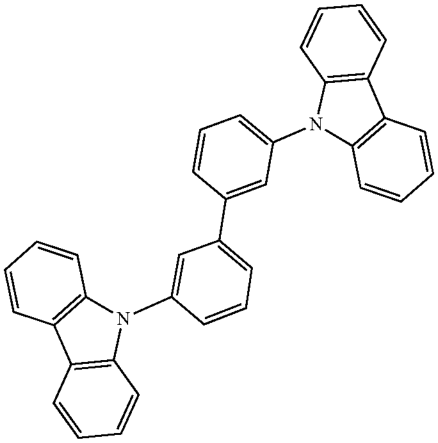
HT-08
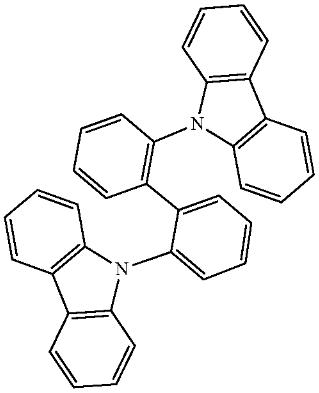
-continued
HT-09
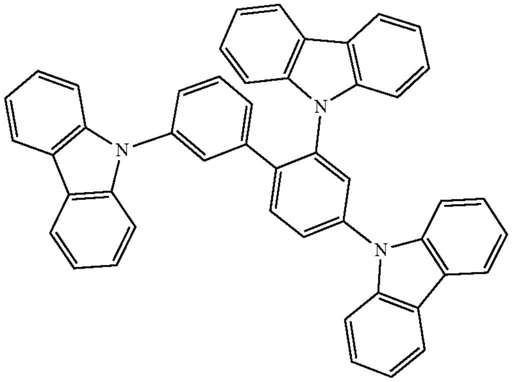
The second host of the emission layer EML of an embodiment may include at least one selected from ET-01 to ET-06 below.
ET-01
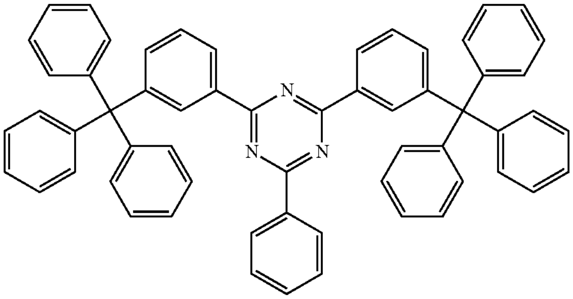
ET-02
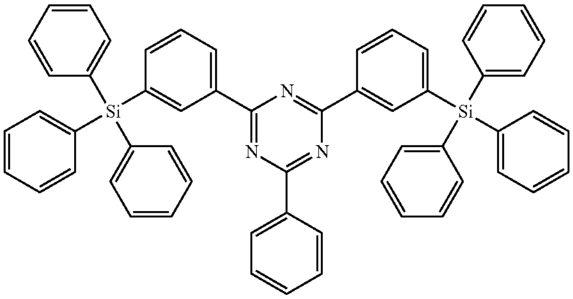
ET-03
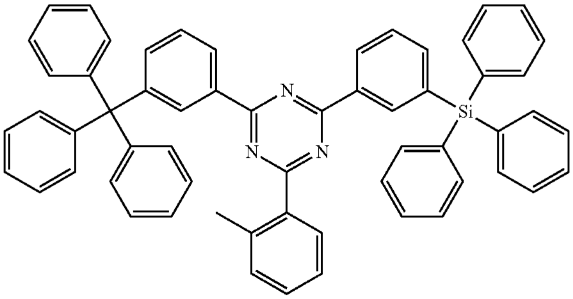

-continued

ET-04

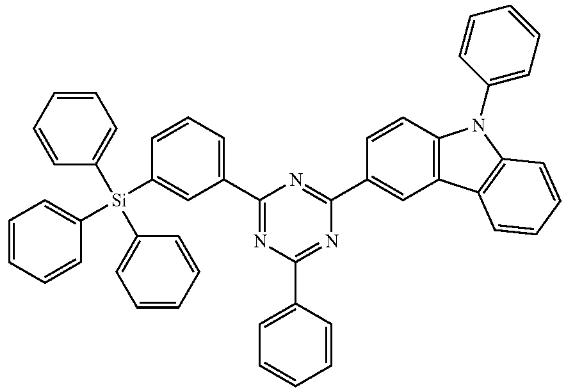

ET-05

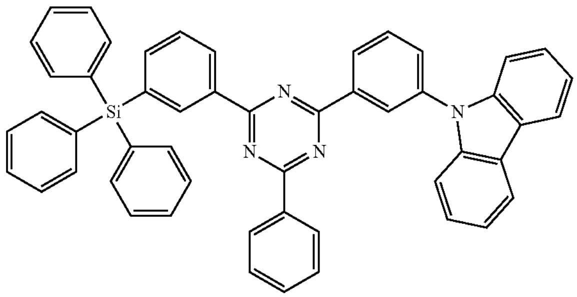

ET-06

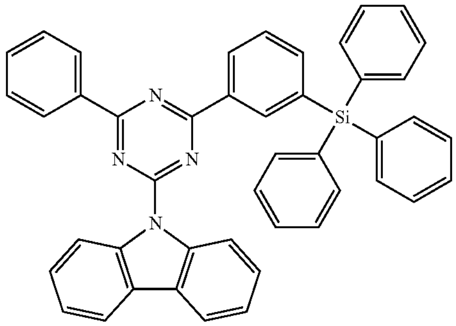

In the light emitting diode ED of an embodiment, the emission layer EML may include an organometallic complex. For example, in the light emitting diode ED of an embodiment, the emission layer EML may include an auxiliary dopant including an organometallic complex. In an embodiment, the auxiliary dopant included in the emission layer EML may be referred to as a phosphorescent sensitizer. In the light emitting diode ED of an embodiment, the phosphorescent sensitizer included in the emission layer EML may transfer energy to the light emitting dopant to increase fluorescence emission rates of the light emitting dopant.

In the light emitting diode ED, the auxiliary dopant of the emission layer EML of an embodiment may include at least one selected from Compound Group P.

[Compound Group P]

1

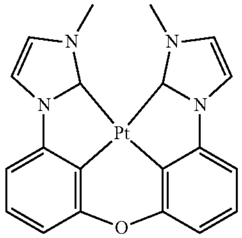

2

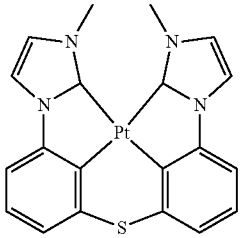

3

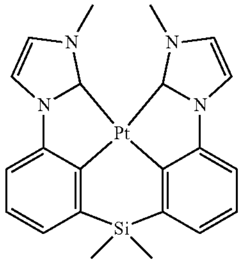

4

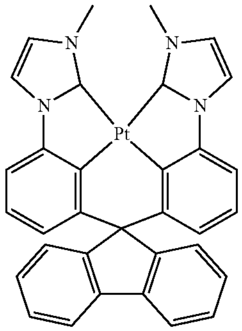

5

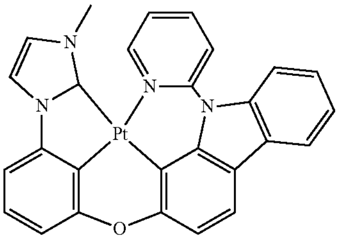

6

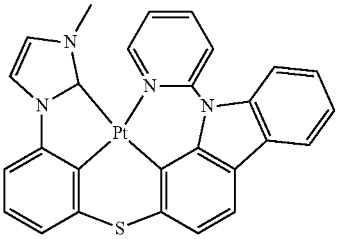

-continued

7

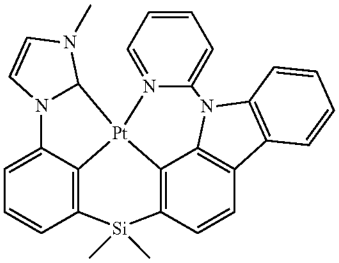

8

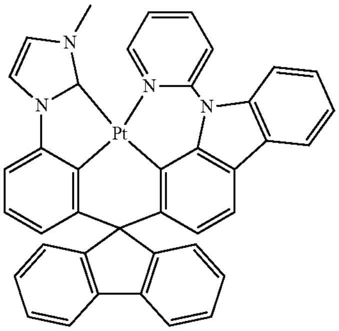

9

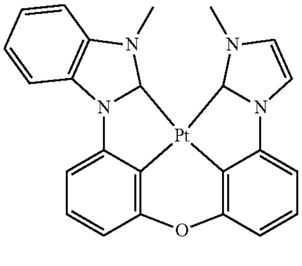

10

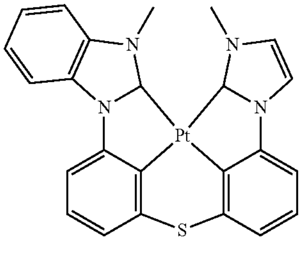

11

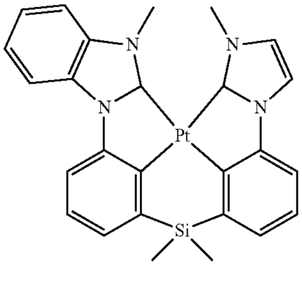

-continued

12

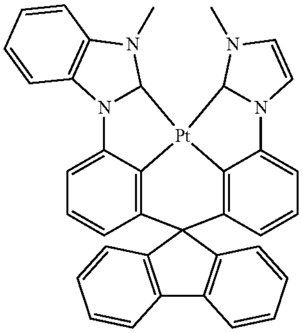

13

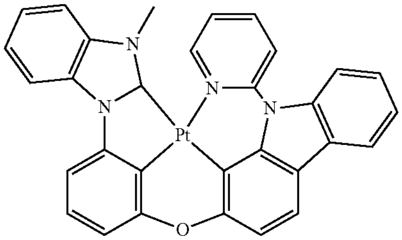

14

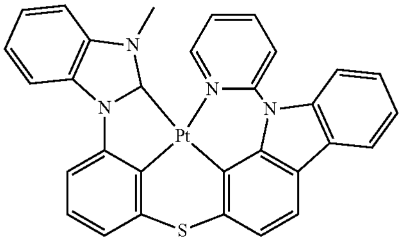

15

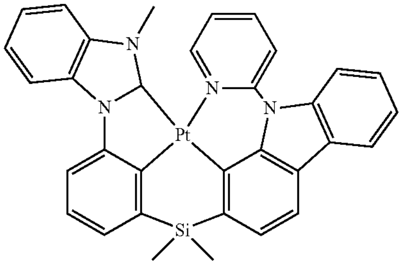

16

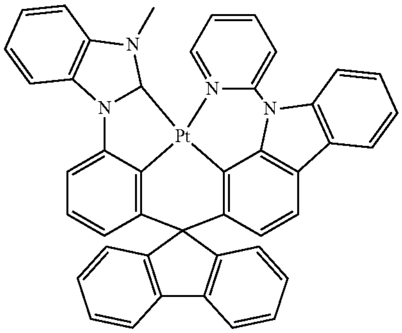

However, embodiments are not limited thereto, and in another embodiment, the light emitting diode ED may include a phosphorescent dopant material including an organometallic complex as an auxiliary dopant.

The light emitting diode ED of an embodiment includes the emission layer including the first host and the second host as described above, the auxiliary dopant including an organometallic complex, and the light emitting dopant including the polycyclic compound of an embodiment described above, and may thus exhibit excellent device lifespan and improved luminous efficiency characteristics.

The light emitting diode ED of an embodiment may further include emission layer materials below in addition to the polycyclic compound of an embodiment described above, the first host and the second host described above, and the auxiliary dopant material. In the light emitting diode ED of an embodiment, the emission layer EML may include an anthracene derivative, a pyrene derivative, a fluoranthene derivative, a chrysene derivative, a dihydrobenzanthracene derivative, or a triphenylene derivative. For example, in an embodiment, the emission layer EML may include an anthracene derivative or a pyrene derivative.

In the light emitting diode ED of an embodiment shown in FIGS. 3 to 6, the emission layer EML may include a host and a dopant, and the emission layer EML may include a compound represented by Formula E-1 below. The compound represented by Formula E-1 below may be included as a fluorescent host material.

[Formula E-1]

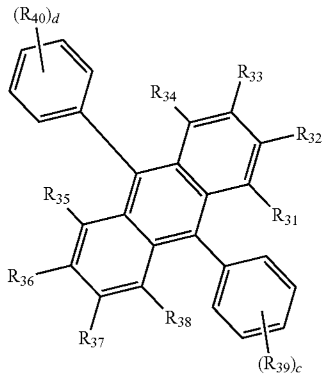

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring. In Formula E-1, $R_{31}$ to $R_{40}$ may be bonded to an adjacent group to form a saturated hydrocarbon ring, an unsaturated hydrocarbon ring, a saturated heterocycle, or an unsaturated heterocycle.

In Formula E-1, c and d may each independently be an integer from 0 to 5.

The compound represented by Formula E-1 may be any one selected from Compounds E1 to E19 below.

E1

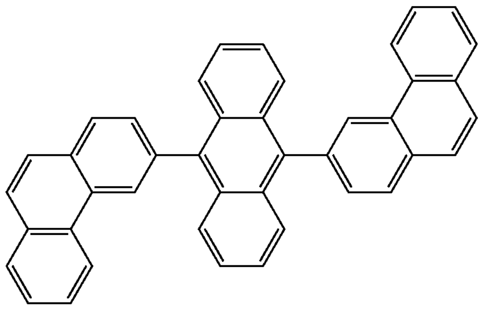

E2

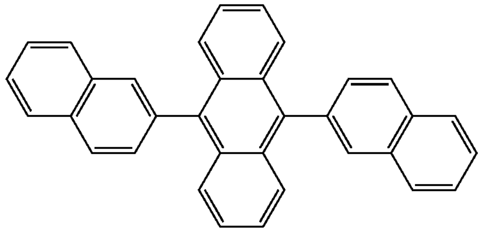

E3

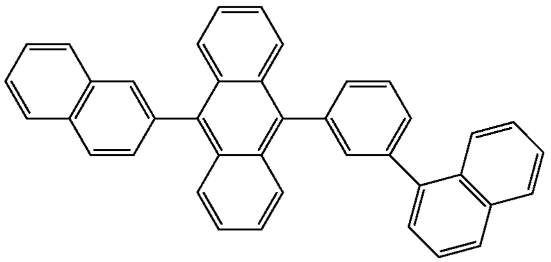

E4

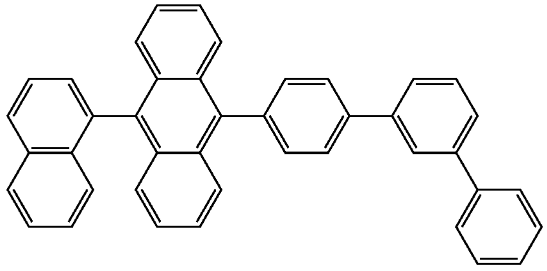

E5

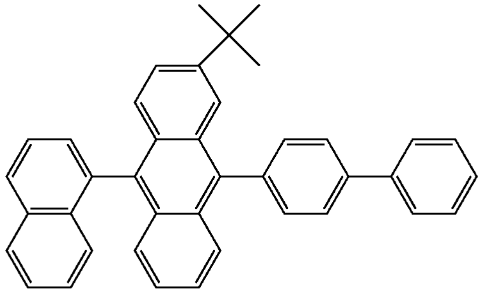

-continued
E6
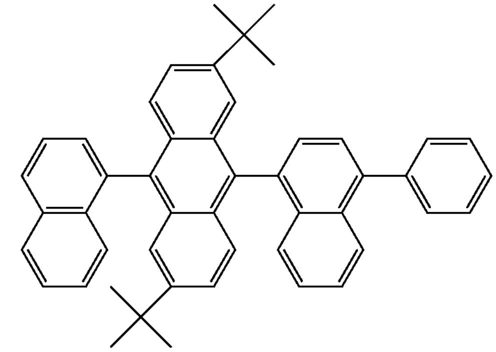
E7
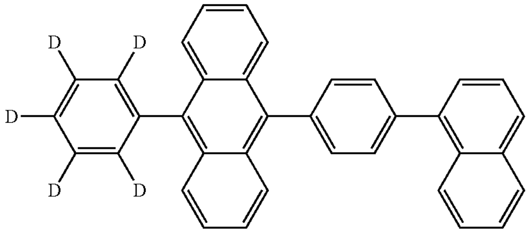
E8
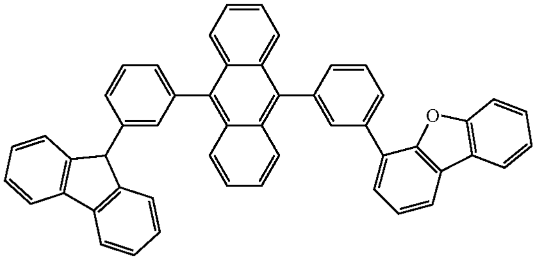
E9
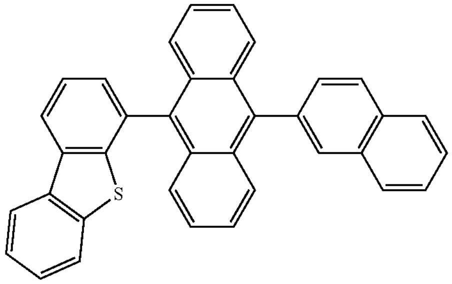
E10
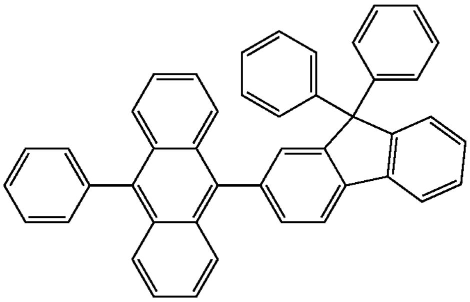
-continued
E11
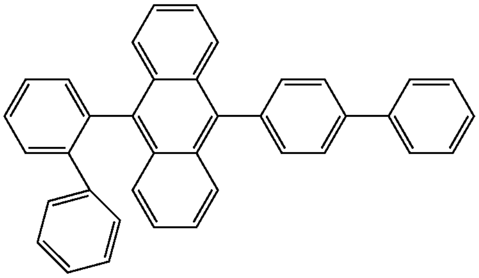
E12
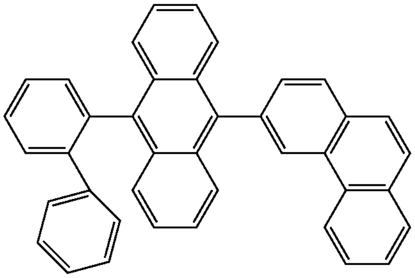
E13
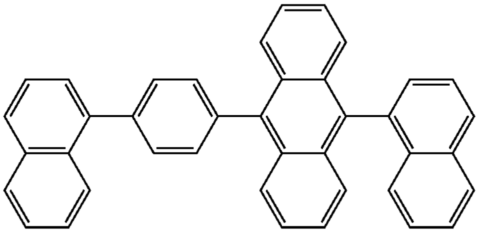
E14
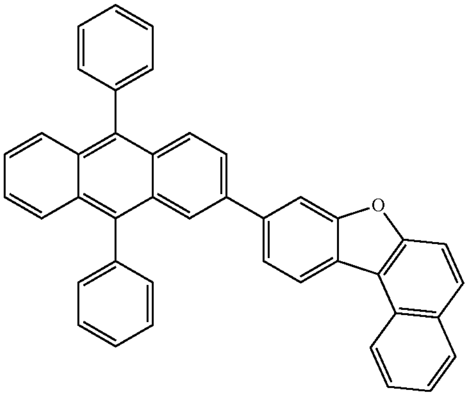

-continued

E15

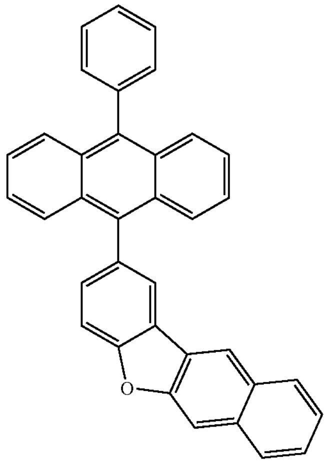

E16

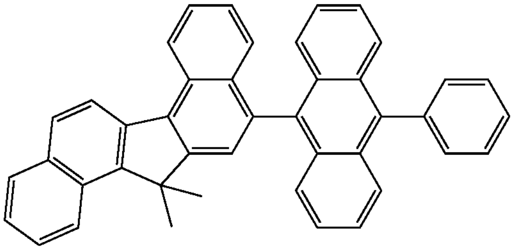

E17

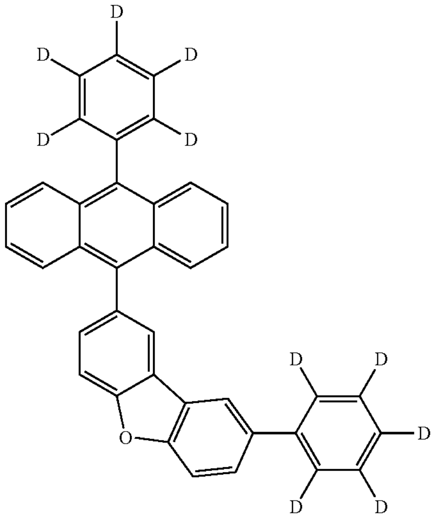

E18

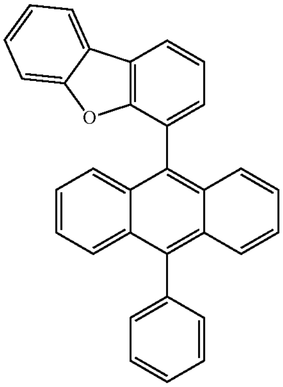

-continued

E19

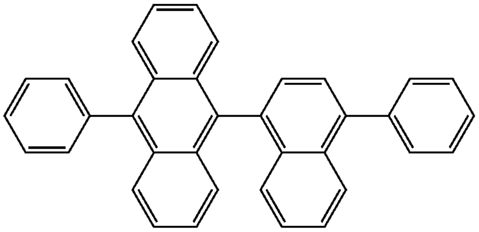

In an embodiment, the emission layer EML may include a compound represented by Formula E-2a or Formula E-2b below. The compound represented by Formula E-2a or Formula E-2b below may be used as a phosphorescent host material.

[Formula E-2a]

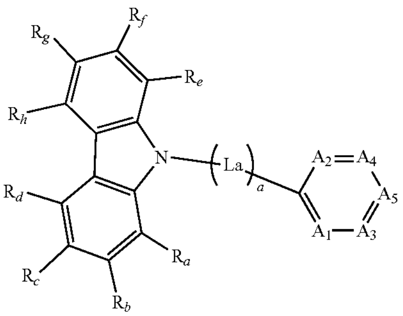

In Formula E-2a, a may be an integer from 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. When a is 2 or greater, multiple $L_a$ groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

$$(Cbz1) \frac{}{\quad} (L_b)_b \frac{}{\quad} (Cbz2)$$

In Formula E-2b, Cbz1 and Cbz2 may each independently be an unsubstituted carbazole group or carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10, and when b is 2 or greater, multiple $L_b$ groups may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be any one selected from Compound Group E-2 below. However, the compounds listed in Compound Group E-2 below are presented as examples, and the compound represented by Formula E-2a or Formula E-2b is not limited to those listed in Compound Group E-2 below.

[Compound Group E-2]

E-2-1

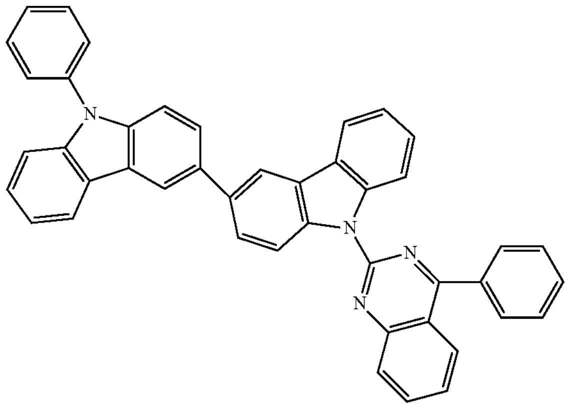

E-2-2

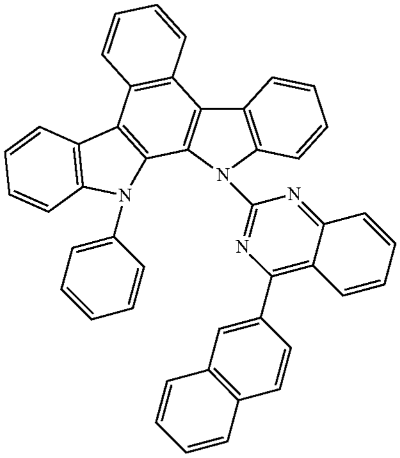

-continued

E-2-3

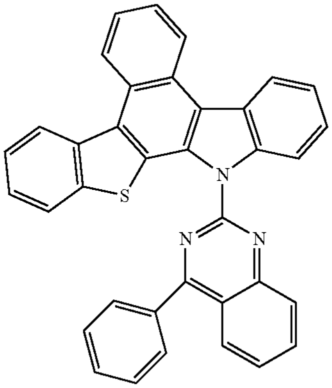

E-2-4

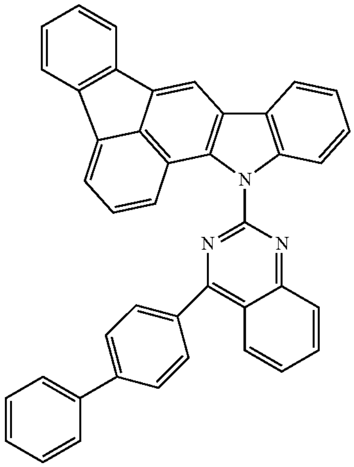

E-2-5

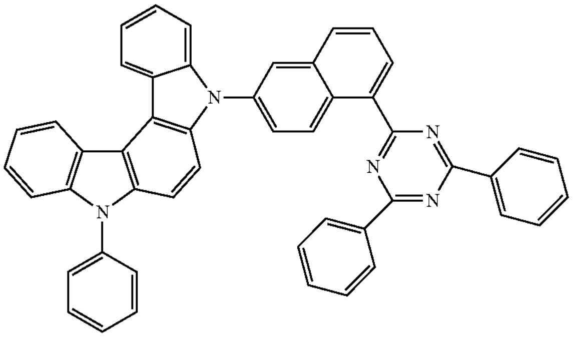

-continued
E-2-6
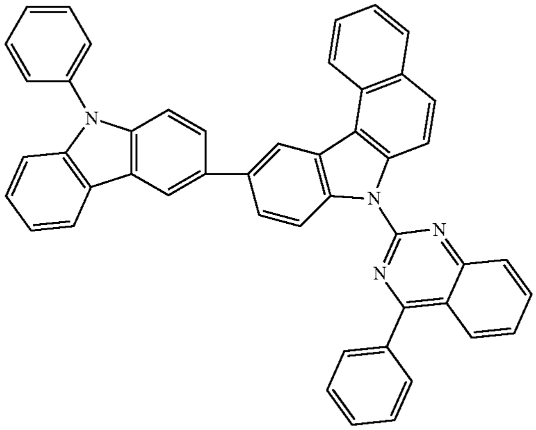
E-2-7
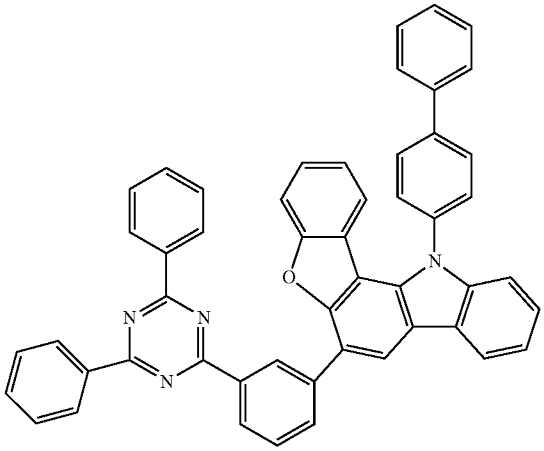
E-2-8
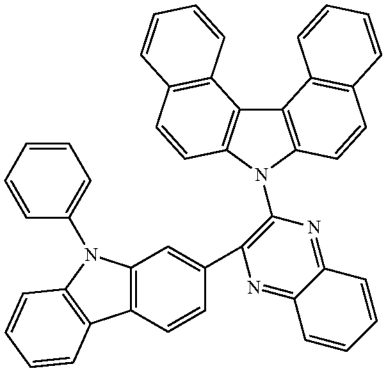
-continued
E-2-9
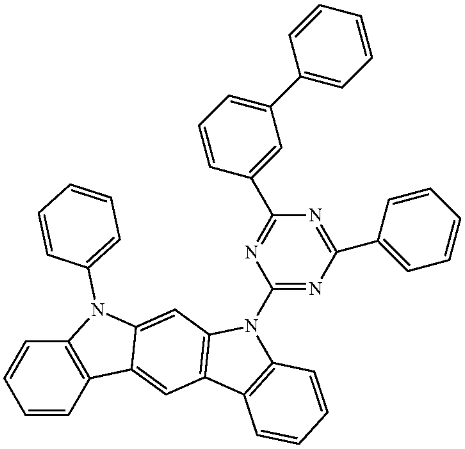
E-2-10
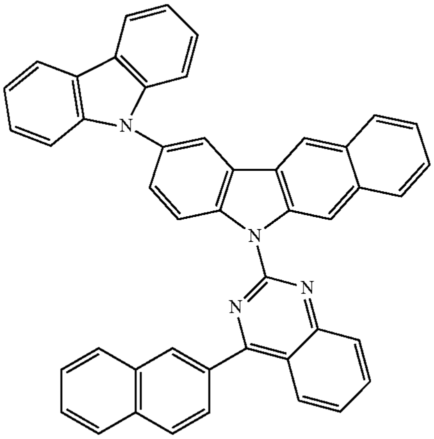
E-2-11
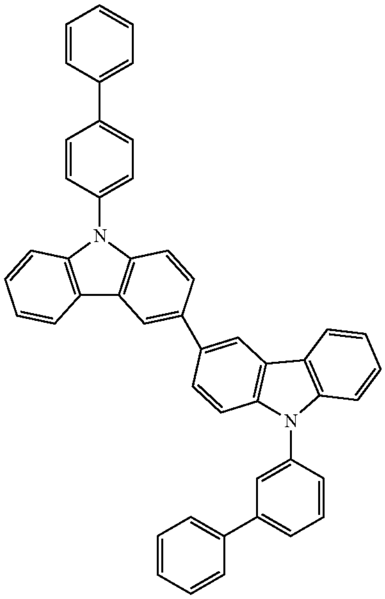

-continued
E-2-12
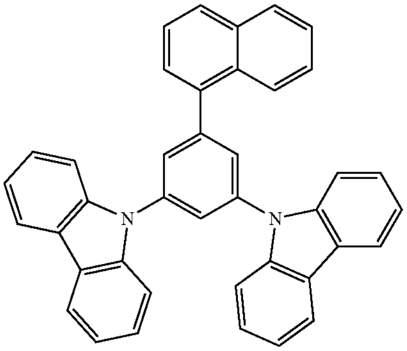
E-2-13
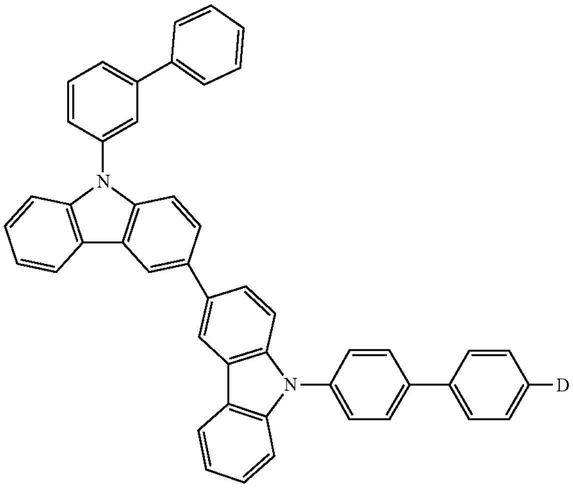
E-2-14
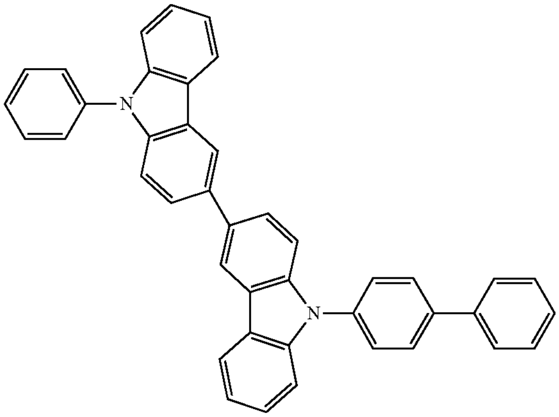
-continued
E-2-15
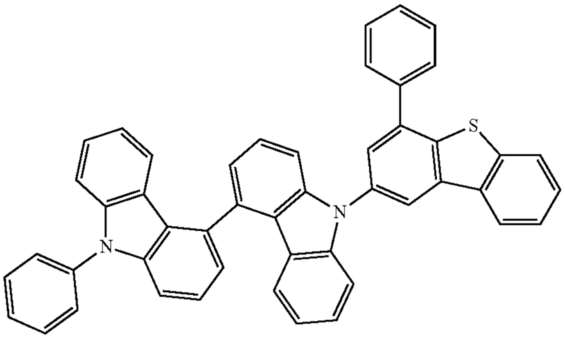
E-2-16
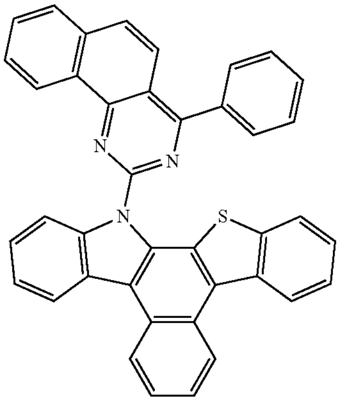
E-2-17
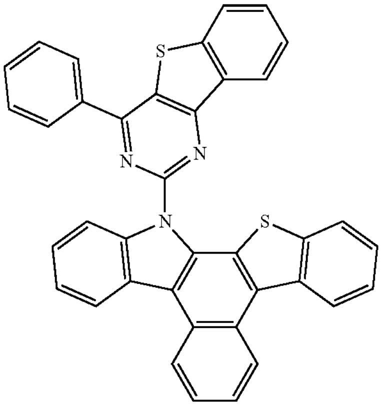
E-2-18
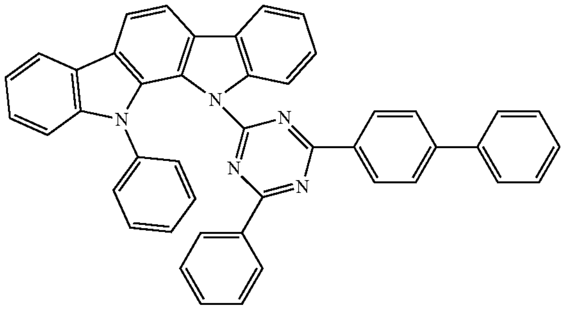

-continued

E-2-19

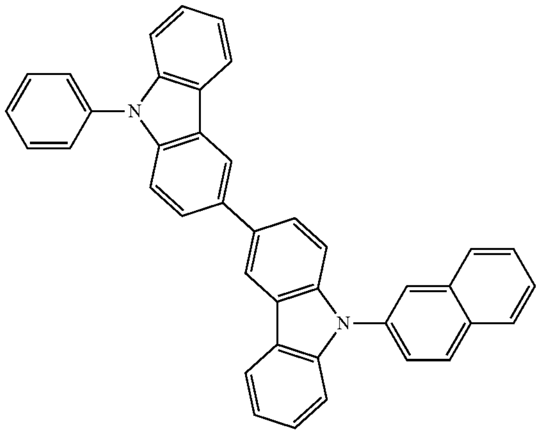

E-2-20

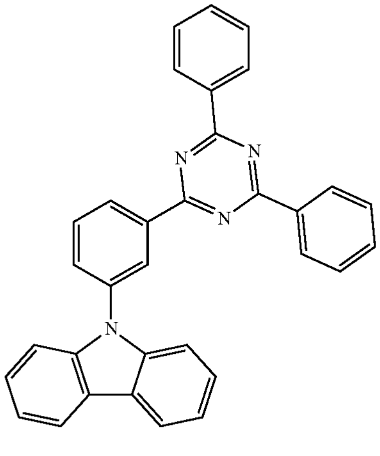

E-2-21

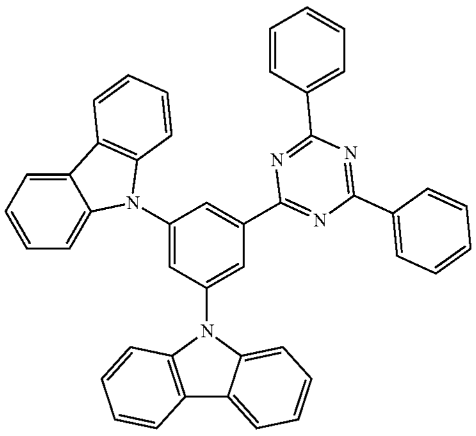

E-2-22

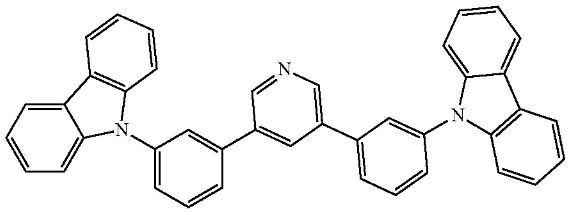

-continued

E-2-23

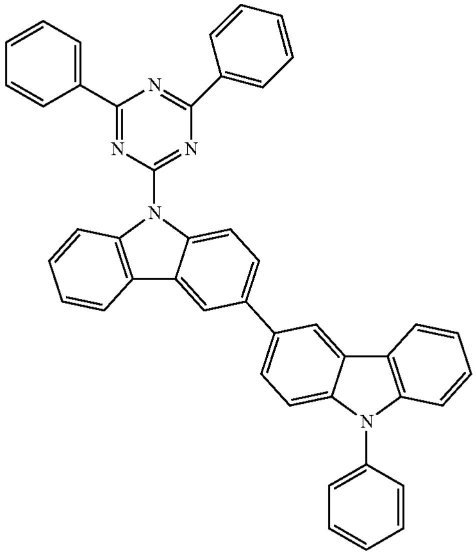

The emission layer EML may further include a general material in the art as a host material. For example, the emission layer EML may include, as a host material, at least one among bis[2-(diphenylphosphino)phenyl]ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzofuran (PPF), 4,4',4"-tris(carbazol-9-yl)-triphenylamine (TCTA), and 1,3,5-tris(1-phenyl-1H-benzo[d]imidazol-2-yl)benzene (TPBi). However, embodiments are not limited thereto, and for example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), etc. may be used as a host material.

The emission layer EML may include a compound represented by Formula M-a or Formula M-b below. The compound represented by Formula M-a or Formula M-b below may be used as a phosphorescent dopant material. In an embodiment, the compound represented by Formula M-a or Formula M-b may be used an auxiliary dopant material.

[Formula M-a]

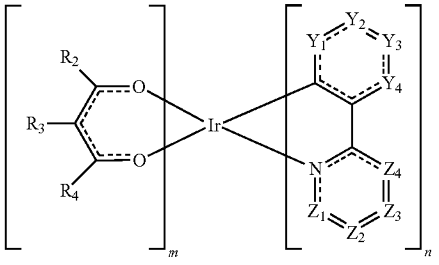

In Formula M-a above, Y1 to Y4 and Z1 to Z4 may each independently be $C(R_1)$ or N, and $R_1$ to $R^4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a phosphorescent dopant.

The compound represented by Formula M-a may be any one selected from Compounds M-a1 to M-a25 below. However, Compounds M-a1 to M-a25 are presented below as examples, and the compound represented by Formula M-a is not limited to Compounds M-a1 to M-a25.

M-a1

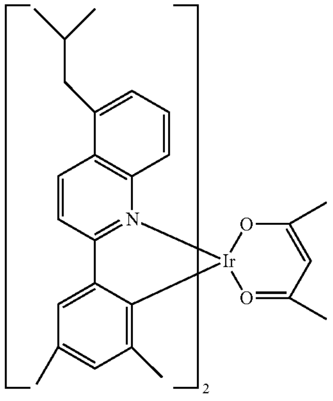

M-a2

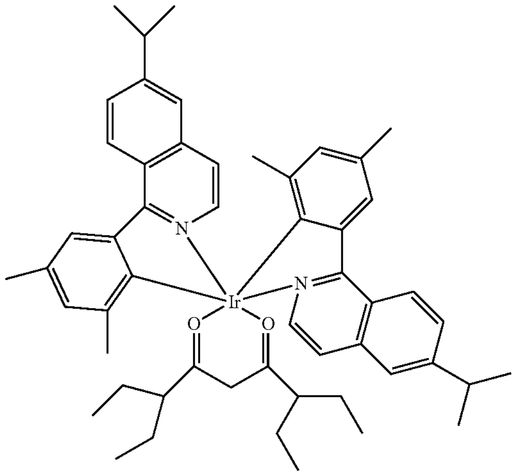

-continued

M-a3

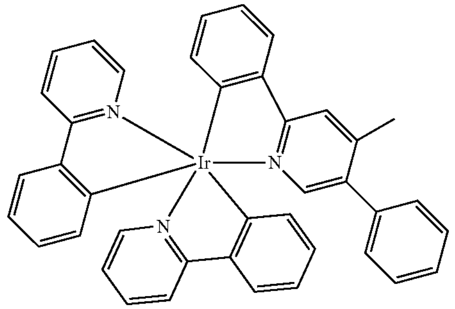

M-a4

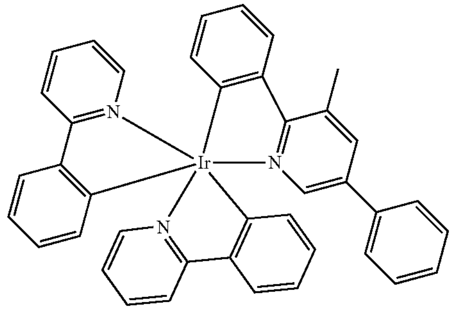

M-a5

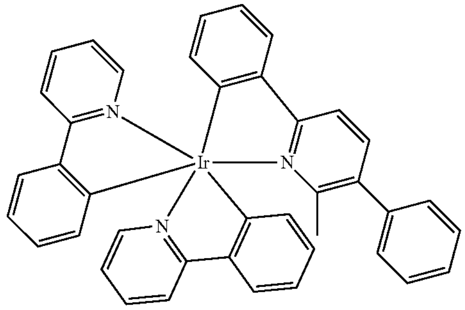

M-a6

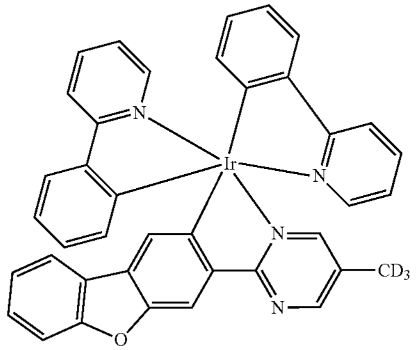

-continued
M-a7
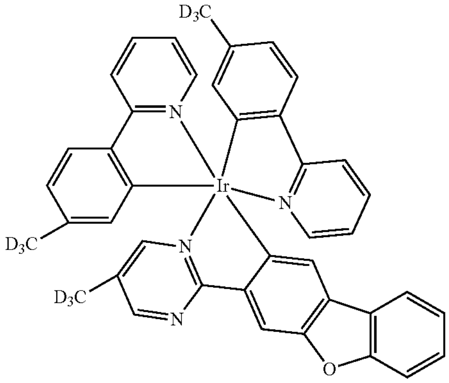
M-a8
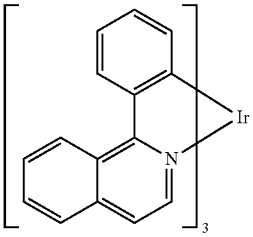
M-a9
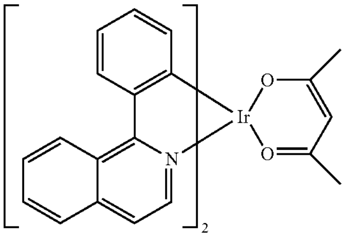
M-a10
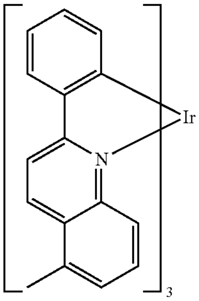
M-a11
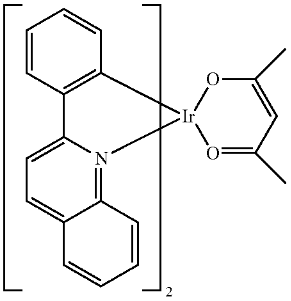
-continued
M-a12
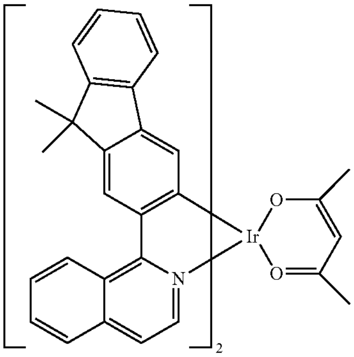
M-a13
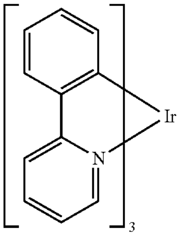
M-a14
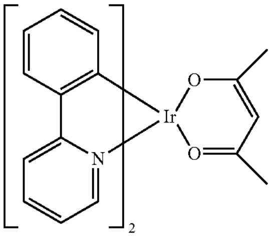
M-a15
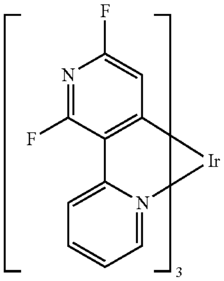
M-a16
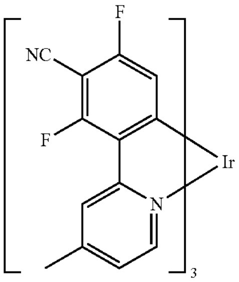

-continued
M-a17
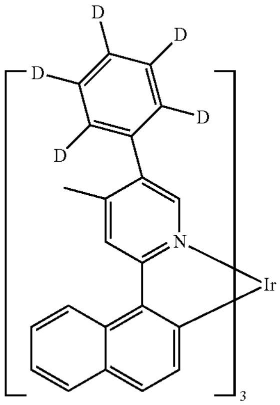
M-a18
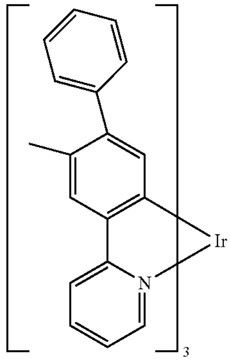
M-a19
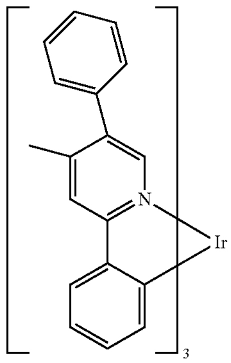
M-a20
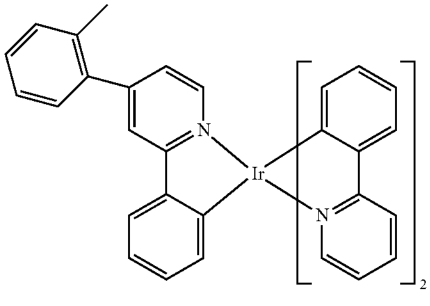
-continued
M-a21
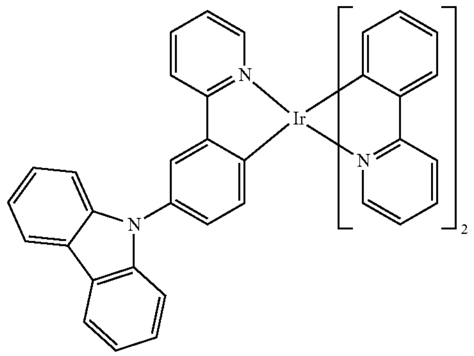
M-a22
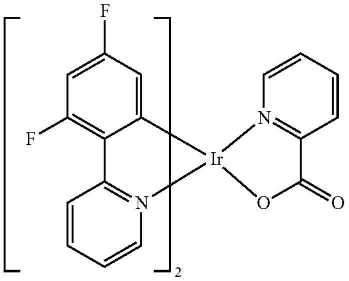
M-a23
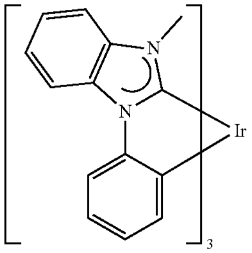
M-a24
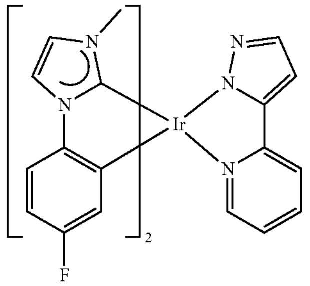
M-a25
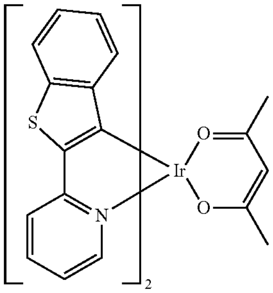
Compound M-a1 and Compound M-a2 may be used as a red dopant material, and Compounds M-a3 to M-a25 may be used as a green dopant material.

[Formula M-b]

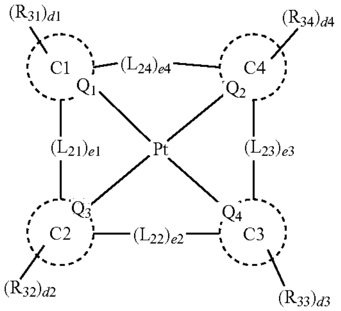

In Formula M-b, $Q_1$ to $Q_4$ may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage,

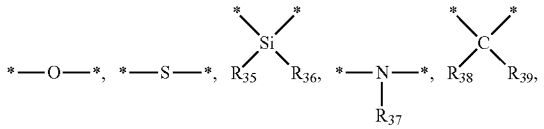

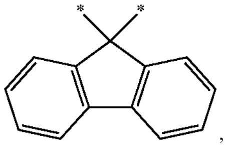

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring, and d1 to d4 may each independently be an integer from 0 to 4.

The compound represented by Formula M-b may be used as a blue phosphorescent dopant or as a green phosphorescent dopant. In an embodiment, the compound represented by Formula M-b may be further included as an auxiliary dopant in the emission layer EML.

The compound represented by Formula M-b may be any one selected from Compounds M-b-1 to M-b-12. However, the compounds below are presented as examples, and the compound represented by Formula M-b is not limited to Compounds M-b-1 to M-b-12.

M-b-1

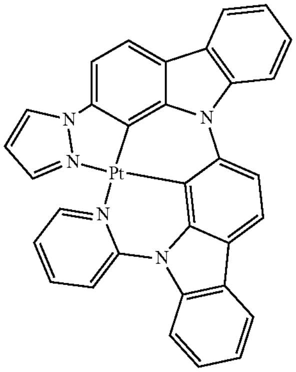

M-b-2

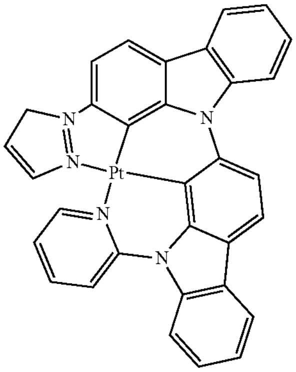

M-b-3

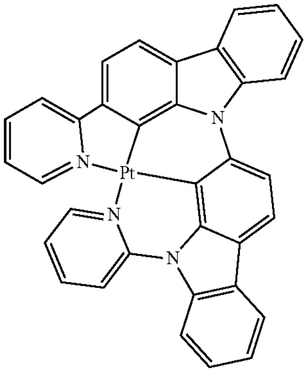

M-b-4

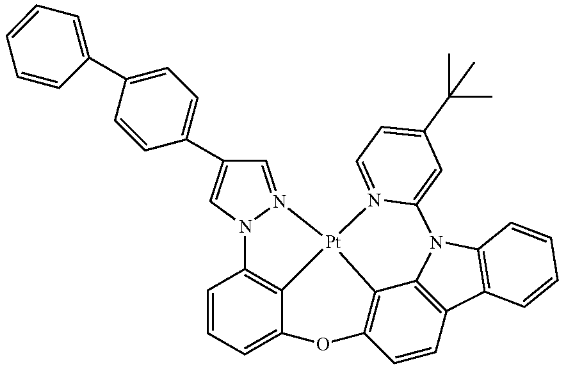

-continued

M-b-5

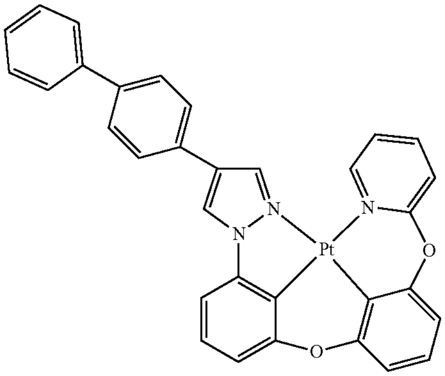

M-b-6

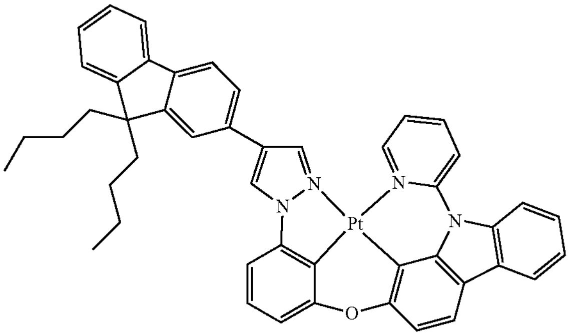

M-b-7

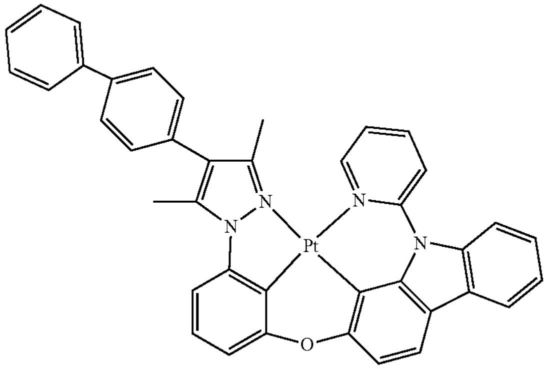

M-b-8

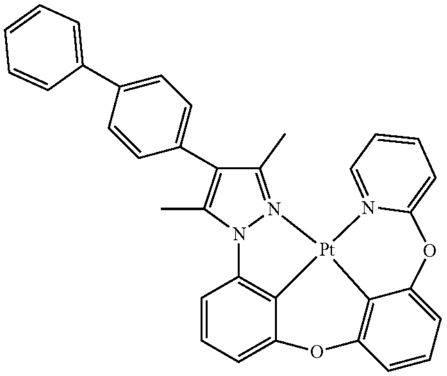

-continued

M-b-9

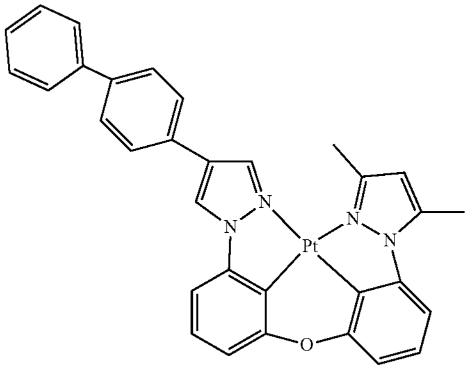

M-b-10

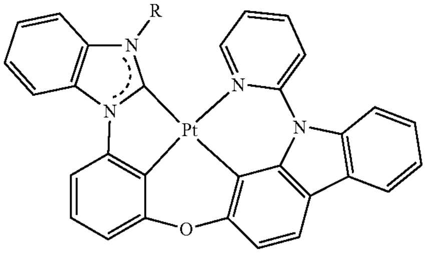

M-b-11

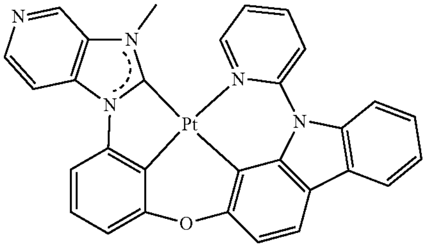

M-b-12

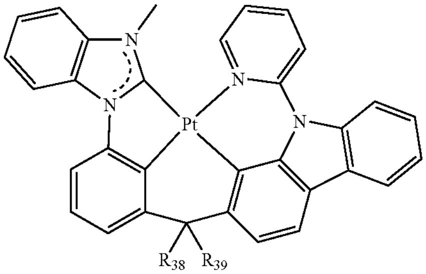

In Compounds M-b-1 to M-b-12, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may further include a compound represented by any one of Formulas F-a to F-c below. The compounds represented by Formulas F-a to F-c below may be used as a fluorescent dopant material.

[Formula F-a]

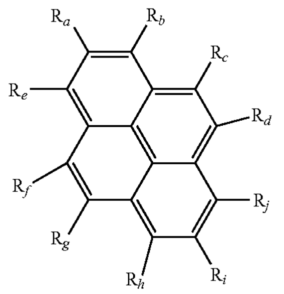

In Formula F-a above, two selected from $R_a$ to $R_j$ may each independently be substituted with *—$NAr_1Ar_2$. The remainder of $R_a$ to $R_j$ which are not substituted with *—$NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In the group *—$NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

[Formula F-b]

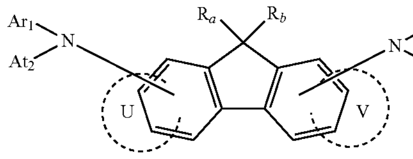

In Formula F-b above, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, when the number of U or Vis 1, a condensed ring may be present at the position indicated by U or V, and when the number of U or V is 0, a ring may not be present at the position indicated by U or V. When the number of U is 0 and the number of V is 1, or when the number of U is 1 and the number of V is 0, a condensed ring having a fluorene core of Formula F-b may be a cyclic compound having four rings. When both U and V are 0, the condensed ring of Formula F-b may be a cyclic compound having three rings. When both U and V are 1, the condensed ring having a fluorene core of Formula F-b may be a cyclic compound having five rings.

[Formula F-c]

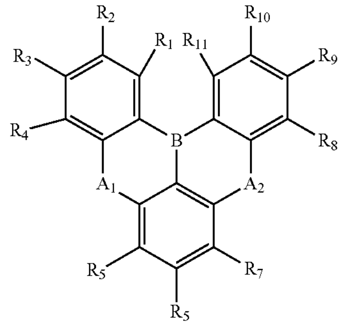

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or may be bonded to an adjacent group to form a ring.

In Formula F-c, $A_1$ and $A_2$ may each independently be bonded to substituents of neighboring rings to form a condensed ring. For example, when $A_1$ and $A_2$ are each independently $N(R_m)$, $A_1$ may be bonded to $R_4$ or $R_5$ to form a ring. For example, $A_2$ may be bonded to $R_7$ or $R_8$ to form a ring.

The emission layer EML may include, as a dopant material, styryl derivatives (e.g., 1,4-bis[2-(3-N-ethylcarbazoryl) vinyl]benzene (BCzVB), 4-(di-p-tolylamino)-4"-[(di-p-tolylamino)styryl]stilbene (DPAVB), and N-(4-((E)-2-(6-((E)-4-(diphenylamino)styryl)naphthalen-2-yl) vinyl)phenyl)-N-phenylbenzenamine (N-BDAVBi)), perylene and derivatives thereof (e.g., 2,5,8,11-tetra-t-butylperylene (TBP)), pyrene and derivatives thereof (e.g., 1,1-dipyrene, 1,4-dipyrenylbenzene, 1,4-bis(N,N-diphenylamino)pyrene), etc.

In an embodiment, when multiple emission layers EML are included, at least one emission layer EML may include a phosphorescent dopant material. For example, as a phosphorescent dopant, a metal complex including iridium (Ir), platinum (Pt), osmium (Os), gold (Au), titanium (Ti), zirconium (Zr), hafnium (Hf), europium (Eu), and terbium (Tb), or thulium (Tm) may be used. For example, iridium (III) bis(4,6-difluorophenylpyridinato-N,C2'), (FIrpic), bis (2,4-difluorophenylpyridinato)-tetrakis(1-pyrazolyl) borate iridium (III) (Fir6), platinum octaethyl porphyrin (PtOEP), etc. may be used as a phosphorescent dopant. However, embodiments are not limited thereto.

At least one emission layer EML may include a quantum dot material. The quantum dot may be a Group II-VI compound, a Group III-VI compound, a Group I-III-VI compound, a Group III-V compound, a Group III-II-V compound, a Group IV-VI compound, a Group IV element, a Group IV compound, or a combination thereof.

The Group II-VI compound may be a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof; or any combination thereof.

The Group III-VI compound may be a binary compound such as $In_2S_3$ and $In_2Se_3$; a ternary compound such as $InGaS_3$ and $InGaSe_3$; or any combination thereof.

The Group I-III-VI compound may be a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, or any mixture thereof; a quaternary compound such as $AgInGaS_2$ and $CuInGaS_2$; or any combination thereof.

The Group III-V compound may be a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof; or any combination thereof. The Group III-V compound may further include a Group II metal. For example, InZnP, etc. may be selected as a Group III-II-V compound.

The Group IV-VI compound may be a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; a quaternary compound selected from the group consisting of SnPbSSe, SnPbSeTe, SnPbSTe, and a mixture thereof; or any combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration distribution, or may be present in the particle at a partially different concentration distribution. In an embodiment, the quantum dot may have a core/shell structure in which one quantum dot surrounds another quantum dot. The core/shell structure may have a concentration gradient in which the concentration of an element present in the shell decreases towards the core.

In embodiments, a quantum dot may have a core/shell structure including a core having nano-crystals, and a shell surrounding the core, which are described above. The shell of the quantum dot may be a protection layer that prevents chemical deformation of the core so as to keep semiconductor properties, and/or may be a charging layer that imparts electrophoresis properties to the quantum dot. The shell may be a single layer or may include multiple layers. Examples of the shell of the quantum dot may be a metal oxide, a non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a ternary compound such as $MgAl_2O_4$, $CoFe_2O_4$, $NiFe_2O_4$, and $CoMn_2O_4$, but embodiments are not limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

A quantum dot may have a full width of half maximum (FWHM) of a light emitting wavelength spectrum equal to or less than about 45 nm. For example, the quantum dot may have a FWHM of a light emitting wavelength spectrum equal to or less than about 40 nm. For example, the quantum dot may have a FWHM of a light emitting wavelength spectrum equal to or less than about 30 nm. Color purity or color reproducibility may be enhanced in the above ranges. Light emitted through the quantum dot may be emitted in all directions, and thus, a wide viewing angle may be improved.

The form of a quantum dot is not particularly limited as long as it is a form commonly used in the art. For example, a quantum dot may have a spherical shape, a pyramidal shape, a multi-arm shape, or a cubic shape, or the quantum dot may be in the form of nanoparticles, nanotubes, nanowires, nanofibers, nanoplatelets, etc.

The quantum dot may control the colors of emitted light according to a particle size thereof, and thus the quantum dot may have various light emission colors such as blue, red, green, etc.

In the light emitting diode ED of an embodiment shown in FIGS. 3 to 6, an electron transport region ETR is provided on the emission layer EML. The electron transport region ETR may include at least one or a hole blocking layer HBL, an electron transport layer ETL, and an electron injection layer EIL, but embodiments are not limited thereto.

The electron transport region ETR may be a layer formed of a single material, a layer formed of different materials, or a multilayer structure having layers formed of different materials.

For example, the electron transport region ETR may have a single layer structure of an electron injection layer EIL or an electron transport layer ETL, and may have a single layer structure formed of an electron injection material and an electron transport material. The electron transport region ETR may have a single layer structure formed of different materials, or may have a structure in which an electron transport layer ETL/electron injection layer EIL, a hole blocking layer HBL/electron transport layer ETL/electron injection layer EIL, or an electron transport layer ETL/buffer layer (not shown)/electron injection layer EIL are stacked in its respective stated order from the emission layer EML, but embodiments are not limited thereto. The electron transport region ETR may have a thickness, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below.

[Formula ET-1]

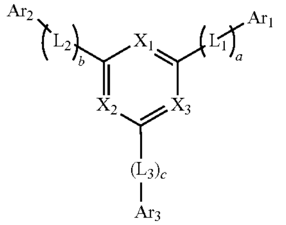

In Formula ET-1, at least one of $X_1$ to $X_3$ may be N and the remainder of $X_1$ to $X_3$ may be $C(R_a)$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. When a to c are 2 or greater, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3-(pyridin-3-yl) biphenyl-3-yl)-1,3,5-triazine, 2-(4-(N-phenylbenzoimidazolyl-1-ylphenyl)-9,10-dinaphthylanthracene, 1,3,5-tri (1-phenyl-1H-benzo[d]imidazol-2-yl) benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di (naphthalene-2-yl)anthracene (ADN), 1,3-bis[3,5-di(pyridin-3-yl)phenyl]benzene (BmPyPhB), diphenyl(4-(triphenylsilyl)phenyl)phosphine oxide (TSPO1), or a mixture thereof.

The electron transport region ETR may include a halogenated metal such as LiF, NaCl, CsF, RbCl, RbI, CuI, and KI, a lanthanide metal such as Yb, or a co-deposition material of a halogenated metal and a lanthanide metal. For example, the electron transport region ETR may include KI:Yb, RbI:Yb, etc. as a co-deposition material. The electron transport region ETR may be formed using a metal oxide such as $Li_2O$ and BaO, or 8-hydroxyl-lithium quinolate (Liq), etc., but embodiments are not limited thereto. The electron transport region ETR may also be formed of a mixture material of an electron transport material and an insulating organo-metal salt. The organo-metal salt may be a material having an energy band gap equal to or greater than about 4 eV. For example, the organo-metal salt may include metal acetates, metal benzoates, metal acetoacetates, metal acetylacetonates, or metal stearates.

The electron transport region ETR may further include, for example, at least one of 2,9-dimethyl-4,7-diphenyl-1,10-phenanthroline (BCP) or 4,7-diphenyl-1,10-phenanthroline (Bphen) in addition to the materials described above, but embodiments are not limited thereto.

The electron transport region ETR may include the compounds of the electron transport region described above in at least one of the electron injection layer EIL, the electron transport layer ETL, and the hole blocking layer HBL.

When the electron transport region ETR includes an electron transport layer ETL, the electron transport layer ETL may have a thickness in a range of about 100 Å to about 1,000 Å. For example, the electron transport layer ETL may have a thickness in a range of about 150 Å to about 500 Å. When the thickness of the electron transport layer ETL satisfies the above-described range, satisfactory electron transport properties may be obtained without a substantial increase in driving voltage. When the electron transport region ETR includes an electron injection layer EIL, the electron injection layer EIL may have a thickness in a range of about 1 Å to about 100 Å. For example, the electron injection layer EIL may have a thickness in a range of about 3 Å to about 90 Å. When the thickness of the electron injection layer EIL satisfies the above-described ranges, satisfactory electron injection properties may be obtained without a substantial increase in driving voltage.

The second electrode EL2 is provided on the electron transport region ETR. The second electrode EL2 may be a common electrode. The second electrode EL2 may be a cathode or an anode but embodiments are not limited thereto. For example, when the first electrode EL1 is an anode, the second electrode EL2 may be a cathode, and when the first electrode EL1 is a cathode, the second electrode EL2 may be an anode. The second electrode may include Ag, Mg, Cu, Al, Pt, Pd, Au, Ni, Nd, Ir, Cr, Li, Ca, LiF, Mo, Ti, W, In, Sn, Zn, an oxide thereof, a compound thereof, or a mixture thereof.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca (e.g., a stack structure of LiF and Ca), LiF/Al (e.g., a stack structure of LiF and Al), Mo, Ti, W, a compound thereof, or a mixture thereof (e.g., AgMg, AgYb, or MgYb). In an embodiment, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the second electrode EL2 may include the above-described metal materials, a combination of two or more metal materials selected from the above-described metal materials, or oxides of the above-described metal materials.

Although not shown in the drawings, the second electrode EL2 may be electrically connected to an auxiliary electrode.

When the second electrode EL2 is electrically connected to the auxiliary electrode, the resistance of the second electrode EL2 may decrease.

In an embodiment, the light emitting diode ED may further include a capping layer CPL disposed on the second electrode EL2. The capping layer CPL may be a multilayer or a single layer.

In an embodiment, the capping layer CPL may include an organic layer or an inorganic layer. For example, when the capping layer CPL includes an inorganic material, the inorganic material may include an alkali metal compound such as LiF, an alkaline earth metal compound such as $MgF_2$, SiON, SiNx, SiOy, etc.

For example, when the capping layer CPL includes an organic material, the organic material may include a-NPD, NPB, TPD, m-MTDATA, $Alq_3$ CuPc, N4,N4,N4',N4'-tetra (biphenyl-4-yl) biphenyl-4,4'-diamine (TPD15), 4,4',4"-tris (carbazol-9-yl)triphenylamine (TCTA), etc., or may include an epoxy resin or an acrylate such as methacrylates. However, embodiments are not limited thereto, and the capping layer CPL may include at least one of Compounds P1 to P5 below.

P1

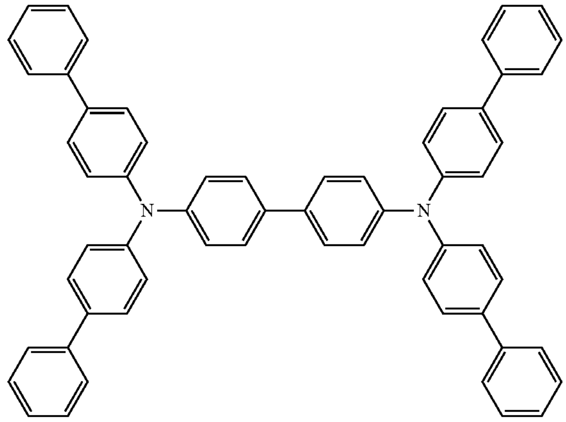

P2

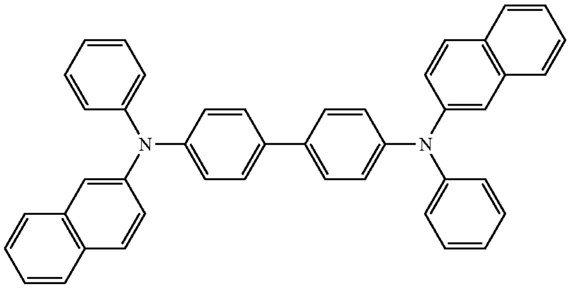

-continued

P3

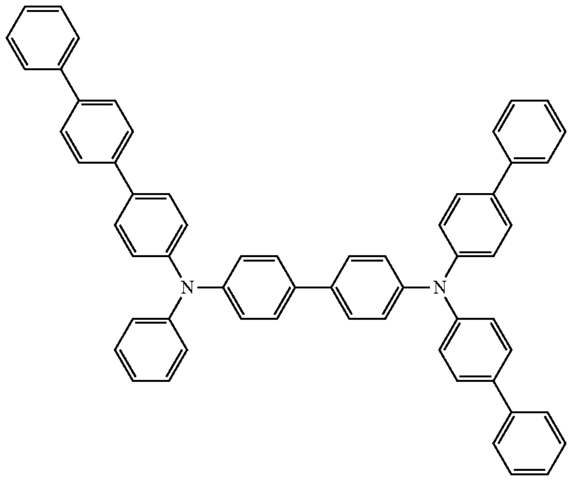

P4

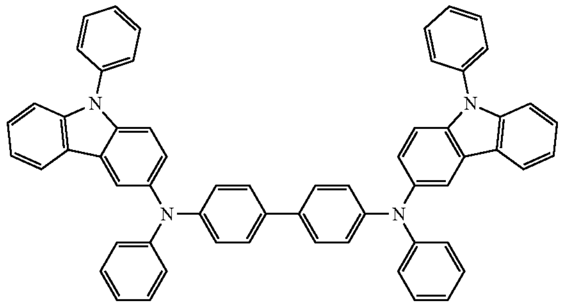

P5

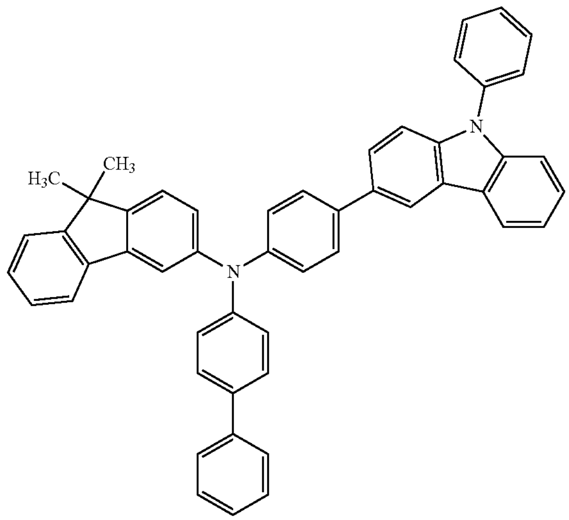

The capping layer CPL may have a refractive index equal to or greater than about 1.6. For example, the capping layer CPL may have a refractive index equal to or greater than about 1.6 with respect to light in a wavelength range of about 550 nm to about 660 nm.

Figure 7:
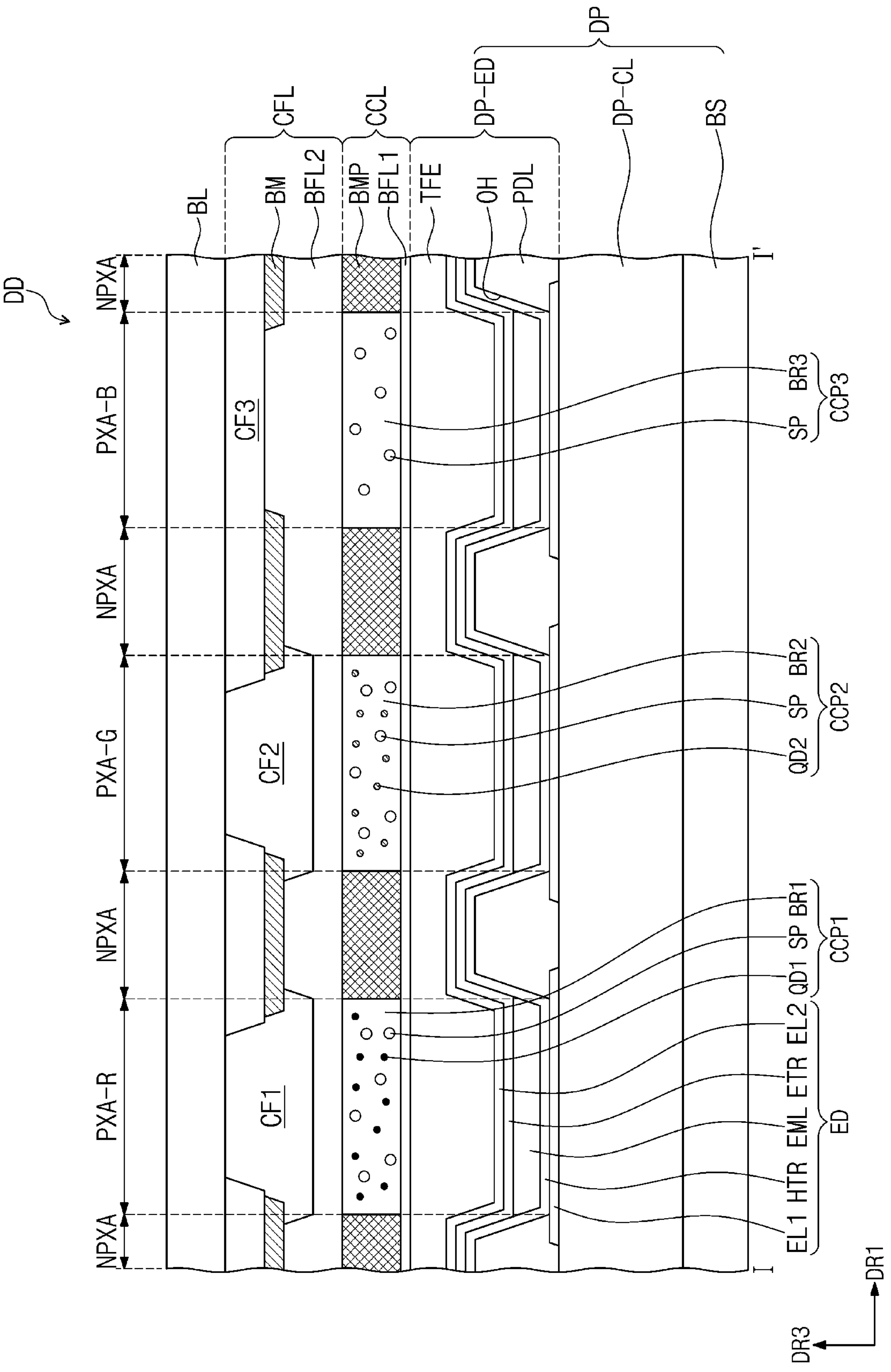
FIG. 7 is a schematic cross-sectional view of a display device according to an embodiment.
Figure 8:
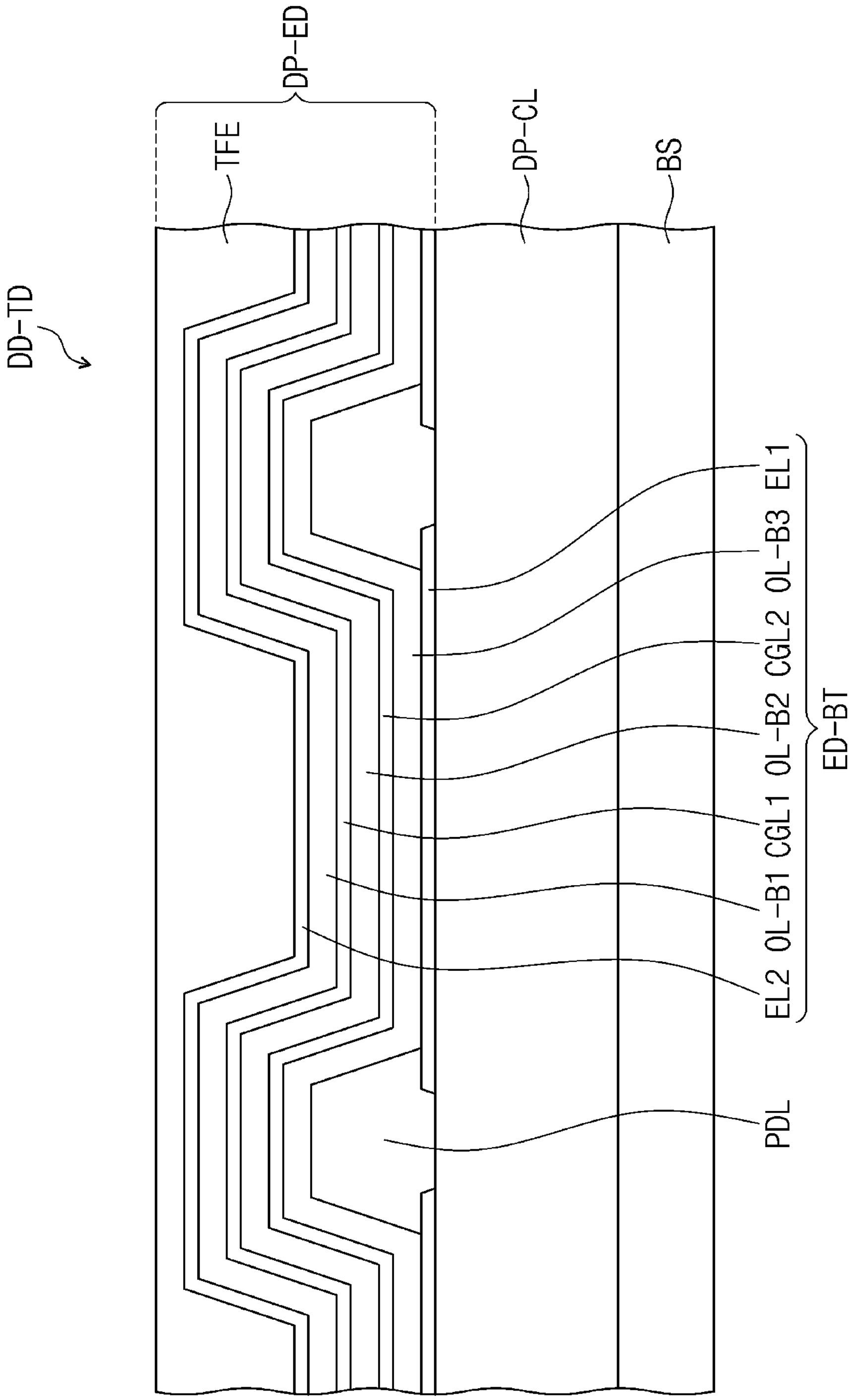
FIG. 8 is a schematic cross-sectional view of a display device according to an embodiment.

FIGS. 7 and 8 are each a schematic cross-sectional view of a display device according to an embodiment. Hereinafter, in the description of the display device according to an embodiment with reference to FIGS. 7 and 8, the features which have been explained with respect to FIGS. 1 to 6 will not be described again, and the differences will be described.

Referring to FIG. 7, a display device DD according to an embodiment may include a display panel DP having a display element layer DP-ED, a light control layer CCL disposed on the display panel DP, and a color filter layer CFL.

In an embodiment shown in FIG. 7, the display panel DP may include a base layer BS, a circuit layer DP-CL provided on the base layer BS, and a display element layer DP-ED, and the display element layer DP-ED may include a light emitting diode ED.

The light emitting diode ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. A structure of the light emitting diode ED shown in FIG. 7 may be the same as the structure of the light emitting diode of FIGS. 3 to 6 described above.

Referring to FIG. 7, the emission layer EML may be disposed in the openings OH defined in the pixel defining layer PDL. For example, the emission layer EML that is separated by the pixel defining layer PDL and provided corresponding to each of the light emitting areas PXA-R, PXA-G, and PXA-B may emit light in a same wavelength range. In the display device DD of an embodiment, the emission layer EML may emit blue light. Although not shown in the drawings, in an embodiment, the emission layer EML may be provided as a common layer throughout the light emitting areas PXA-R, PXA-G, and PXA-B.

At least one of the emission layers EML provided corresponding to the light emitting areas PXA-R, PXA-G, and PXA-B may include the polycyclic compound of an embodiment represented by Formula 1 described above, and the remaining emission layers EML may include an additional fluorescent light emitting material, a phosphorescent light emitting material, quantum dots, etc. However, embodiments are not limited thereto.

The light control layer CCL may be disposed on the display panel DP. The light control layer CCL may include a photoconverter. The photoconverter may include a quantum dot or a phosphor. The photoconverter may convert the wavelength of a provided light, and emit the converted light. For example, the light control layer CCL may be a layer containing quantum dots or phosphors.

The light control layer CCL may include light control units CCP1, CCP2, and CCP3. The light control units CCP1, CCP2, and CCP3 may be spaced apart from each other.

Referring to FIG. 7, a division pattern BMP may be disposed between the light control units CCP1, CCP2, and CCP3 spaced apart from each other, but embodiments are not limited thereto. In FIG. 7, the division pattern BMP is shown as not overlapping with the light control units CCP1, CCP2, and CCP3, but edges of the light control units CCP1, CCP2, and CCP3 may overlap at least a portion of the division pattern BMP.

The light control layer CCL may include a first light control unit CCP1 including a first quantum dot QD1 that converts first color light provided from the light emitting diode ED into second color light, a second light control unit CCP2 including a second quantum dot QD2 that converts the first color light into third color light, and a third light control unit CCP3 transmitting the first color light.

In an embodiment, the first light control unit CCP1 may provide red light, which is the second color light, and the second light control unit CCP2 may provide green light, which is the third color light. The third light control unit CCP3 may transmit and provide blue light, which is the first color light provided from the light emitting diode ED. For example, the first quantum dot QD1 may be a red quantum dot and the second quantum dot QD2 may be a green quantum dot. The same descriptions as provided above with respect to quantum dots may be applied to the quantum dots QD1 and QD2.

The light control layer CCL may further include a scatterer SP. The first light control unit CCP1 may include the first quantum dot QD1 and the scatterer SP, the second light control unit CCP2 may include the second quantum dot QD2 and the scatterer SP, and the third light control unit CCP3 may not include a quantum dot but may include the scatterer SP.

The scatterer SP may be inorganic particles. For example, the scatterer SP may include at least one of $TiO_2$, ZnO, $Al_2O_3$, $SiO_2$, and hollow silica. The scatterer SP may include any one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light control unit CCP1, the second light control unit CCP2, and the third light control unit CCP3 may each include base resins BR1, BR2, and BR3 which disperse the quantum dots QD1 and QD2 and the scatterer SP. In an embodiment, the first light control unit CCP1 may include the first quantum dot QD1 and the scatterer SP dispersed in the first base resin BR1, the second light control unit CCP2 may include the second quantum dot QD2 and the scatterer SP dispersed in the second base resin BR2, and the third light control unit CCP3 may include the scatterer SP dispersed in the third base resin BR3. The base resins BR1, BR2, and BR3 may be a medium in which the quantum dots QD1 and QD2 and the scatterer SP are dispersed, and may be formed of various resin compositions, which may be generally referred to as a binder. For example, the base resins BR1, BR2, and BR3 may be an acrylic resin, a urethane-based resin, a silicone-based resin, an epoxy-based resin, etc. The base resins BR1, BR2, and BR3 may each be a transparent resin. In an embodiment, the first base resin BR1, the second base resin BR2, and the third base resin BR3 may each be the same as or different from each other.

The light control layer CCL may include a barrier layer BFL1. The barrier layer BFL1 may prevent moisture and/or oxygen (hereinafter referred to as "moisture/oxygen") from being introduced. The barrier layer BFL1 may be disposed on the light control units CCP1, CCP2, and CCP3 to prevent the light control units CCP1, CCP2, and CCP3 from being exposed to moisture/oxygen. The barrier layer BFL1 may cover the light control units CCP1, CCP2, and CCP3. A barrier layer BFL2 may be provided between the light control units CCP1, CCP2, and CCP3 and the color filter layer CFL.

The barrier layers BFL1 and BFL2 may include at least one inorganic layer. For example, the barrier layers BFL1 and BFL2 may be formed of an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film in which light transmittance is secured, etc. The barrier layers BFL1 and BFL2 may further include an organic film. The barrier layers BFL1 and BFL2 may be formed of a single layer or of multiple layers.

In the display device DD of an embodiment, the color filter layer CFL may be disposed on the light control layer CCL. For example, the color filter layer CFL may be directly disposed on the light control layer CCL. In an embodiment, the barrier layer BFL2 may be omitted.

The color filter layer CFL may include a light blocking unit BM and filters CF1, CF2, and CF3. For example, the color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. The filters CF1, CF2, and CF3 may each include a polymeric photosensitive resin, a pigment, or a dye. The first filter CF1 may include a red pigment or a red dye, the second filter CF2 may include a green pigment or a green dye, and the third filter CF3 may include a blue pigment or a blue dye. However, embodiments are not limited thereto, and the third filter CF3 may not include a pigment or a dye. The third filter CF3 may include a polymeric photosensitive resin, but not include a pigment or a dye. The third filter CF3 may be transparent. The third filter CF3 may be formed of a transparent photosensitive resin.

In an embodiment, the first filter CF1 and the second filter CF2 may be yellow filters. The first filter CF1 and the second filter CF2 may not be separated from each other and may be provided as a single body.

The light blocking unit BM may be a black matrix. The light blocking unit BM may be formed by including an organic light blocking material or an inorganic light blocking material, each including a black pigment or a black dye. The light blocking unit BM may prevent light leakage, and may separate boundaries between the adjacent filters CF1, CF2, and CF3. In an embodiment, the light blocking unit BM may be formed of a blue filter.

The first to third filters CF1, CF2, and CF3 may be disposed corresponding to the red light emitting area PXA-R, green light emitting area PXA-G, and blue light emitting area PXA-B, respectively.

The base substrate BL may be disposed on the color filter layer CFL. The base substrate BL may provide a base surface on which the color filter layer CFL and the light control layer CCL are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

FIG. 8 is a schematic cross-sectional view showing a portion of a display device according to an embodiment. FIG. 8 shows a schematic cross-sectional view of a portion corresponding to the display panel DP of FIG. 7. In a display device DD-TD of an embodiment, a light emitting diode ED-BT may include light emitting structures OL-B1, OL-B2, and OL-B3. The light emitting diode ED-BT may include the first electrode EL1 and the second electrode EL2 facing each other, and the light emitting structures OL-B1, OL-B2, and OL-B3 stacked in a thickness direction between the first electrode EL1 and the second electrode EL2. The light emitting structures OL-B1, OL-B2, and OL-B3 may each include an emission layer EML (FIG. 7), and a hole transport region HTR and an electron transport region ETR disposed with the emission layer EML (FIG. 7) therebetween.

For example, the light emitting diode ED-BT included in the display device DD-TD of an embodiment may be a light emitting diode having a tandem structure including multiple emission layers.

In an embodiment shown in FIG. 8, light emitted from each of the light emitting structures OL-B1, OL-B2, and OL-B3 may all be blue light. However, embodiments are not limited thereto, and the wavelength ranges of light emitted from each of the light emitting structures OL-B1, OL-B2, and OL-B3 may be different from each other. For example, the light emitting diode ED-BT including the light emitting structures OL-B1, OL-B2, and OL-B3 emitting light in different wavelength ranges may emit white light.

Charge generation layers CGL1 and CGL2 may be disposed between neighboring light emitting structures OL-B1, OL-B2, and OL-B3. The charge generation layers CGL1 and CGL2 may each independently include a p-type charge generation layer and/or an n-type charge generation layer.

At least one of the light emitting structures OL-B1, OL-B2, and OL-B3 included in the display device DD-TD of an embodiment may include the polycyclic compound of an embodiment described above.

The light emitting diode ED-BT according to an embodiment may include the polycyclic compound of an embodiment described above in at least one emission layer EML disposed between the first electrode EL1 and the second electrode EL2, and may thus exhibit improved luminous efficiency and lifespan characteristics.

The polycyclic compound of an embodiment described above includes a bulky moiety such as triptycene or carborane as a linker, and has a structure in which the polycyclic rings of two DABNA derivatives are linked through the linker to prevent aggregation between the polycyclic compounds, and may thus exhibit excellent film properties when used as a material for a light emitting diode. The polycyclic compound of an embodiment may emit thermally activated delayed fluorescence, and when the polycyclic compound of an embodiment is used as an emission layer material, a light emitting diode of an embodiment may exhibit excellent luminous efficiency and long lifespan characteristics.

The light emitting diode of an embodiment may include a hole transporting host, an electron transporting host, an auxiliary dopant that includes an organometallic complex, which is a phosphorescent sensitizer, and a light emitting dopant, which is the polycyclic compound of an embodiment in an emission layer to reduce energy loss in a triplet state and to increase fluorescence light emission rates, and may thus exhibit improved luminous efficiency and long lifespan characteristics.

Hereinafter, with reference to the Examples and to the Comparative Examples, a polycyclic compound and a light emitting diode of an embodiment will be described. The Examples shown below are illustrated only for the understanding of the disclosure and the scope thereof is not limited thereto.

EXAMPLES

1. Synthesis of Polycyclic Compounds

A method of synthesizing polycyclic compounds according to an embodiment will be described in detail by providing a method of synthesizing Compounds 1 to 6 as an example. A method of synthesizing polycyclic compounds, which will be described hereinafter, is provided as an example, and thus the method of synthesizing polycyclic compounds according to an embodiment is not limited to the Examples below.

Synthesis of Compound 1

Compound 1 according to an embodiment may be synthesized by, for example, processes of Reaction Formula 1 below.

[Reaction Formula 1]
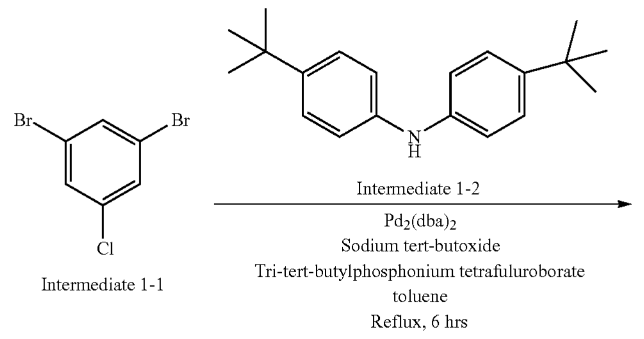
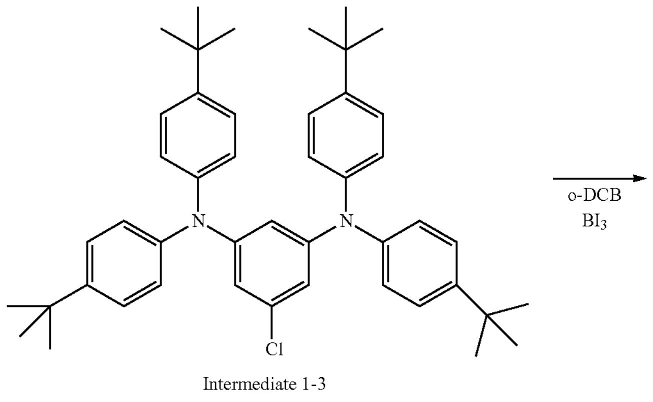
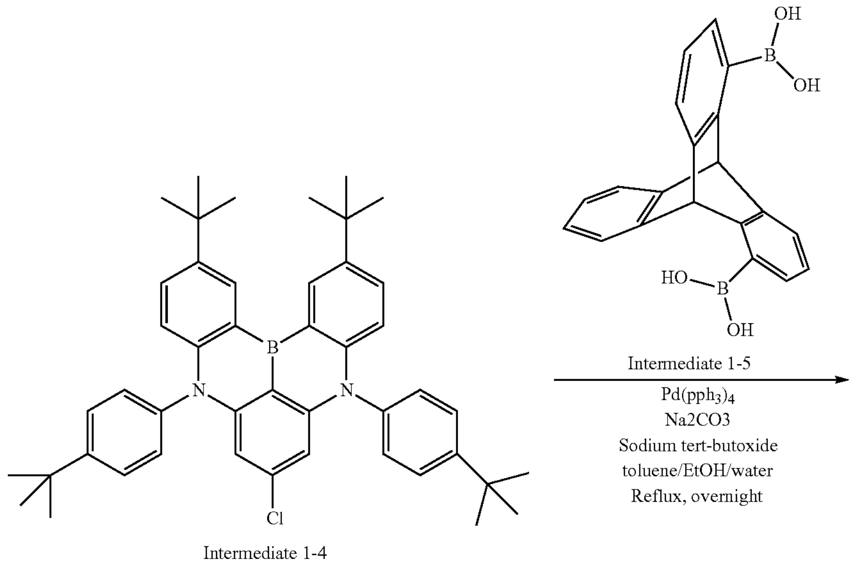

-continued

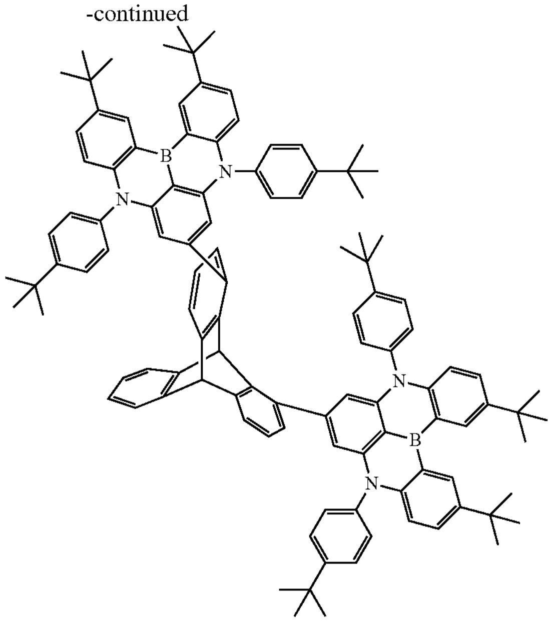

1

10.8 g of Intermediate Compound 1-1 (40.0 mmol) and 22.5 g of Intermediate Compound 1-2 (80.0 mmol) were put into a flask, and toluene was added thereto. Sodium tert-butoxide, $Pd_2(dba)_3$, and tri-tert-butylphosphonium tetrafluoroborate were added thereto, and the mixture was stirred at 110° C. for 6 hours. The obtained residue was purified using silica gel chromatography and recrystallized with a mixed solvent of chloroform and hexane, thereby obtaining 21.0 g of Intermediate Compound 1-3 (yield: 78%).

6.71 g of Intermediate Compound 1-3 (10.0 mmol) and 3.92 g of boron triiodide (10.0 mmol) were put into the flask, and 1,2-dichlorobenzene was added thereto. The obtained residue was purified using silica gel chromatography and recrystallized with a mixed solvent of chloroform and hexane, thereby obtaining 2.31 g of Intermediate Compound 1-4 (yield: 34%).

2.31 g of Intermediate Compound 1-4 (3.40 mmol) and 0.58 g of Intermediate Compound 1-5 (1.70 mmol) were put into the flask, and a mixed solvent of toluene and EtOH was added thereto. 0.3 M of $Na_2CO_3$ aqueous solution and $Pd(PPh_3)_4$ subjected to nitrogen bubbling for 10 minutes or more were added thereto, and the mixture was stirred at 100° C. for overnight. The obtained residue was purified using silica gel chromatography and recrystallized with a mixed solvent of chloroform and hexane, thereby obtaining 2.10 g of Compound 1 (yield: 80%). [MS: m/z [M]+ calcd 1539.94; found, 1539.80]

Synthesis of Compound 2

Compound 2 according to an embodiment may be synthesized by, for example, processes of Reaction Formula 2 below.

[Reaction Formula 2]

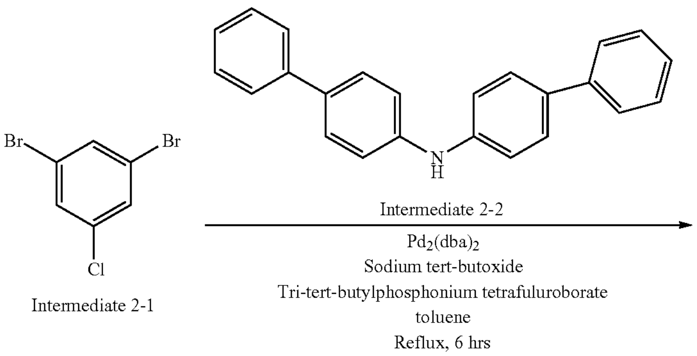

-continued
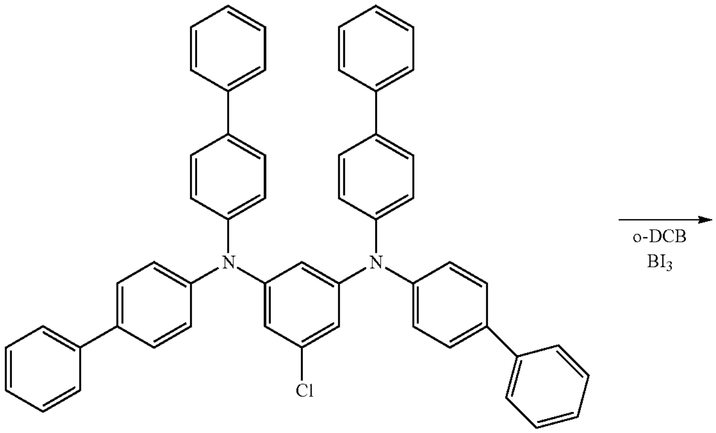
Intermediate 2-3
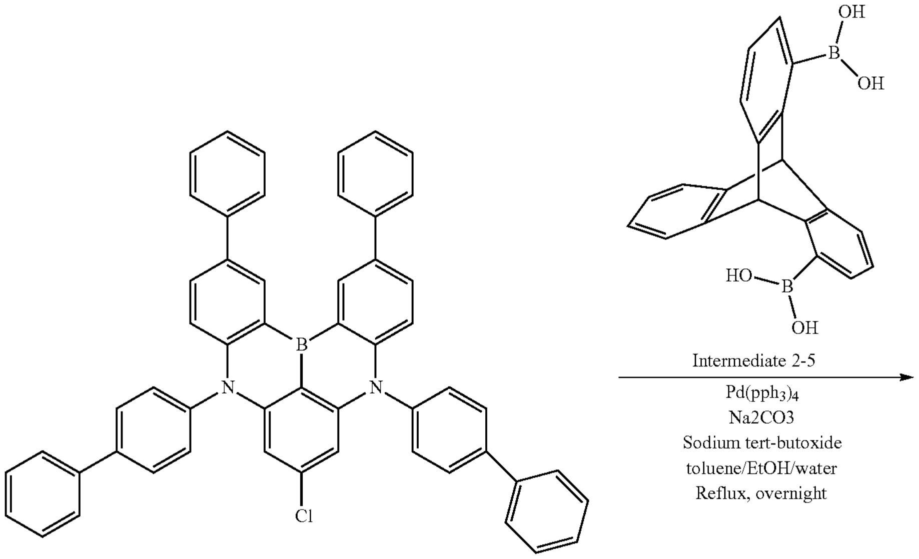
Intermediate 2-4

-continued

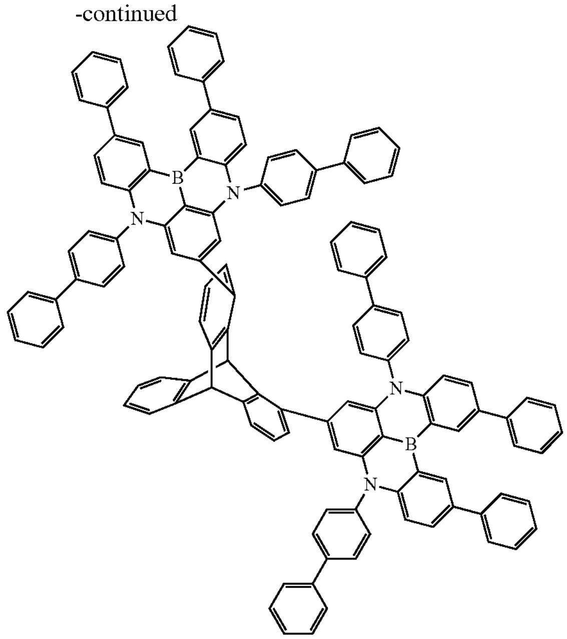

2

10.8 g of Intermediate Compound 2-1 (40.0 mmol) and 25.7 g of Intermediate Compound 2-2 (80.0 mmol) were put into a flask, and toluene was added thereto. Sodium tert-butoxide, $Pd_2(dba)_3$, and tri-tert-butylphosphonium tetrafluoroborate were added thereto, and the mixture was stirred at 110° C. for 6 hours. The obtained residue was purified using silica gel chromatography and recrystallized with a mixed solvent of chloroform and hexane, thereby obtaining 22.3 g of Intermediate Compound 2-3 (yield: 74%).

7.51 g of Intermediate Compound 2-3 (10.0 mmol) and 3.92 g of boron triiodide (10.0 mmol) were put into the flask, and 1,2-dichlorobenzene was added thereto. The obtained residue was purified using silica gel chromatography and recrystallized with a mixed solvent of chloroform and hexane, thereby obtaining 2.05 g of Intermediate Compound 2-4 (yield: 27%).

3.04 g of Intermediate Compound 2-4 (4.00 mmol) and 0.68 g of Intermediate Compound 2-5 (2.00 mmol) were put into the flask, and a mixed solvent of toluene and EtOH was added thereto. 0.3 M of $Na_2CO_3$ aqueous solution and $Pd(PPh_3)_4$ subjected to nitrogen bubbling for 10 minutes or more were added thereto, and the mixture was stirred at 100° C. for overnight. The obtained residue was purified using silica gel chromatography and recrystallized with a mixed solvent of chloroform and hexane, thereby obtaining 2.31 g of Compound 2 (yield: 68%). [MS: m/z [M]+ calcd 1699.69; found, 1698.79]

Synthesis of Compound 3

Compound 3 according to an embodiment may be synthesized by, for example, processes of Reaction Formula 3 below.

[Reaction Formula 3]

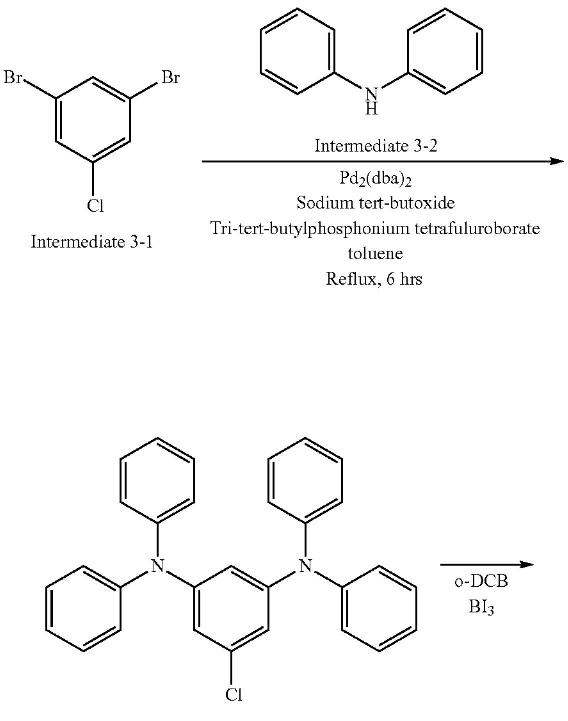

-continued

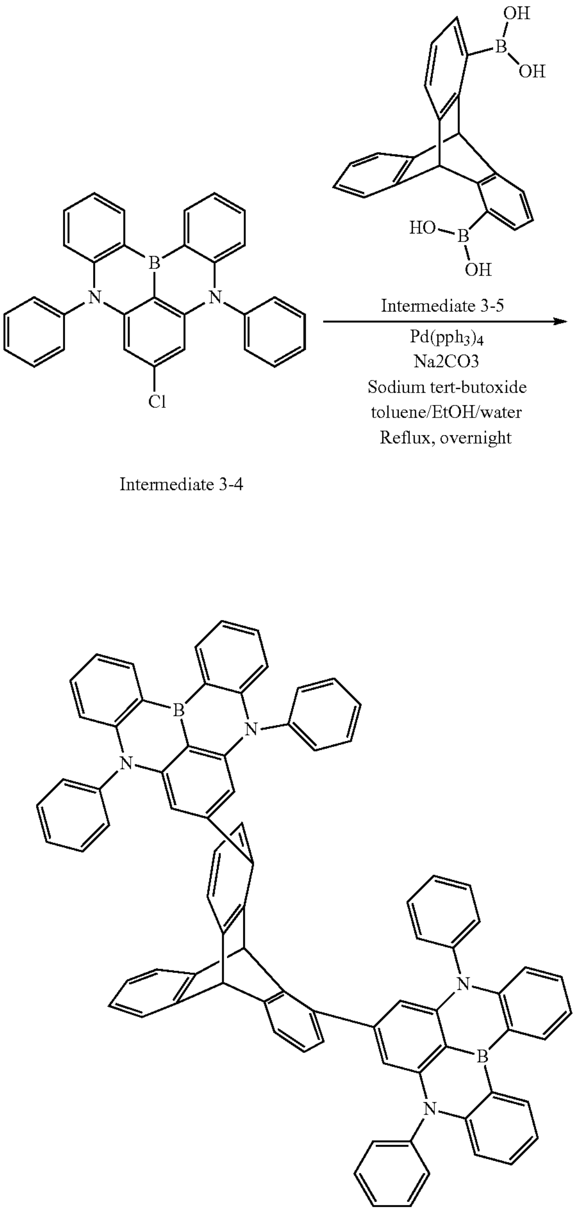

3

10.8 g of Intermediate Compound 3-1 (40.0 mmol) and 13.5 g of Intermediate Compound 3-2 (80.0 mmol) were put into a flask, and toluene was added thereto. Sodium tert-butoxide, $Pd_2(dba)_3$, and tri-tert-butylphosphonium tetrafluoroborate were added thereto, and the mixture was stirred at 110° C. for 6 hours. The obtained residue was purified using silica gel chromatography and recrystallized with a mixed solvent of chloroform and hexane, thereby obtaining 13.8 g of Intermediate Compound 3-3 (yield: 77%).

6.70 g of Intermediate Compound 3-3 (15.0 mmol) and 5.87 g of boron triiodide (15.0 mmol) were put into the flask, and 1,2-dichlorobenzene was added thereto. The obtained residue was purified using silica gel chromatography and recrystallized with a mixed solvent of chloroform and hexane, thereby obtaining 2.59 g of Intermediate Compound 3-4 (yield: 38%).

1.64 g of Intermediate Compound 3-4 (3.60 mmol) and 0.62 g of Intermediate Compound 3-5 (1.80 mmol) were put into the flask, and a mixed solvent of toluene and EtOH was added thereto. 0.3 M of $Na_2CO_3$ aqueous solution and $Pd(PPh_3)_4$ subjected to nitrogen bubbling for 10 minutes or more were added thereto, and the mixture was stirred at 100° C. for overnight. The obtained residue was purified using silica gel chromatography and recrystallized with a mixed solvent of chloroform and hexane, thereby obtaining 1.43 g of Compound 3 (yield: 73%). [MS: m/z [M]+ calcd 1090.44; found, 1090.40]

Synthesis of Compound 4

Compound 4 according to an embodiment may be synthesized by, for example, processes of Reaction Formula 4 below.

[Reaction Formula 4]

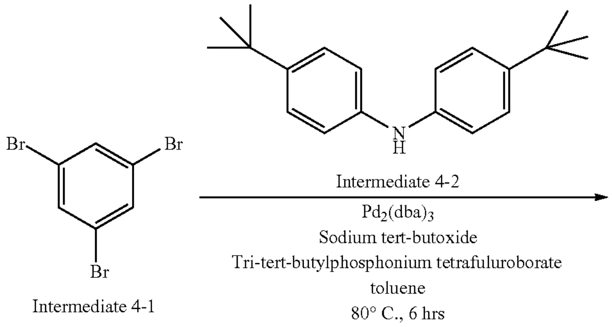

-continued
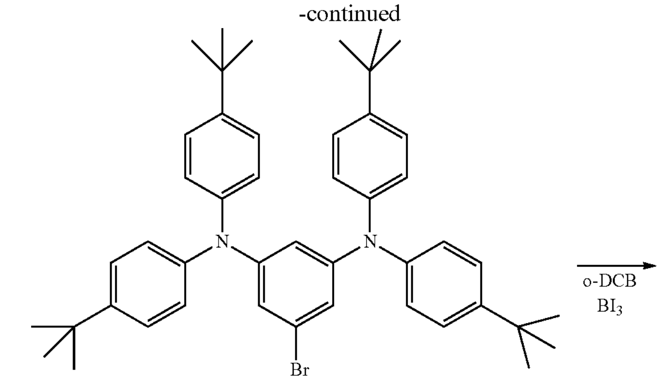
Intermediate 4-3
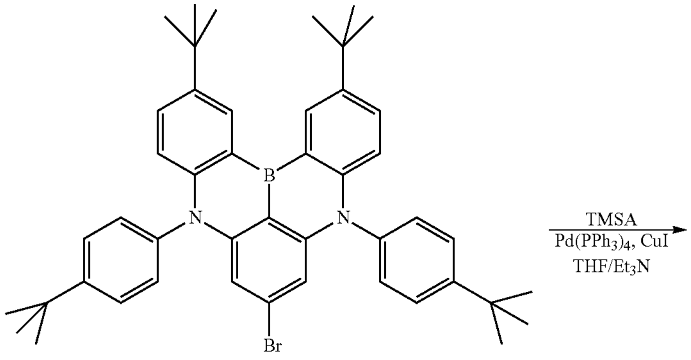
Intermediate 4-4
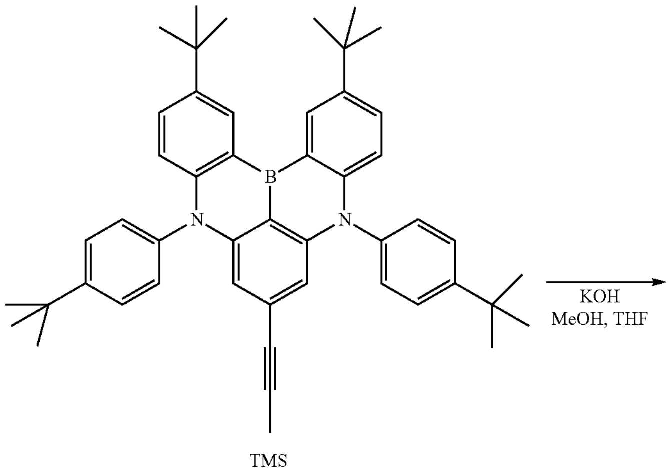
Intermediate 4-5

-continued
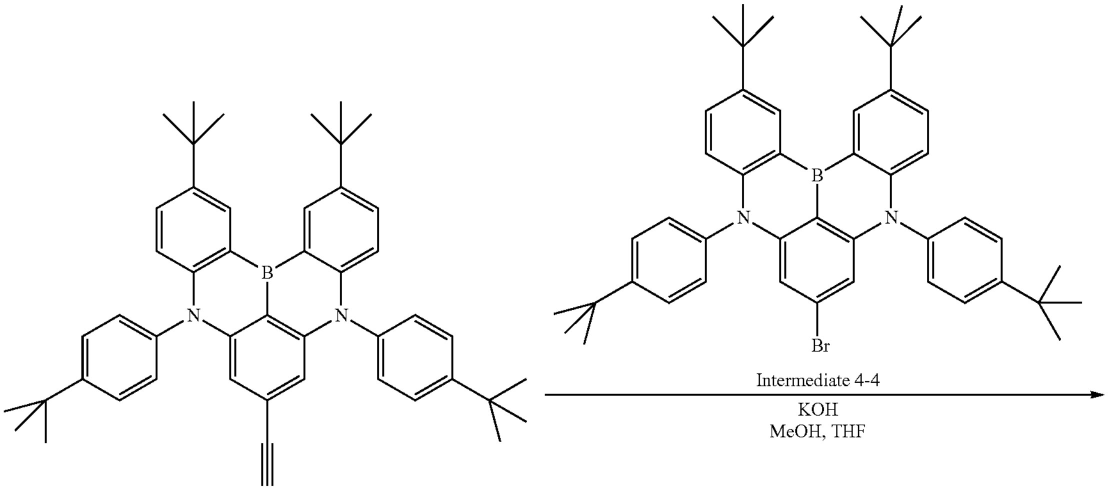
Intermediate 4-6
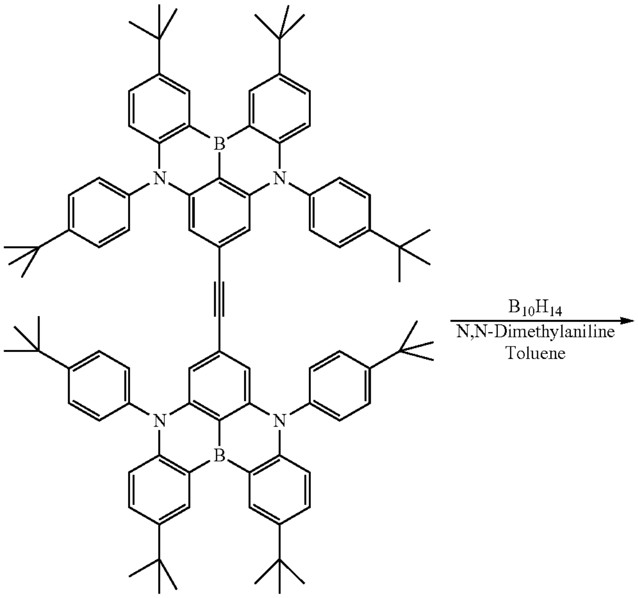
Intermediate 4-7
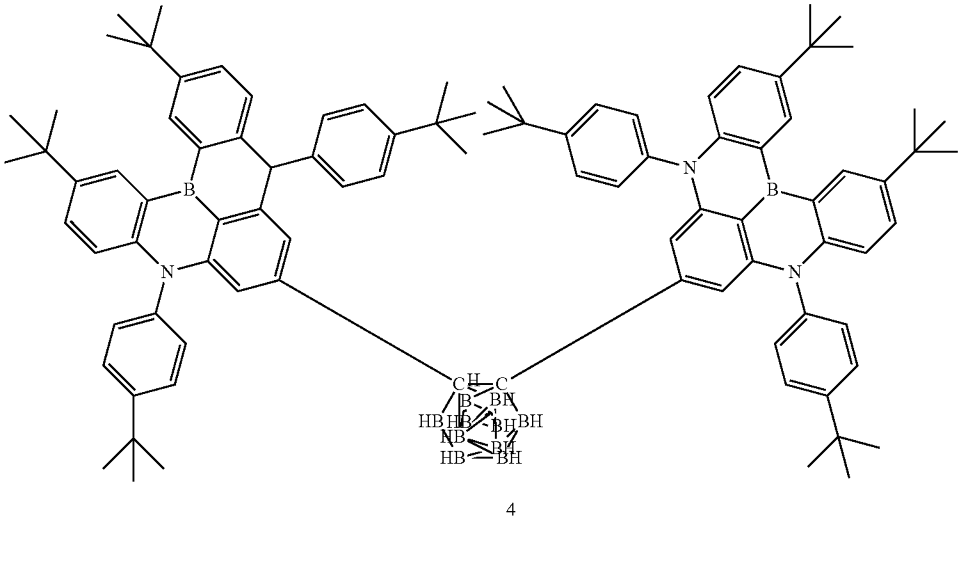
4

15.7 g of Intermediate Compound 4-1 (50.0 mmol) and 28.1 g of Intermediate Compound 4-2 (100.0 mmol) were put into a flask, and toluene was added thereto. Sodium tert-butoxide, $Pd_2(dba)_3$, and tri-tert-butylphosphonium tetrafluoroborate were added thereto, and the mixture was stirred at 80° C. for 6 hours. The obtained residue was purified using silica gel chromatography and recrystallized with a mixed solvent of chloroform and hexane, thereby obtaining 14.3 g of Intermediate Compound 4-3 (yield: 40%).

14.0 g of Intermediate Compound 4-3 (19.6 mmol) and 7.67 g of boron triiodide (19.6 mmol) were put into the flask, and 1,2-dichlorobenzene was added thereto. The obtained residue was purified using silica gel chromatography and recrystallized with a mixed solvent of chloroform and hexane, thereby obtaining 1.42 g of Intermediate Compound 4-4 (yield: 10%).

7.24 g of Intermediate Compound 4-4 (10.0 mmol) was put into the flask, and THF was added thereto. CuI, $Pd(PPh_3)_4$, 1.96 g of trimethylsilylacetylene (TMSA, 20.0 mmol), and $Et_3N$ were added, and the mixture was stirred at 60° C. for 24 hours. The obtained residue was purified using silica gel chromatography and recrystallized with a mixed solvent of chloroform and hexane, thereby obtaining 4.38 g of Intermediate Compound 4-5 (yield: 58%).

22.7 g of Intermediate Compound 4-5 (30.0 mmol) was put into the flask, and THE, methanol, and 1 M of KOH aqueous solution were added thereto, and the mixture was stirred at room temperature for 1 hour. The obtained residue was purified using silica gel chromatography and recrystallized with a mixed solvent of chloroform and hexane, thereby obtaining 2.41 g of Intermediate Compound 4-6 (yield: 12%).

2.27 g of Intermediate Compound 4-6 (3.40 mmol) was put into the flask, and THF was added thereto. 2.46 g of Intermediate Compound 4-4 (3.40 mmol) was added thereto, and methanol and 1 M of KOH aqueous solution were added thereto, and the mixture was stirred at room temperature at 60° C. for 24 hours. The obtained residue was purified using silica gel chromatography, thereby obtaining 0.27 g of Intermediate Compound 4-7 (yield: 6%).

0.026 g of decaborane (0.21 mmol) and N,N-dimethylaniline were added to toluene, and the mixture was stirred at room temperature for 30 minutes and at 100° C. for 2 hours. The temperature was down to room temperature, and 0.27 g of Intermediate Compound 4-7 (0.21 mmol) was added thereto, and refluxed for 16 hours. The obtained residue was purified using silica gel chromatography, thereby obtaining 0.10 g of Compound 4 (yield: 48%).

Synthesis of Compound 5

Compound 5 according to an embodiment may be synthesized by, for example, processes of Reaction Formula 5 below.

[Reaction Formula 5]

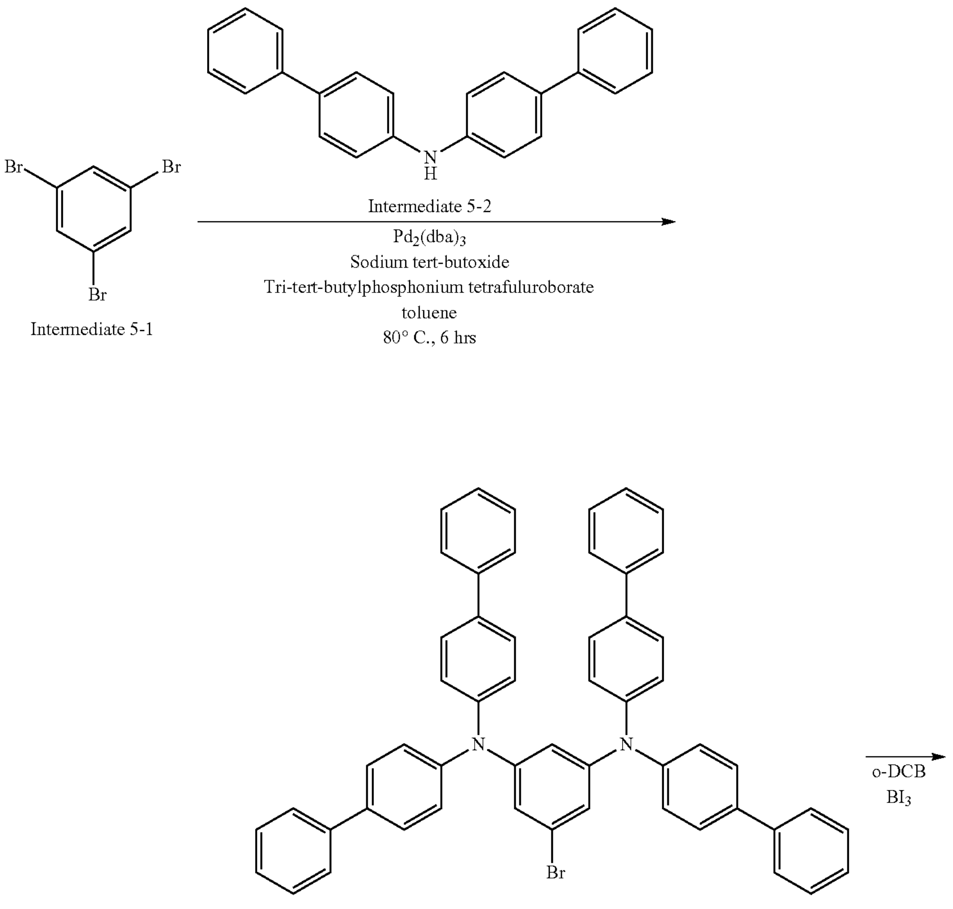

Intermediate 5-3

-continued
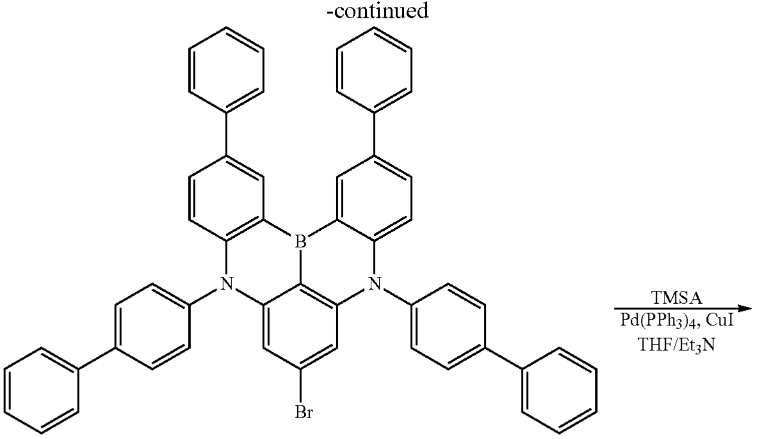
Intermediate 5-4
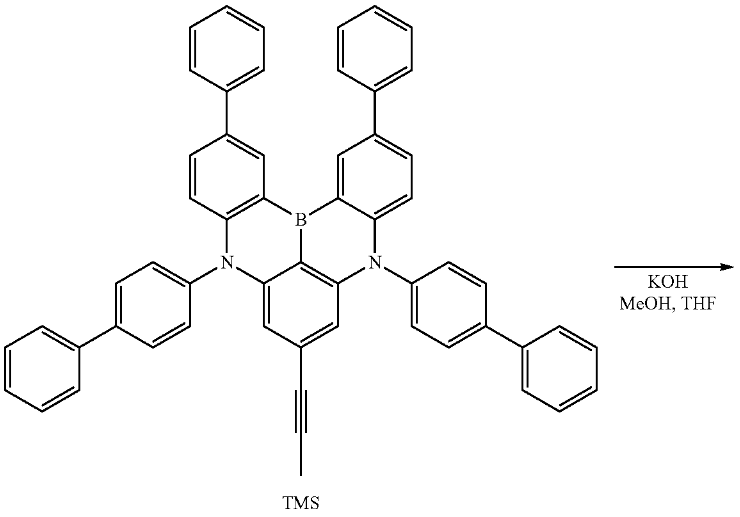
Intermediate 5-5
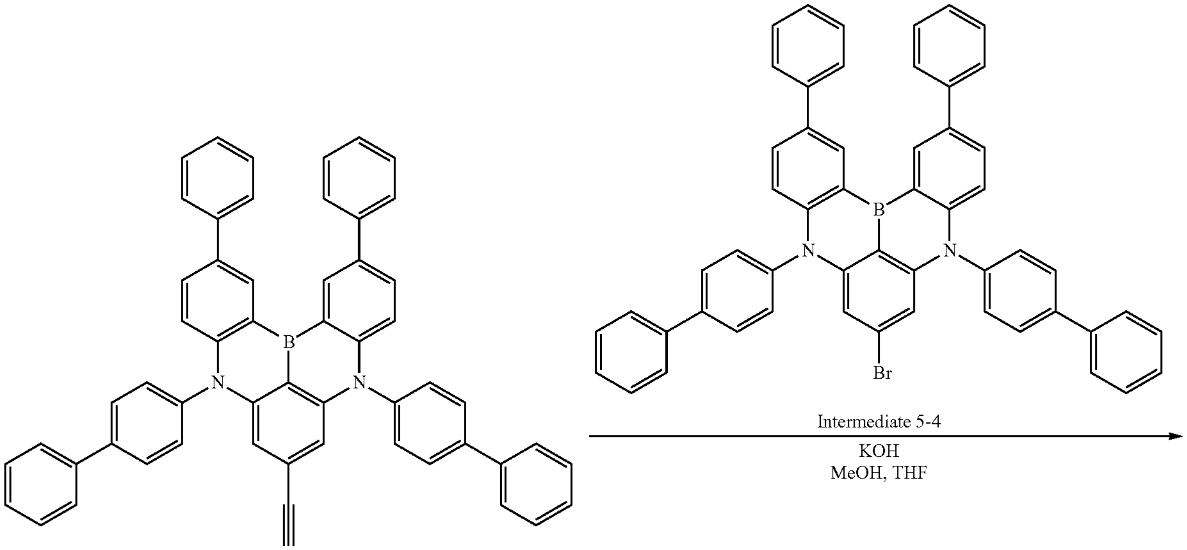
Intermediate 5-6

-continued

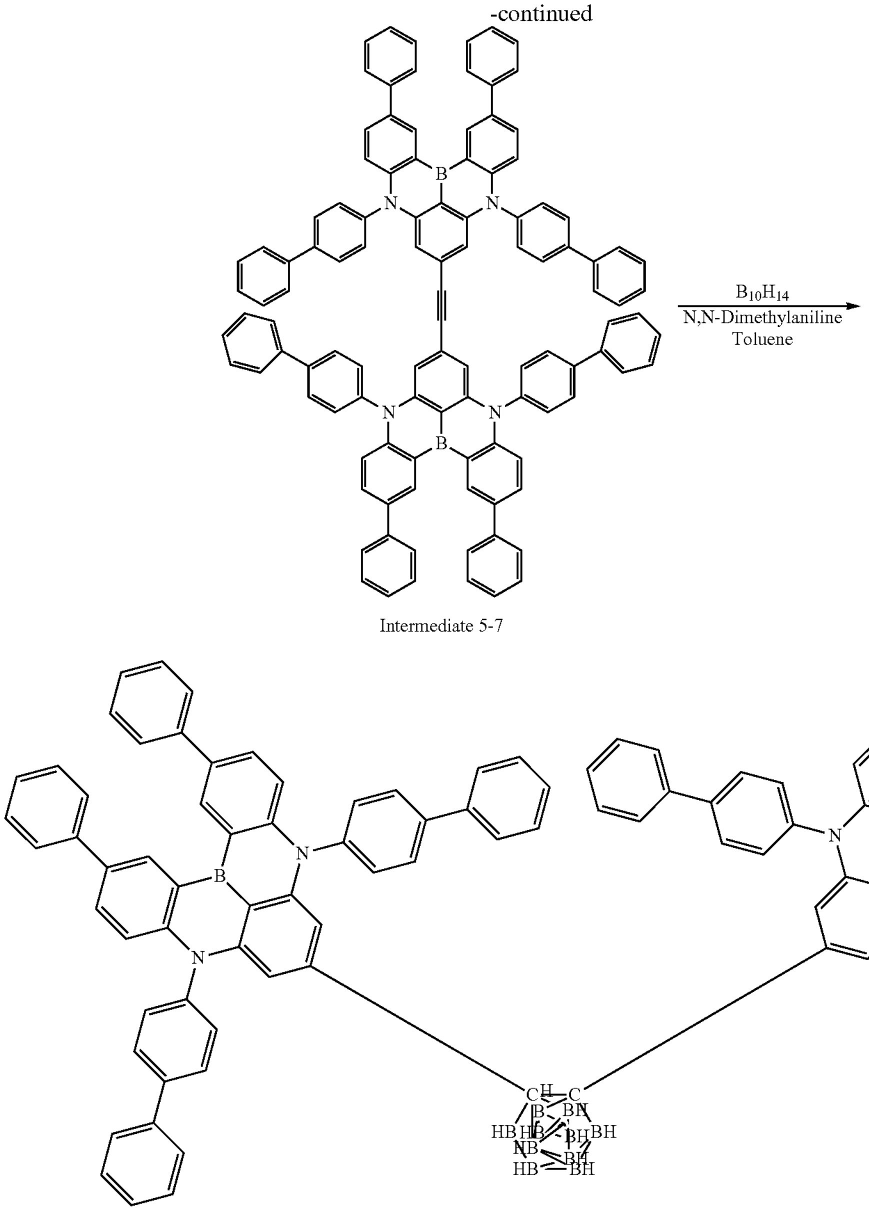

Intermediate 5-7

5

15.7 g of Intermediate Compound 5-1 (50.0 mmol) and 32.1 g of Intermediate Compound 5-2 (100.0 mmol) were put into a flask, and toluene was added thereto. Sodium tert-butoxide, $Pd_2(dba)_3$, and tri-tert-butylphosphonium tetrafluoroborate were added thereto, and the mixture was stirred at 80° C. for 6 hours. The obtained residue was purified using silica gel chromatography and recrystallized with a mixed solvent of chloroform and hexane, thereby obtaining 13.9 g of Intermediate Compound 5-3 (yield: 35%).

13.9 g of Intermediate Compound 5-3 (17.5 mmol) and 6.85 g of boron triiodide (17.5 mmol) were put into the flask, and 1,2-dichlorobenzene was added thereto. The obtained residue was purified using silica gel chromatography and recrystallized with a mixed solvent of chloroform and hexane, thereby obtaining 0.99 g of Intermediate Compound 5-4 (yield: 7%).

8.04 g of Intermediate Compound 5-4 (10.0 mmol) was put into the flask, and THF was added thereto. CuI, $Pd(PPh_3)_4$, 1.96 g of trimethylsilylacetylene (TMSA, 20.0 mmol), and $Et_3N$ were added thereto, and the mixture was stirred at 60° C. for 24 hours. The obtained residue was purified using silica gel chromatography and recrystallized with a mixed solvent of chloroform and hexane, thereby obtaining 5.18 g of Intermediate Compound 5-5 (yield: 62%).

25.1 g of Intermediate Compound 5-5 (30.0 mmol) was put into the flask, and THE, methanol, and 1 M of KOH aqueous solution were added thereto, and the mixture was stirred at room temperature for 1 hour. The obtained residue was purified using silica gel chromatography and recrystallized with a mixed solvent of chloroform and hexane, thereby obtaining 2.03 g of Intermediate Compound 5-6 (yield: 9%).

1.87 g of Intermediate Compound 5-6 (2.50 mmol) was put into the flask, and THF was added thereto. 2.01 g of Intermediate Compound 5-4 (2.50 mmol) was added thereto, and methanol and 1 M of KOH aqueous solution were added thereto, and the mixture was stirred at room temperature at 60° C. for 24 hours. The obtained residue was purified using silica gel chromatography, thereby obtaining 0.29 g of Intermediate Compound 5-7 (yield: 8%).

0.03 g of decaborane (0.25 mmol) and N,N-dimethylaniline were added to toluene, and the mixture was stirred at room temperature for 30 minutes and at 100° C. for 2 hours. The temperature was down to room temperature, and 0.20 g of Intermediate Compound 5-7 (0.25 mmol) was added thereto, and refluxed for 16 hours. The obtained residue was purified using silica gel chromatography, thereby obtaining 0.18 g of Compound 5 (yield: 45%).

Synthesis of Compound 6

Compound 6 according to an embodiment may be synthesized by, for example, processes of Reaction Formula 6 below.

[Reaction Formula 6]

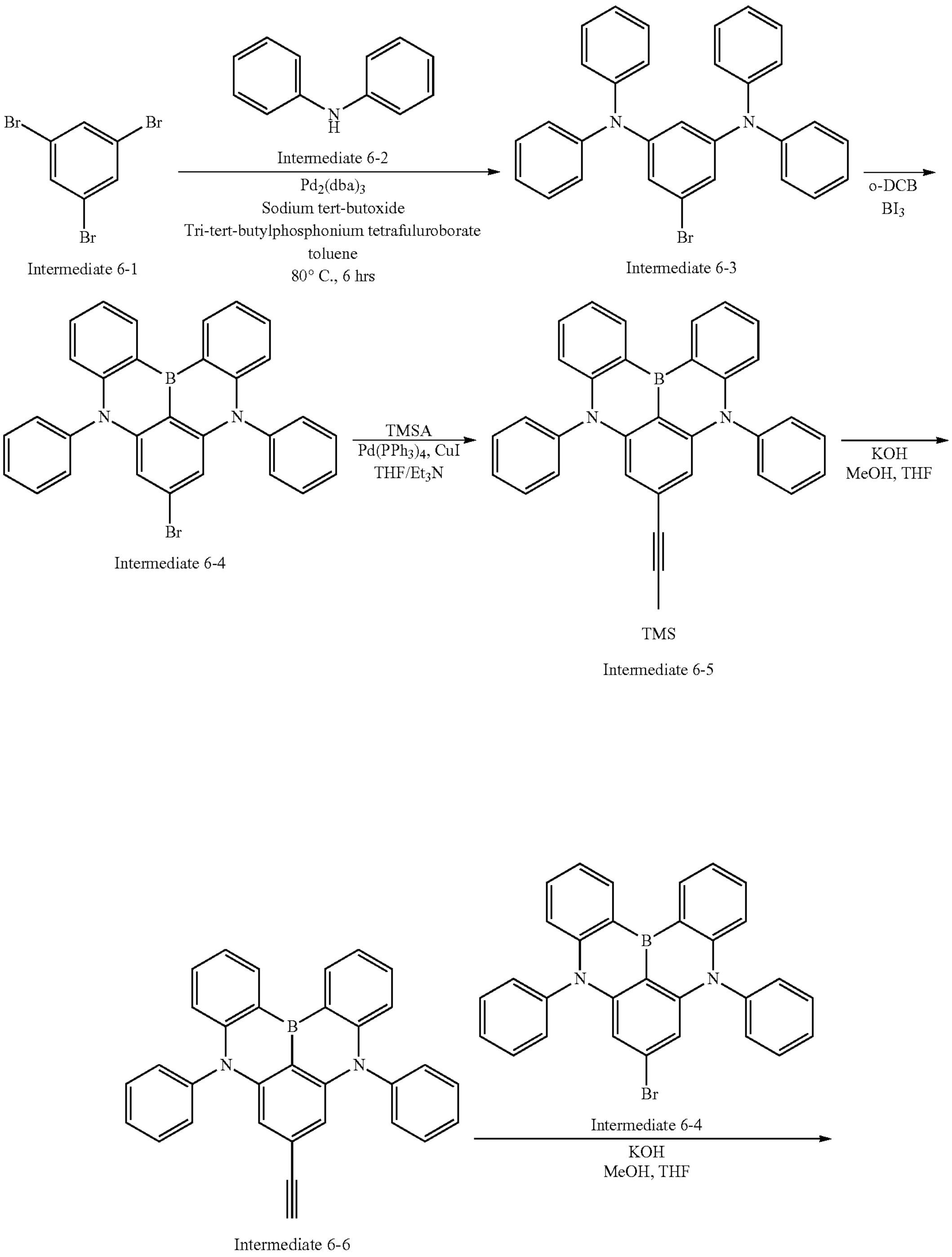

-continued

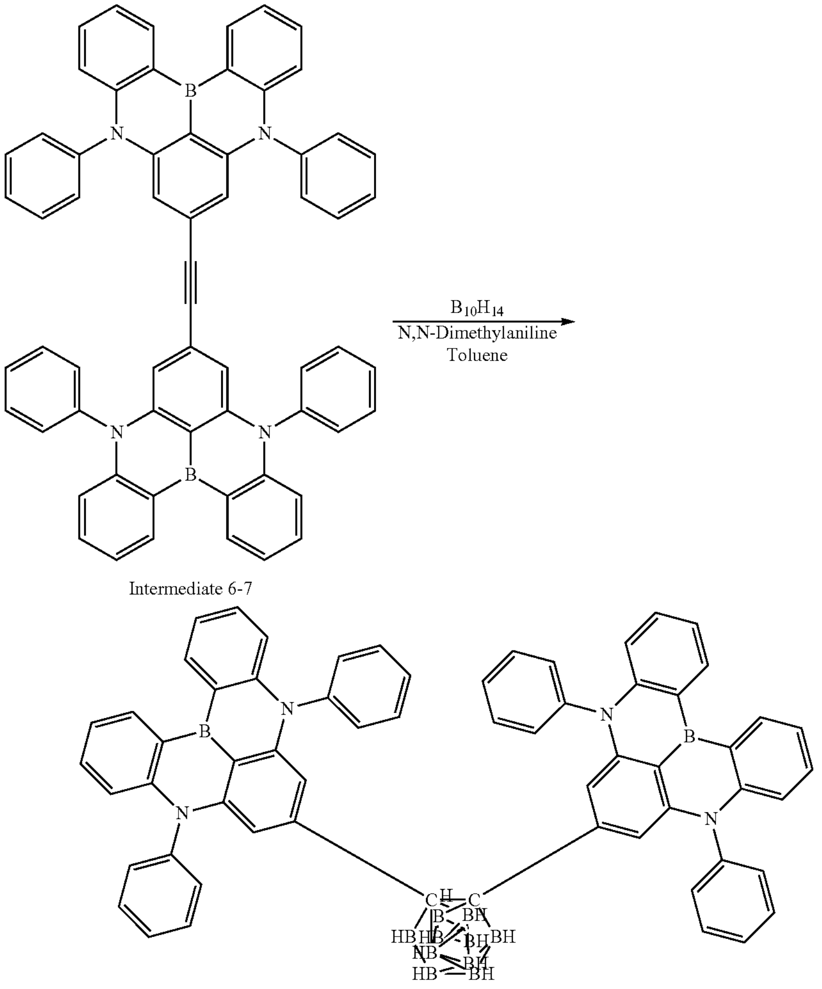

Intermediate 6-7

6

15.7 g of Intermediate Compound 6-1 (50.0 mmol) and 16.9 g of Intermediate Compound 6-2 (100.0 mmol) were put into a flask, and toluene was added thereto. Sodium tert-butoxide, $Pd_2(dba)_3$, and tri-tert-butylphosphonium tetrafluoroborate were added thereto, and the mixture was stirred at 80° C. for 6 hours. The obtained residue was purified using silica gel chromatography and recrystallized with a mixed solvent of chloroform and hexane, thereby obtaining 7.87 g of Intermediate Compound 6-3 (yield: 32%).

7.86 g of Intermediate Compound 6-3 (16.0 mmol) and 6.26 g of boron triiodide (16.0 mmol) were put into the flask, and 1,2-dichlorobenzene was added thereto. The obtained residue was purified using silica gel chromatography and recrystallized with a mixed solvent of chloroform and hexane, thereby obtaining 0.4 g of Intermediate Compound 6-4 (yield: 5%).

3.00 g of Intermediate Compound 6-4 (6.00 mmol) was put into the flask, and THF was added thereto. CuI, $Pd(PPh_3)_4$, 1.18 g of trimethylsilylacetylene (TMSA, 12.0 mmol), and $Et_3N$ were added, and the mixture was stirred at 60° C. for 24 hours. The obtained residue was purified using silica gel chromatography and recrystallized with a mixed solvent of chloroform and hexane, thereby obtaining 2.07 g of Intermediate Compound 6-5 (yield: 65%).

15.9 g of Intermediate Compound 6-5 (30.0 mmol) was put into the flask, and THF, methanol, and 1 M of KOH aqueous solution were added thereto, and the mixture was stirred at room temperature for 1 hour. The obtained residue was purified using silica gel chromatography and recrystallized with a mixed solvent of chloroform and hexane, thereby obtaining 1.60 g of Intermediate Compound 6-6 (yield: 12%).

1.60 g of Intermediate Compound 6-6 (3.60 mmol) was put into the flask, and THF was added thereto. 1.80 g of Intermediate Compound 6-4 (3.60 mmol) was added thereto, and methanol and 1 M of KOH aqueous solution were added thereto, and the mixture was stirred at room temperature at 60° C. for 24 hours. The obtained residue was purified using silica gel chromatography, thereby obtaining 0.22 g of Intermediate Compound 6-7 (yield: 7%).

0.034 g of decaborane (0.28 mmol) and N,N-dimethylaniline were added to toluene, and the mixture was stirred at room temperature for 30 minutes and at 100° C. for 2 hours. The temperature was down to room temperature, and 0.22 g of Intermediate Compound 6-7 (0.25 mmol) was added thereto, and refluxed for 16 hours. The obtained residue was purified using silica gel chromatography, thereby obtaining 0.11 g of Compound 6 (yield: 42%).

2. Preparation and Evaluation of Light Emitting Diodes (Manufacture of Light Emitting Diodes)

Light emitting diodes of an embodiment containing a polycyclic compound of an embodiment in an emission layer were manufactured using a method below. Light emitting diodes of Examples 1 to 4 were manufactured using the polycyclic compounds of Compounds 1 to 4 described above as a light emitting dopant of an emission layer.

In Comparative Examples 1 and 2, light emitting diodes were manufactured using Comparative Example Compounds C1 and C2 as a light emitting dopant of an emission layer, respectively.

Comparative Example Compounds used for the manufacturing of diodes are shown below.

Comparative Example Compounds

C1

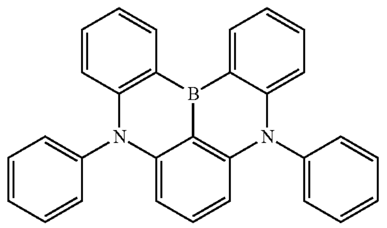

C2

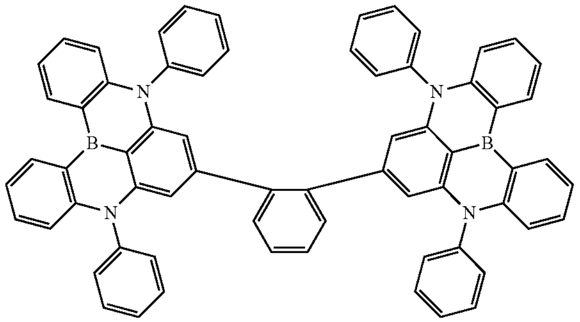

(Other Compounds Used for the Manufacturing of Diodes)

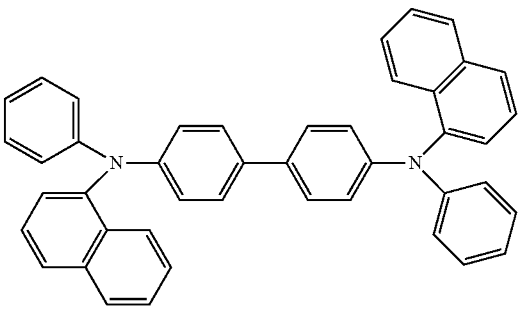

NPD

-continued

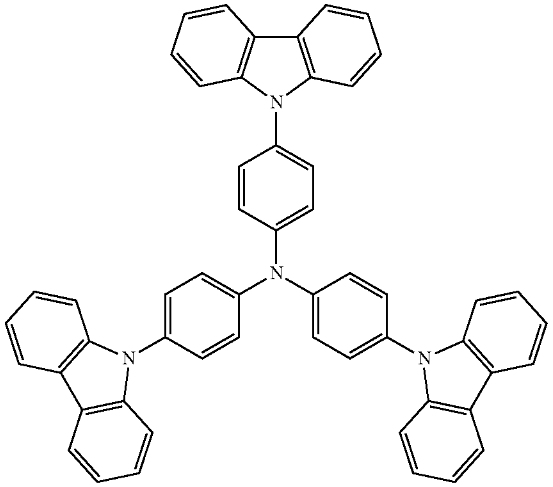

TCTA

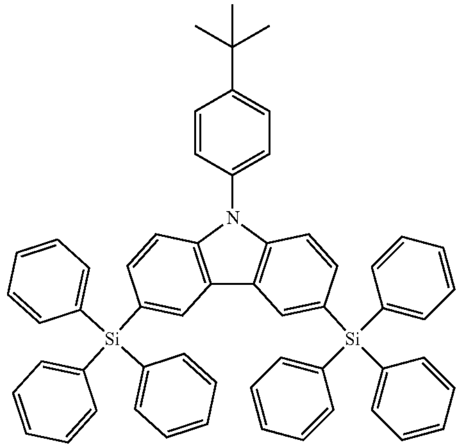

CzSi

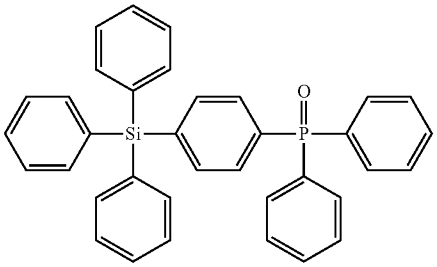

TSPO1

-continued

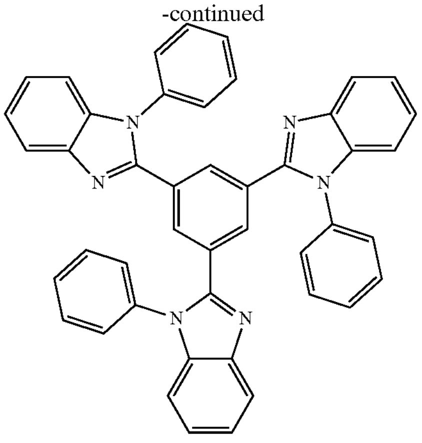

TPBi

HT-08

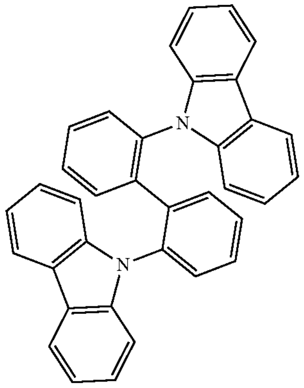

ET-04

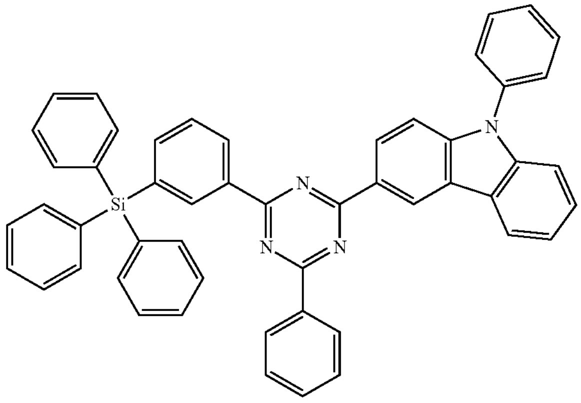

13

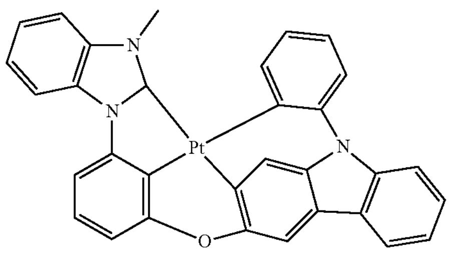

An ITO-patterned glass substrate was cleaned, and NPD was deposited at a thickness of 300 Å to form a hole injection layer. TCTA was deposited at a thickness of 200 Å to form a hole transport layer. CzSi was vacuum deposited on the hole transport layer to form an auxiliary emission layer having a thickness of 100 Å.

A first host, a second host, an auxiliary dopant, and a light emitting dopant were co-deposited in a weight ratio of 70:30:15:0.5 to form an emission layer having a thickness of 250 Å. In the Comparative Examples and the Examples, when the emission layer was formed, Compound HT-08 was used as the first host, Compound ET-04 was used as the second host, and Compound 13 was used as the auxiliary dopant. The compounds of the Comparative Examples and the compounds of the Examples were used as a light emitting dopant.

TSPO1 was deposited at a thickness of 200 Å to form an electron transport layer, and TPBi was deposited at a thickness of 300 Å to form a buffer layer, and LiF was deposited at a thickness of 10 Å to form an electron injection layer.

Al was provided at a thickness of 3000 Å to form a second electrode.

(Property Evaluation of Light Emitting Diodes)

Table 1 shows results of evaluation on light emitting diodes for Examples 1 to 4, and Comparative Examples 1 and 2. In Table 1, luminous efficiency, light emitting wavelength, and diode lifespan of the manufactured light emitting diodes are compared and shown. Luminous efficiency values at a current density of 10 mA/cm$^2$ were presented in characteristic evaluation results for Examples and Comparative Examples shown in Table 1. The diode lifespan represents reduced time from an initial luminance to 95% luminance (5% luminance reduction) for continuous driving at a current density of 10 mA/cm$^2$.

The current density, driving voltage, and luminous efficiency of the light emitting diodes of Examples and Comparative Examples were measured in a dark room by using Source Meter 2400 series (Keithley Instruments), Chroma Meter CS-200 (Konica Minolta, Inc.), and PC Program LabVIEW 2.0 (Japan National Instruments Corporation).

TABLE 1

| Manufactured diodes | Light emitting dopant material | Luminous efficiency (cd/A) | Light emitting wave-length (Nm) | Diode life-span (hr) |
|---|---|---|---|---|
| Example 1 | Example Compound 1 | 22 | 461 | 40 |
| Example 2 | Example Compound 2 | 24 | 462 | 55 |
| Example 3 | Example Compound 3 | 19 | 461 | 37 |
| Example 4 | Example Compound 4 | 17 | 461 | 45 |
| Comparative Example 1 | Comparative Example Compound C1 | 17 | 461 | 12 |
| Comparative Example 2 | Comparative Example Compound C2 | 18 | 463 | 15 |

Referring to the results in Table 1, it is seen that the light emitting diodes of the Examples and the Comparative Examples emit blue light having a light emitting wavelength of 461 nm to 462 nm. Referring to the results in Table 1, the light emitting diodes of the Examples using the polycyclic compound of an embodiment as a light emitting dopant material of an emission layer showed excellent luminous efficiency and improved diode lifespan characteristics, compared to the light emitting diodes of the Comparative Examples.

Referring to Table 1, it is confirmed that Examples 1 to 4 include a polycyclic compound having a dimer structure connected through a bulky linker, and thus exhibit long life and high efficiency characteristics, compared to the light emitting dopant used in the emission layer of the light emitting diodes of Comparative Examples 1 to 2.

The polycyclic compound according to an embodiment has a dimer-type compound structure connected through a bulky linker, and is used as a delayed fluorescence light emitting material, thereby possibly contributing to achieving high efficiency and long lifespan characteristics of a light emitting diode. A light emitting diode according to an embodiment includes the polycyclic compound according to an embodiment, and may thus exhibit long life and high efficiency characteristics.

A light emitting diode according to an embodiment includes a polycyclic compound of an embodiment, and may thus exhibit high efficiency and long life characteristics.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting diode comprising:

a first electrode;

a second electrode disposed on the first electrode; and an emission layer disposed between the first electrode and the second electrode, wherein the first electrode and the second electrode each independently include Ag, Mg, Cu, Al, Pt, Pd, Au, Ni, Nd, Ir, Cr, Li, Ca, LiF, Mo, Ti, W, In, Sn, Zn, an oxide thereof, a compound thereof, or a mixture thereof, and the emission layer includes a polycyclic compound represented by Formula 1:

[Formula 1]

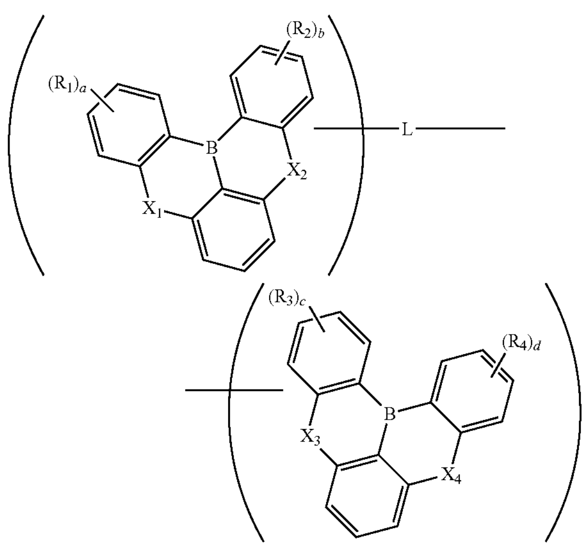

wherein in Formula 1, $X_1$ to $X_4$ are each independently $B(R_a)$, $N(R_b)$, $C(R_c)(R_d)$, O, S, or Se, a to d are each independently an integer from 0 to 4, $R_a$ to $R_d$ and $R_1$ to $R_4$ are each independently a hydrogen atom, a deuterium atom, a halogen atom, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and L is a substituted or unsubstituted divalent triptycene.

2. The light emitting diode of claim 1, wherein the polycyclic compound represented by Formula 1 is represented by Formula 1-1:

[Formula 1-1]

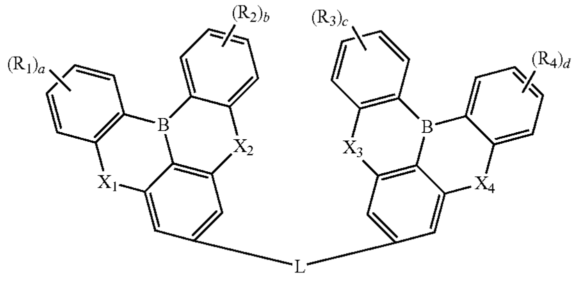

wherein in Formula 1-1, $X_1$ to $X_4$, a to d, $R_1$ to $R_4$, and L are each the same as defined in Formula 1.

3. The light emitting diode of claim 1, wherein L is a group represented by L-1:

L-1

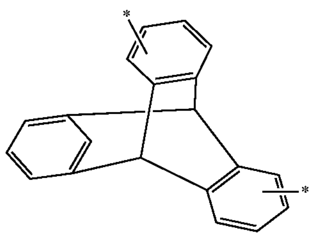

wherein in L-1, represents a binding site to a neighboring atom.

4. The light emitting diode of claim 1, wherein $R_1$ to $R_4$ are each independently a t-butyl group, a substituted or unsubstituted phenyl group, or a substituted or unsubstituted biphenyl group.

5. The light emitting diode of claim 1, wherein $X_1$ to $X_4$ are the same.

6. The light emitting diode of claim 1, wherein the emission layer is a delayed fluorescent emission layer including a host and a dopant, and the dopant comprises the polycyclic compound.

7. The light emitting diode of claim 1, wherein the polycyclic compound represented by Formula 1 is one selected from Compound Group 1:

[Compound Group 1]

1

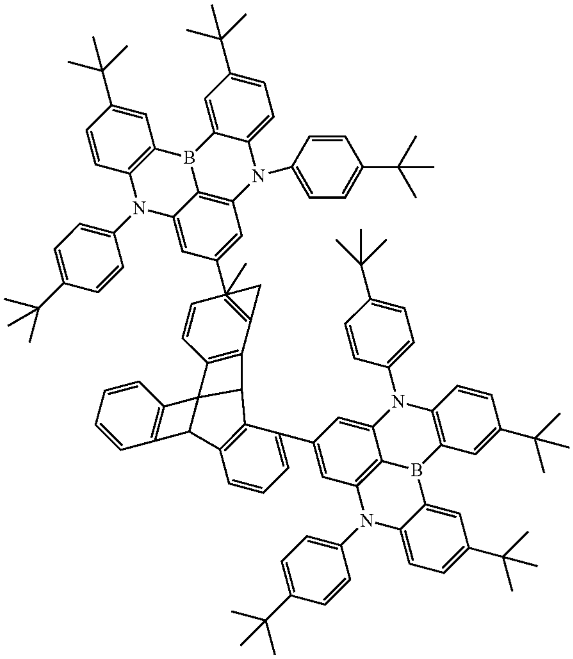

2

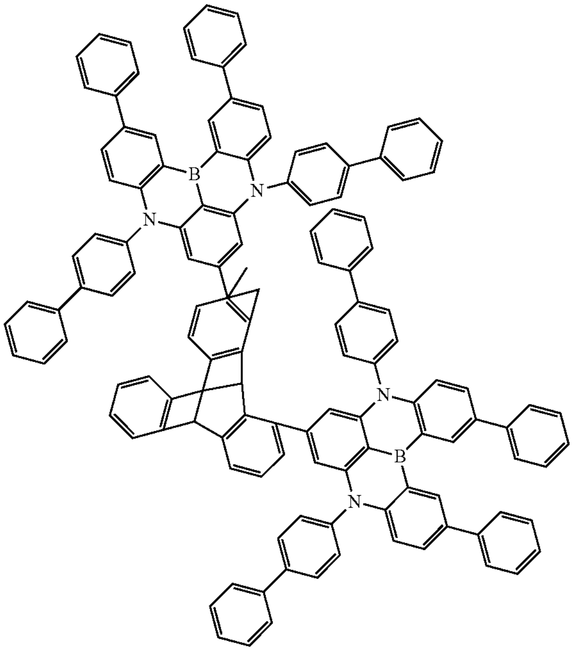

-continued

3

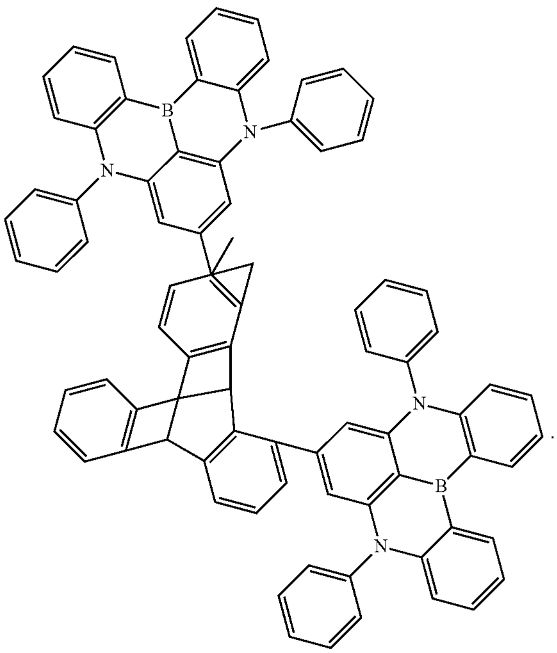

8. The light emitting diode of claim 1, wherein the emission layer comprises:

a first host;

a second host different from the first host;

an auxiliary dopant including an organometallic complex; and a light emitting dopant, and the light emitting dopant includes the polycyclic compound.

9. The light emitting diode of claim 8, wherein the first host comprises one selected from Compounds HT-01 to HT-09:

HT-01

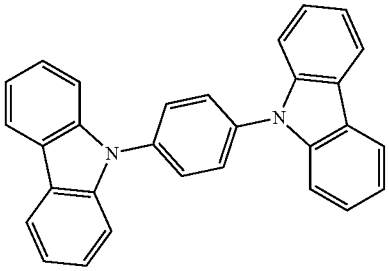

HT-02

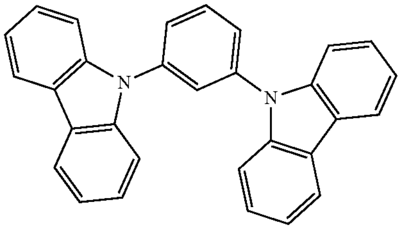

-continued
HT-03
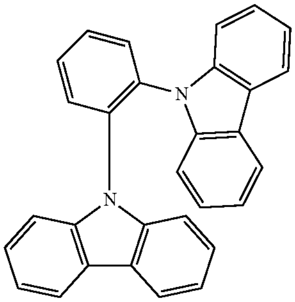
HT-04
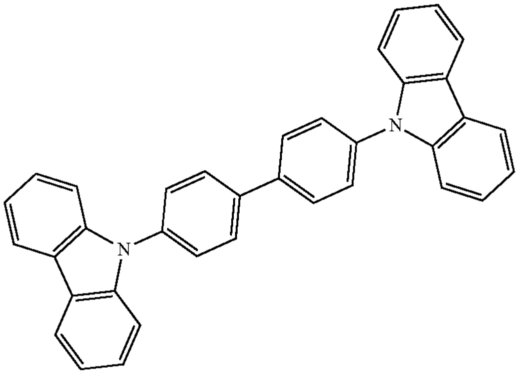
H-05
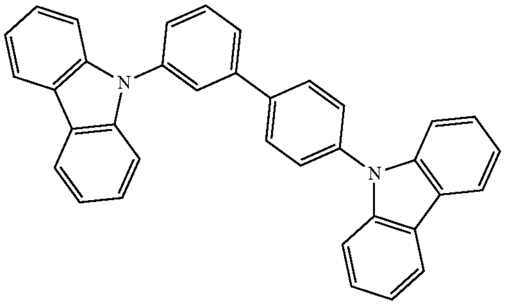
H-06
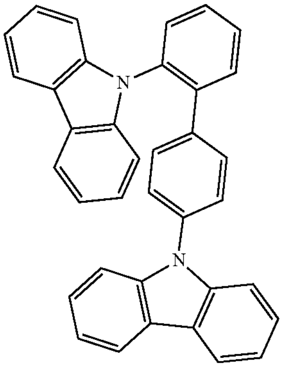
-continued
H-07
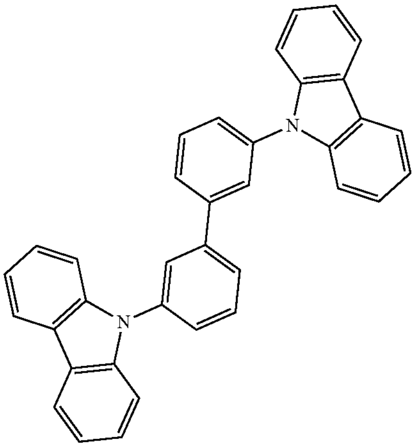
H-08
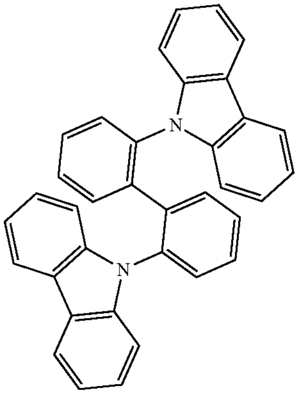
HT-09
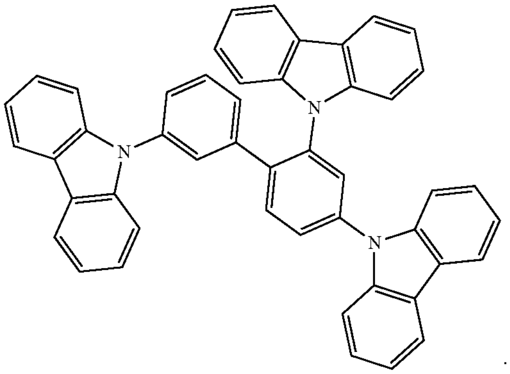
10. The light emitting diode of claim 8, wherein the second host comprises one selected from Compounds ET-01 to ET-06:

ET-01
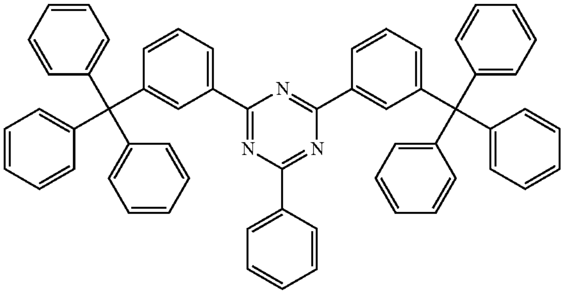
ET-02
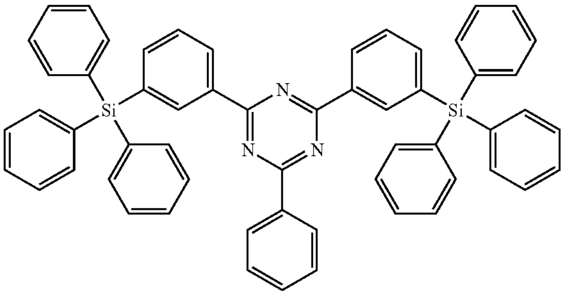
ET-03
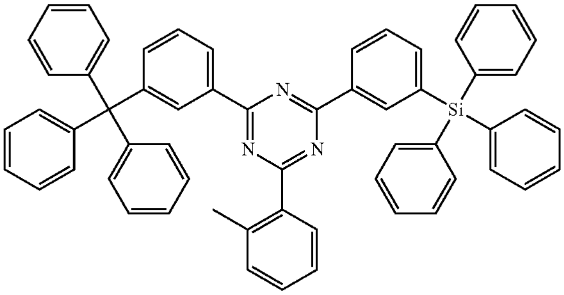
ET-04
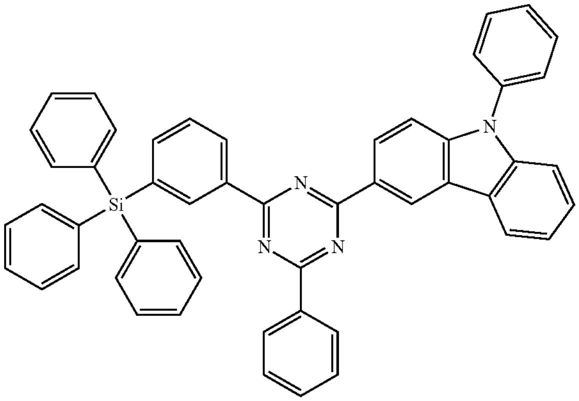
-continued
ET-05
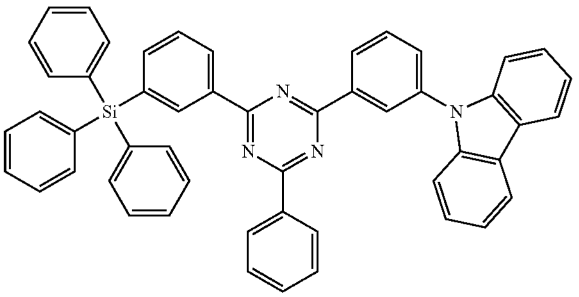
ET-06
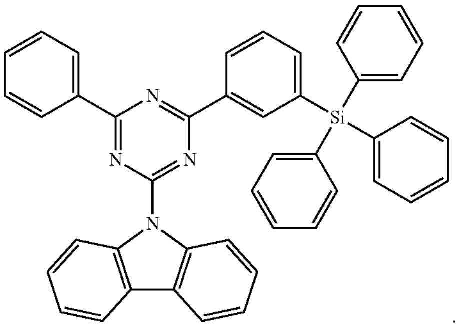
.
11. The light emitting diode of claim 8, wherein the auxiliary dopant comprises at least one selected from Compound Group P:
[Compound Group P]
1
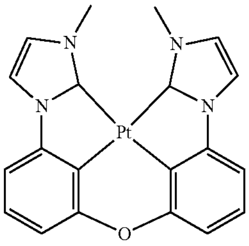
2
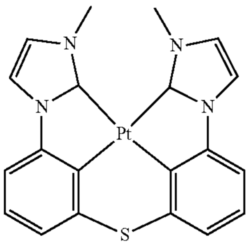
3
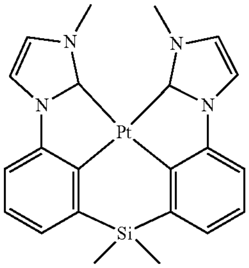

-continued
4
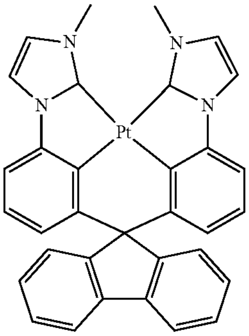
5
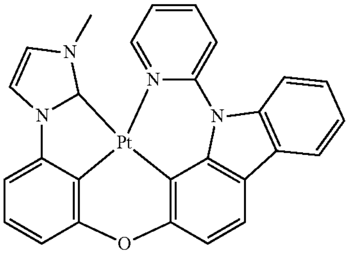
6
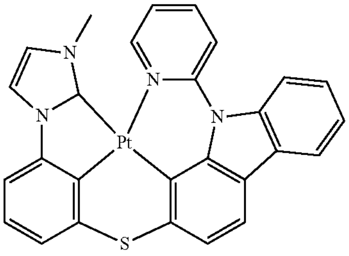
7
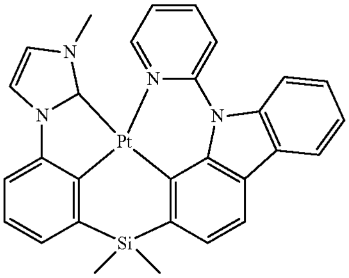
8
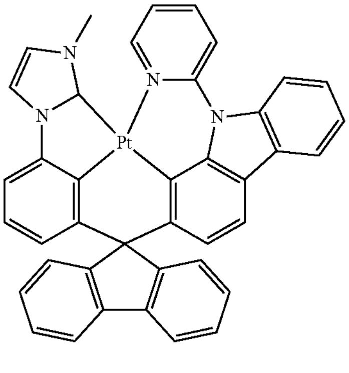
-continued
9
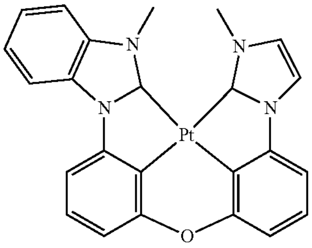
10
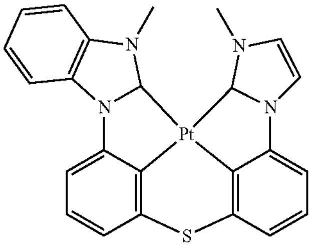
11
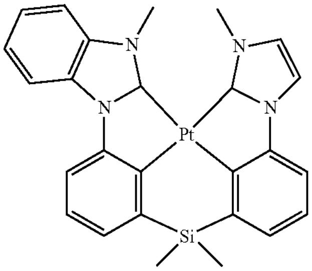
12
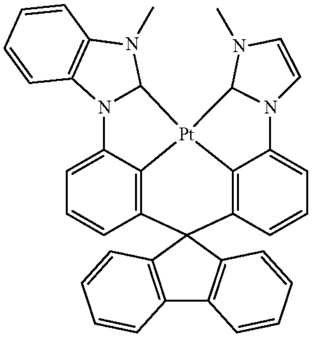
13
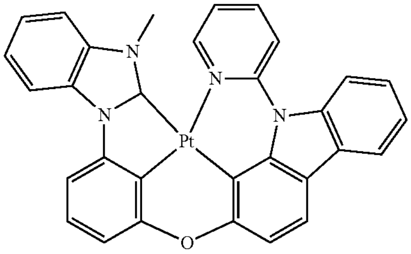

-continued

14

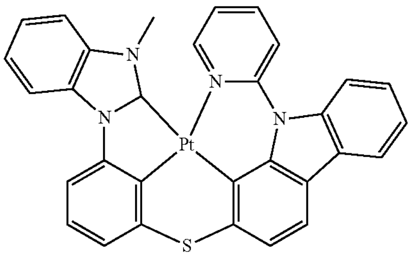

15

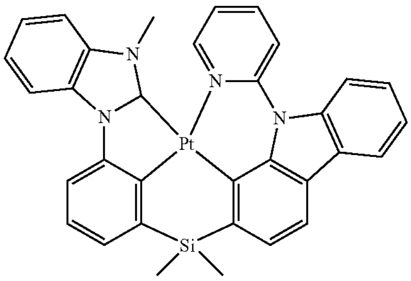

16

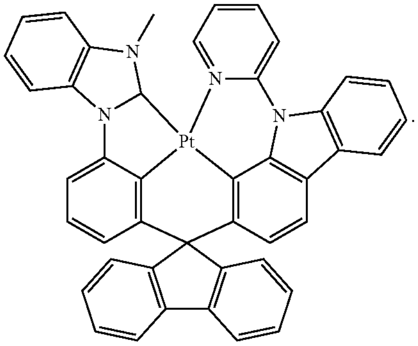

12. The light emitting diode of claim 1, wherein the emission layer emits blue light having a central wavelength in a range of about 450 nm to about 470 nm.

13. The light emitting diode of claim 1, further comprising a capping layer disposed on the second electrode, wherein a refractive index of the capping layer is equal to or greater than about 1.6.

14. A light emitting diode comprising:

a first electrode;

a second electrode disposed on the first electrode; and an emission layer disposed between the first electrode and the second electrode, wherein the emission layer includes:

a hole transporting first host;

an electron transporting second host different from the first host;

an auxiliary dopant; and a light emitting dopant different from the auxiliary dopant, and the light emitting dopant is a polycyclic compound represented by Formula 1:

[Formula 1]

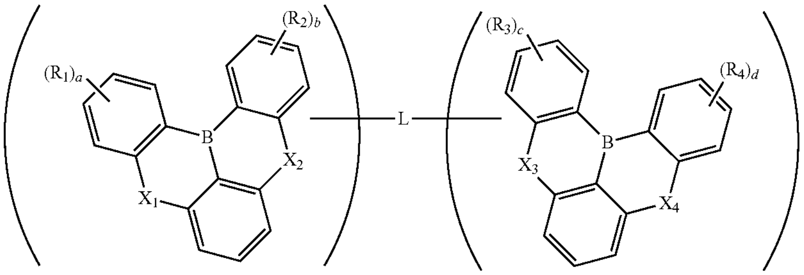

wherein in Formula 1, $X_1$ to $X_4$ are each independently $B(R_a)$, $N(R_b)$, $C(R_c)(R_d)$, O, S, or Se, a to d are each independently an integer from 0 to 4, $R_a$ to $R_d$ and $R_1$ to $R_4$ are each independently a hydrogen atom, a deuterium atom, a halogen atom, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and L is a substituted or unsubstituted divalent triptycene.

15. The light emitting diode of claim 14, wherein the polycyclic compound represented by Formula 1 is represented by Formula 1-1:

[Formula 1-1]

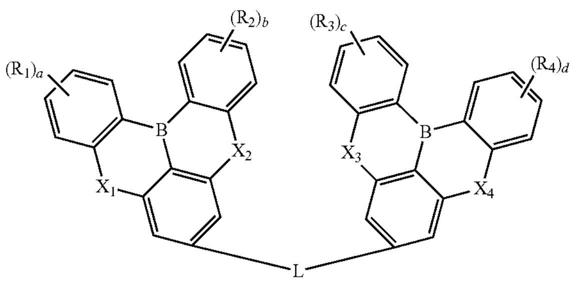

wherein in Formula 1-1, $X_1$ to $X_4$, a to d, $R_1$ to $R_4$, and L are each the same as defined in Formula 1.

16. The light emitting diode of claim 14, wherein L is a group represented by L-1:

L-1

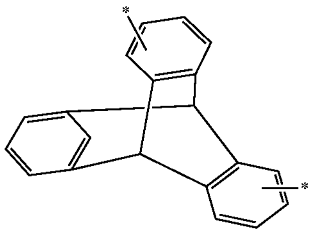

wherein in L-1, represents a binding site to a neighboring atom.

17. The light emitting diode of claim 14, wherein the polycyclic compound represented by Formula 1 is one selected from Compound Group 1:

[Compound Group 1]

1

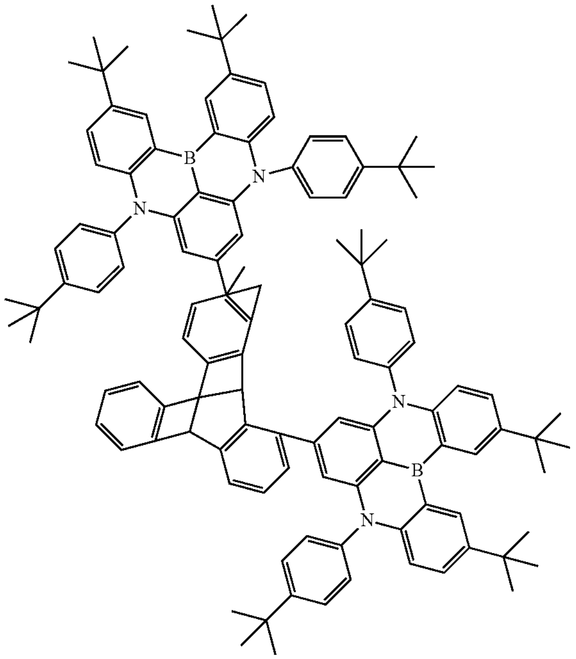

-continued

2

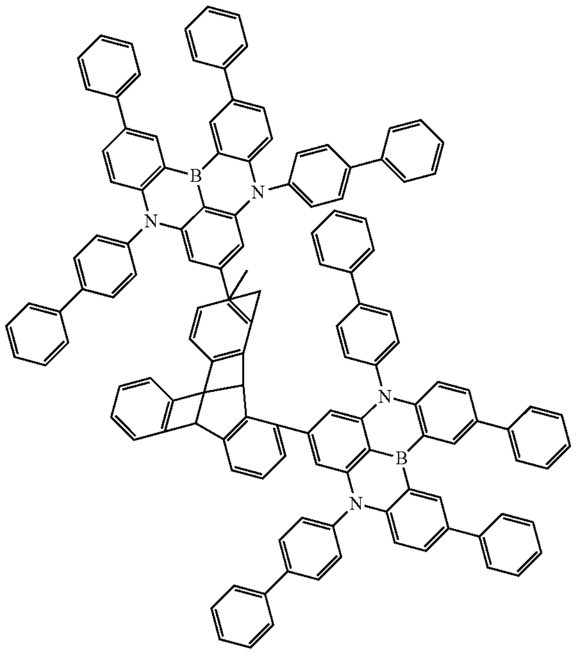

3

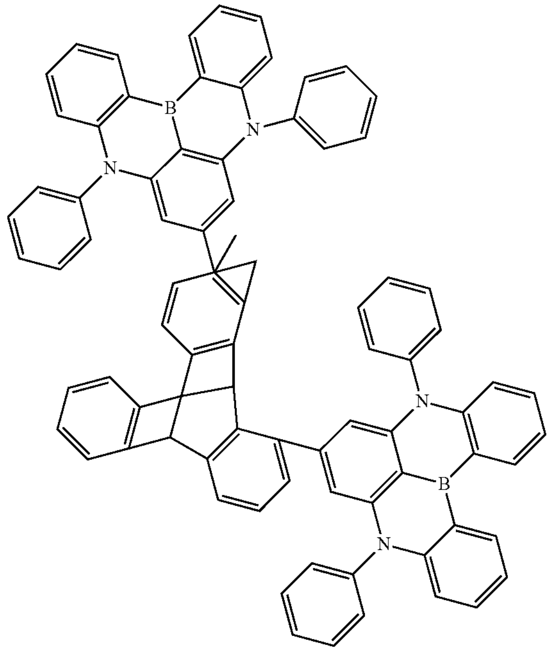

.

18. The light emitting diode of claim 14, wherein the first host comprises one selected from Compounds HT-01 to HT-09:

HT-01
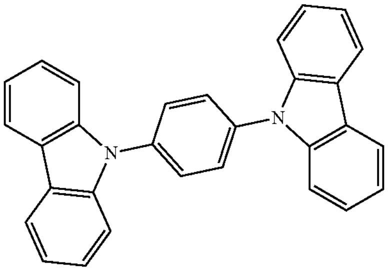
HT-02
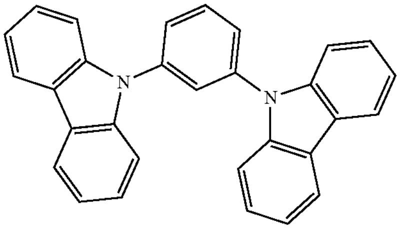
HT-03
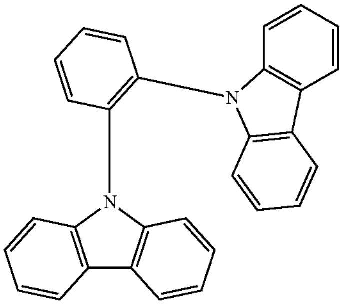
HT-04
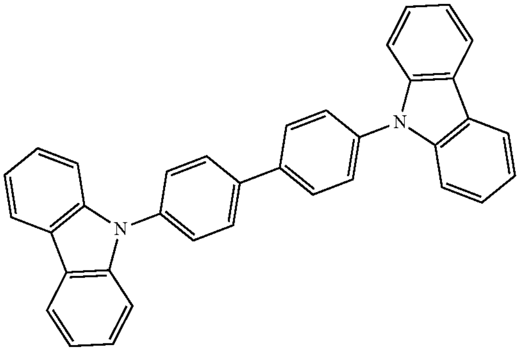
HT-05
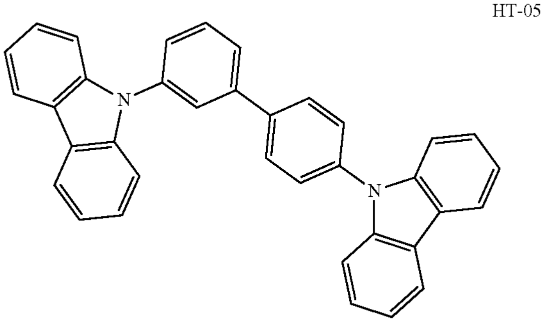
-continued
HT-06
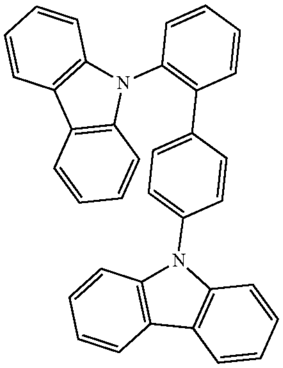
HT-07
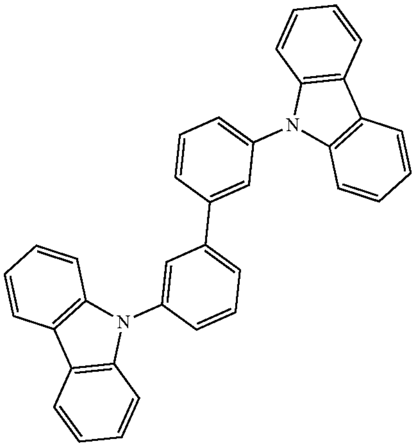
HT-08
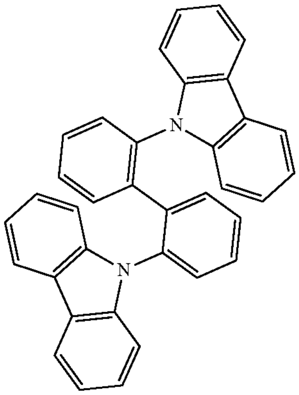
HT-09
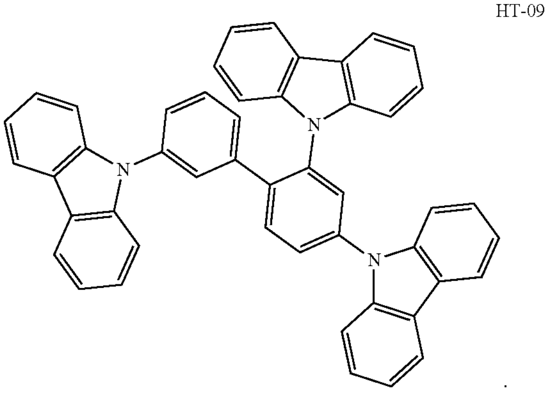
.

19. The light emitting diode of claim 14, wherein the second host comprises one selected from Compounds ET-01 to ET-06:
ET-01
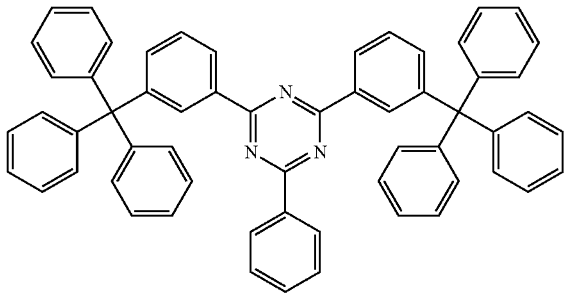
ET-02
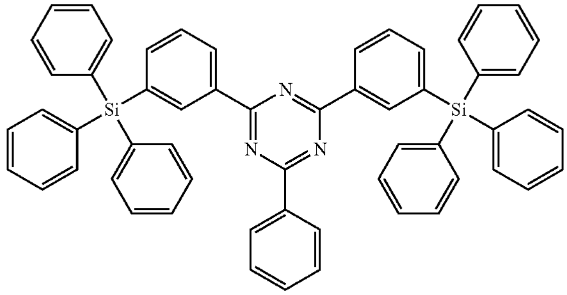
ET-03
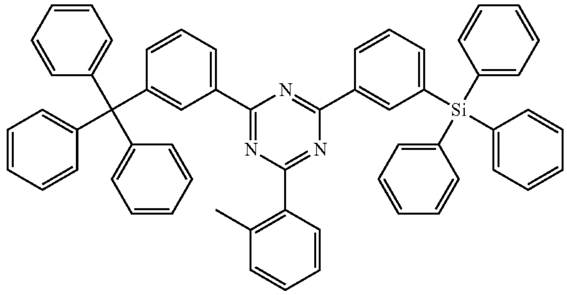
ET-04
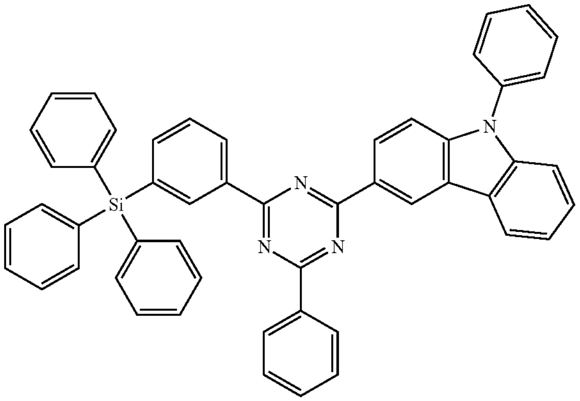
-continued
ET-05
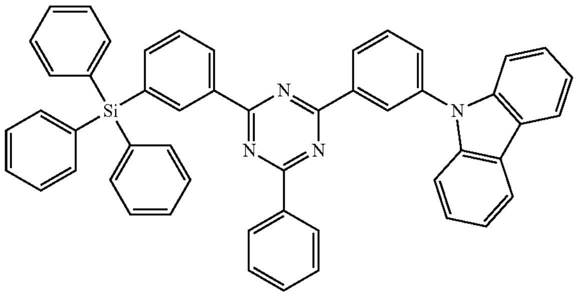
ET-06
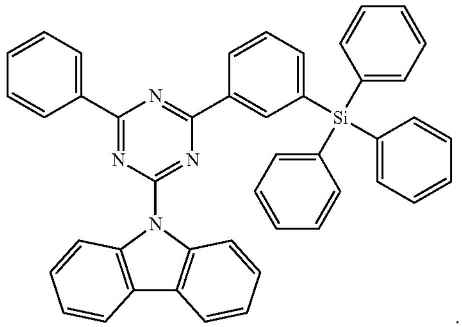
.
20. The light emitting diode of claim 14, wherein the auxiliary dopant comprises at least one selected from Compound Group P:
[Compound Group P]
1
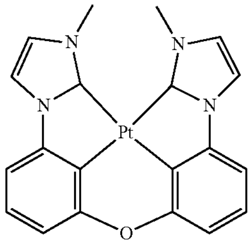
2
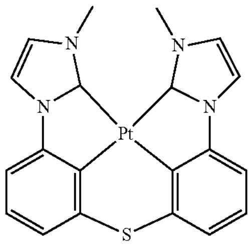
3
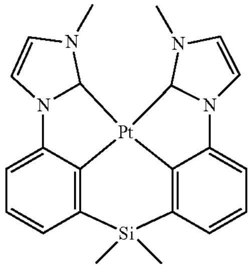

-continued
4
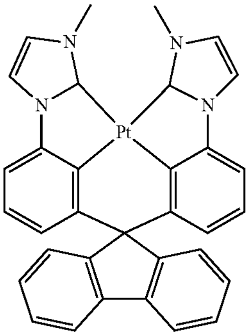
5
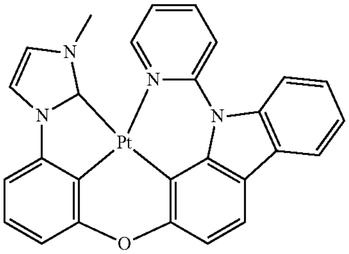
6
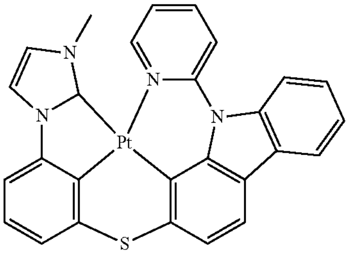
7
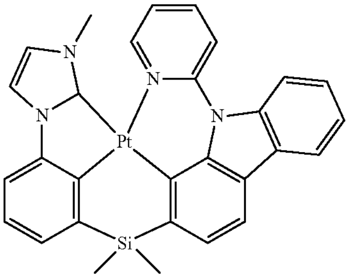
8
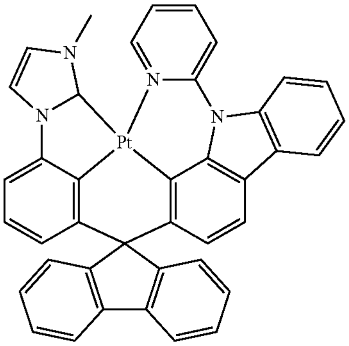
-continued
9
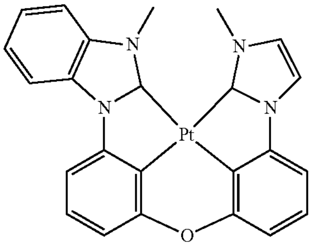
10
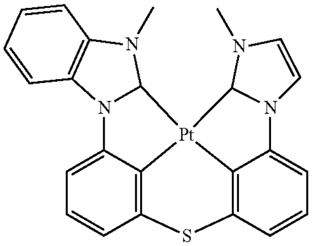
11
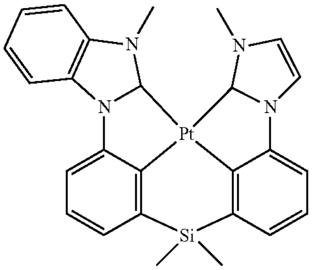
12
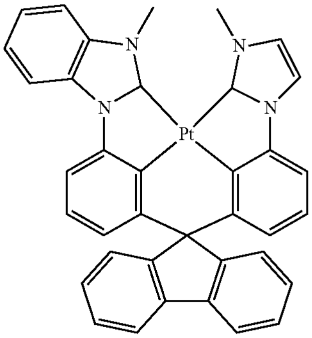

-continued
13
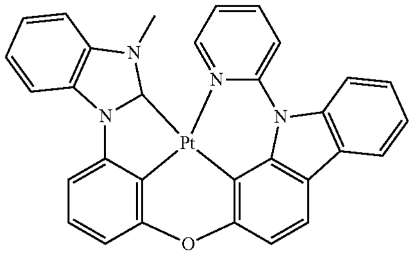
14
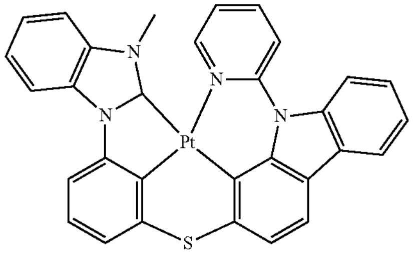
-continued
15
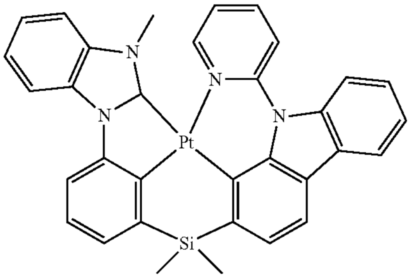
16
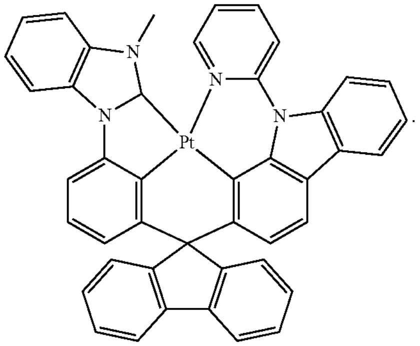
* * * * *